(12) United States Patent
Kondo

(10) Patent No.: US 12,019,121 B2
(45) Date of Patent: Jun. 25, 2024

(54) LOAD TESTING DEVICE

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 41 days.

(21) Appl. No.: 18/267,375

(22) PCT Filed: Jan. 25, 2021

(86) PCT No.: PCT/JP2021/002386
§ 371 (c)(1),
(2) Date: Jun. 14, 2023

(87) PCT Pub. No.: WO2022/157959
PCT Pub. Date: Jul. 28, 2022

(65) Prior Publication Data
US 2024/0044983 A1 Feb. 8, 2024

(51) Int. Cl.
*G01R 31/40* (2020.01)
*G01R 31/34* (2020.01)
*G01R 31/42* (2006.01)

(52) U.S. Cl.
CPC .................... *G01R 31/34* (2013.01)

(58) Field of Classification Search
CPC ........ G01R 31/42; G01R 31/34; G01R 31/40; G01R 31/343; H02J 9/062
USPC ........................................................ 318/490
See application file for complete search history.

(56) References Cited

U.S. PATENT DOCUMENTS

| 5,040,089 A * | 8/1991 | Sasaki ................. H01H 47/06 219/722 |
| 6,653,928 B1 | 11/2003 | Kondo |
| 2004/0027776 A1* | 2/2004 | Uotome ................ H01H 51/28 361/160 |
| 2006/0119193 A1* | 6/2006 | Laskaris ............... H02K 11/00 310/52 |
| 2009/0289656 A1 | 11/2009 | Matsumoto |
| 2011/0172966 A1 | 7/2011 | Albsmeier et al. |

(Continued)

FOREIGN PATENT DOCUMENTS

| CN | 105676122 A | 6/2016 |
| JP | H09-15307 A | 1/1997 |

(Continued)

OTHER PUBLICATIONS

International Search Report issued in PCT/JP2021/002386 dated Mar. 30, 2021 with English Translation (6 pages).

(Continued)

*Primary Examiner* — Gabriel Agared
(74) *Attorney, Agent, or Firm* — Nakanishi IP Associates, LLC

(57) ABSTRACT

A load testing device includes a first load test section having one or more resistor group sets provided with a plurality of resistor groups each including one or more resistors and receiving power supply from a test target power source, and a second load test section having one or more coil groups each including a plurality of coils and receiving power supply from the test target power source. The plurality of coils are connected in a state switchable between series connection and parallel connection.

8 Claims, 19 Drawing Sheets

(56) References Cited

U.S. PATENT DOCUMENTS

| | | | |
|---|---|---|---|
| 2015/0198636 A1 | 7/2015 | Kondo | |
| 2019/0326778 A1* | 10/2019 | Kondo | G01R 31/42 |
| 2020/0258643 A1* | 8/2020 | Chang | G21D 3/001 |
| 2020/0386813 A1* | 12/2020 | Kondo | G01R 31/34 |

FOREIGN PATENT DOCUMENTS

| | | |
|---|---|---|
| JP | 2005-33863 A | 2/2005 |
| JP | 2019-144171 A | 8/2019 |
| JP | 2020-169966 A | 10/2020 |
| WO | 01/40817 A1 | 6/2001 |
| WO | 2011/088328 A1 | 7/2011 |
| WO | 2014/192042 A1 | 12/2014 |
| WO | 2015/075761 A1 | 5/2015 |
| WO | 2018/142645 A1 | 8/2018 |

OTHER PUBLICATIONS

Written Opinion of International Searching Authority issued in PCT/JP2021/002386 dated Mar. 30, 2021 with English Translation (6 pages).

Decision to Grant Patent issued in Japanese Patent Application No. 2021-519896 dated Jun. 21, 2021, with English Translation (5 pages).

* cited by examiner

LOAD TESTING DEVICE

TECHNICAL FIELD

The present invention relates to a load testing device.

BACKGROUND ART

Conventionally, as in Patent Literature 1, a load testing device that performs a load test of a generator has been proposed.

CITATION LIST

Patent Literature

Patent Literature 1: JPH 09-15307 A

SUMMARY OF INVENTION

Technical Problem

However, adjustment of the power factor is not considered.

Therefore, an object of the present invention is to provide a load testing device capable of easily adjusting a power factor corresponding to multiple of types of test target power sources.

Solution to Problem

A load testing device according to the present invention includes a first load test section having one or more resistor group sets provided with a plurality of resistor groups each including one or more resistors, and receiving power supply from a test target power source, and a second load test section having one or more coil groups each including a plurality of coils and receiving power supply from the test target power source.

The plurality of coils are connected in a state switchable between series connection and parallel connection.

By switching the connection form between series and parallel, the combined inductance of the plurality of coils can be changed, and it is possible to realize the load testing device capable of easily adjusting the power factor corresponding to various test target power sources such as a high-voltage generator and a low-voltage generator.

Preferably, the second load test section has an iron core passing through centers of the plurality of coils.

More preferably, the test target power source is a three-phase AC generator.

The second load test section includes, as the one or more coil groups, a first coil group that receives power supply from an R-phase terminal of the test target power source, a second coil group that receives power supply from an S-phase terminal of the test target power source, and a third coil group that receives power supply from a T-phase terminal of the test target power source.

The second load test section includes, as the iron core, a first iron core passing through centers of the plurality of coils of the first coil group, a second iron core passing through centers of the plurality of coils of the second coil group, and a third iron core passing through centers of the plurality of coils of the third coil group.

The first iron core, the second iron core, and the third iron core are connected via a connecting rod.

At least one of the first iron core, the second iron core, the third iron core, and the connecting rod is held by a housing of the second load test section via an insulator.

The iron core holds the coil, and the housing of the second load test section holds the iron core or the connection rod via the insulator. This makes it possible to stably hold the coil while maintaining electrical insulation.

Further, preferably, at least one of the one or more coil groups includes at least a first coil and a second coil as the plurality of coils.

One end of the first coil and other end of the first coil are positioned to sandwich a central axis of the first coil when viewed from a direction in which the central axis of the first coil extends.

One end of the second coil and other end of the second coil are positioned to sandwich a central axis of the second coil when viewed from a direction in which the central axis of the second coil extends.

A side on which the other end of the first coil is located and a side on which the one end of the second coil is located face each other in a direction in which the central axis of the first coil extends.

The other end of the first coil and the one end of the second coil face each other in a direction in which the central axis of the first coil extends.

The switching device or the like can be efficiently disposed in the space around the coil.

Preferably, at least one of the one or more coil groups includes at least a first coil, a second coil, and a third coil as the plurality of coils.

The second load test section includes an iron core passing through centers of the first coil, the second coil, and the third coil.

One end of the first coil and other end of the first coil are positioned to sandwich a region through which the iron core passes when viewed from a direction in which the iron core extends.

One end of the second coil and other end of the second coil are positioned to sandwich the region through which the iron core passes when viewed from the direction in which the iron core extends.

One end of the third coil and other end of the third coil are positioned to sandwich the region through which the iron core passes when viewed from the direction in which the iron core extends.

A side where the other end of the first coil is located and a side where the one end of the second coil is located face each other in the direction in which the iron core extends.

A side where the other end of the second coil is located and a side where the one end of the third coil is located face each other in the direction in which the iron core extends.

The other end of the first coil and the one end of the second coil face each other in the direction in which the iron core extends.

The other end of the second coil and the one end of the third coil face each other in the direction in which the iron core extends.

Preferably, at least one of the one or more coil groups includes at least a first coil, a second coil, and a third coil as the plurality of coils.

The second load test section includes a first relay, a second relay, a third relay, a fourth relay, a fifth relay, a sixth relay, and a seventh relay.

One contact of the first relay is connected to one end of the first coil.

Other contact of the first relay is connected to one end of the second coil.

One contact of the second relay is connected to other end of the first coil.

Other contact of the second relay is connected to the one end of the second coil.

One contact of the third relay is connected to the other end of the first coil.

One contact of the fourth relay is connected to other end of the second coil.

Other contact of the fourth relay is connected to one end of the third coil.

One contact of the fifth relay is connected to the one end of the second coil.

Other contact of the fifth relay is connected to the one end of the third coil.

One contact of the sixth relay is connected to the other end of the second coil.

One contact of the seventh relay is connected to other end of the third coil.

Further, preferably, the first load test section and the second load test section are configured as separate bodies.

The one or more resistor group sets and the one or more coil groups are connected in parallel to the test target power source.

The first load test section includes a first terminal that receives power supply from the test target power source and a second terminal that supplies power from the test target power source to the second load test section.

The second load test section includes a third terminal that receives power supply from the test target power source via the first terminal and the second terminal.

When the adjustment of the power factor is unnecessary, the load test can be performed using only the first load test section without using the second load test section.

In addition, by adding the second load test section to the existing load test device corresponding to the first load test section, it is possible to realize the load testing device that can easily adjust the power factor corresponding to various test target power sources.

Further, preferably, between the first load test section and the second load test section, a control signal line is provided for controlling a connection form of the plurality of coils based on at least one of a type of the test target power source, a connection form of the plurality of resistor groups, and a load amount which are set via an operation unit provided in the first load test section.

The connection form of the coil in the second load test section and the like can be controlled based on the content (the type of the test target power source and the like) set by the operation unit in the first load test section.

Further, preferably, a housing of the second load test section is provided with an inactive-period intake opening and an inactive-period exhaust opening.

The second load test section includes a power generation unit including a power generation device that converts light into electricity, an intake unit, an exhaust unit, and an air blowing unit. The intake unit opens and closes the inactive-period intake opening, the exhaust unit opens and closes the inactive-period exhaust opening, and the air blowing unit takes in air from outside of the housing through the intake unit and discharges the air taken in through the exhaust unit, based on at least one of information on inside the housing, information on surroundings of the housing, and time information when the one or more coil groups are not used.

The air blowing unit is driven by electric power obtained by the power generation unit.

The inactive-period intake opening is smaller than an opening for intake of air to a cooling unit that cools the one or more resistor groups in the first load test section.

The inactive-period exhaust opening is smaller than an opening for discharging air from the cooling unit in the first load test section.

When the load test unit or the like is not used, the housing of the second load test section is maintained in a substantially sealed state. For this reason, the internal temperature and humidity of the housing increase, and the internal equipment may be deteriorated. In addition, there is a risk that dust adheres to internal devices.

When the load test unit or the like is not used, air is taken in from the outside of the housing and discharged. In other words, the inside of the housing can be ventilated. This makes it possible to keep the temperature and humidity inside the housing substantially constant. Then, it is possible to suppress deterioration of devices inside the housing and to suppress adhesion of dust.

The air blowing unit is driven by electric power obtained by the power generation unit. Therefore, the air blowing unit or the like can be operated even in a state where power is not supplied to the load test unit or the like during the inactive period of the load test unit or the like.

It is possible to realize the load testing device capable of performing ventilation during the inactive period only by providing a small opening for intake and exhaust (such as the inactive-period intake opening) in a housing of an existing load test unit and adding an air circulation unit.

Advantageous Effects of Invention

As described above, according to the present invention, a load testing device capable of easily adjusting a power factor corresponding to multiple of types of test target power sources can be provided.

DESCRIPTION OF EMBODIMENTS

Figure 1:
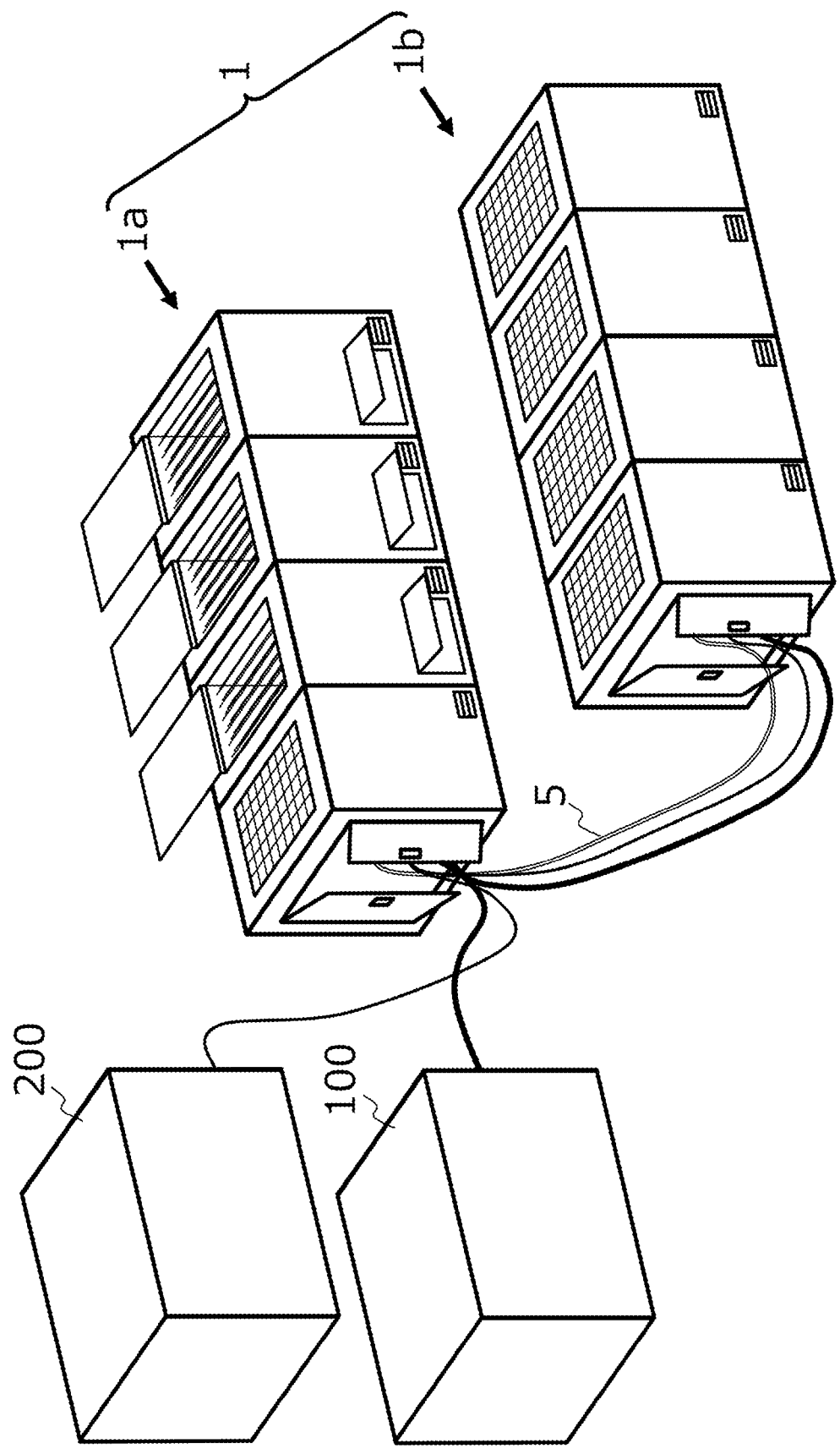
FIG. 1 is a perspective view of a load testing device, a test target power source, and a load-testing-device driving power source according to the present embodiment.

Hereinafter, the present embodiment will be described with reference to the drawings.

Note that the embodiment is not limited to the following embodiment. The contents described in one embodiment are similarly applied to other embodiments in principle. Further, each embodiment and each modification can be appropriately combined.

In order to describe directions, one of the horizontal directions is defined as an x direction (right-left direction, first direction), a horizontal direction perpendicular to the x direction is a y direction (front-back direction, second direction), and a vertical direction perpendicular to the x direction and the y direction is a z direction (up-down direction, third direction).

In FIGS. 6 to 10 and 19, the directions indicated by the arrows of xyz axes are defined as the left direction, the front direction, and the upper direction, respectively.

(Definitions of Active Period and Inactive Period)

An active period of a later described load test unit is defined as a period during which a load test using the load test unit is performed, and an inactive period of the load test unit is defined as a period during which the load test using the load test unit is not performed.

(Correspondence Between Terms in Claims and Terms in Embodiments)

A 11th coil 61a1, a 21st coil 61b1, and a 31st coil 61c1 in the present embodiment correspond to a first coil in the claims.

A 12th coil 61a2, a 22nd coil 61b2, and a 32nd coil 61c2 in the present embodiment correspond to a second coil in the claims.

A 13th coil 61a3, a 23rd coil 61b3, and a 33rd coil 61c3 in the present embodiment correspond to a third coil in the claims.

A 41st relay $R_{41}$, a 51st relay $R_{51}$, and a 61st relay $R_{61}$ in the present embodiment correspond to a first relay in the claims.

A 42nd relay $R_{42}$, a 52nd relay $R_{52}$, and a 62nd relay $R_{62}$ in the present embodiment correspond to a second relay in the claims.

A 43rd relay $R_{43}$, a 53rd relay $R_{53}$, and a 63rd relay $R_{63}$ in the present embodiment correspond to a third relay in the claims.

A 44th relay $R_{44}$, a 54th relay $R_{54}$, and a 64th relay $R_{64}$ in the present embodiment correspond to a fourth relay in the claims.

A 45th relay $R_{45}$, a 55th relay $R_{55}$, and a 65th relay $R_{65}$ in the present embodiment correspond to a fifth relay in the claims.

A 46th relay $R_{46}$, a 56th relay $R_{56}$, and a 66th relay $R_{66}$ in the present embodiment correspond to a sixth relay in the claims.

A 47th relay $R_{47}$, a 57th relay $R_{57}$, and a 67th relay $R_{67}$ in the present embodiment correspond to a seventh relay in the claims.

A first U-phase terminal U1, a first V-phase terminal V1, and a first W-phase terminal W1 in the present embodiment correspond to a first terminal in the claims.

A second U-phase terminal U2, a second V-phase terminal V2, and a second W-phase terminal W2 in the present embodiment correspond to a second terminal in the claims.

A third U-phase terminal U3, a third V-phase terminal V3, and a third W-phase terminal W3 in the present embodiment correspond to a third terminal in the claims.

(Load Testing Device 1)

A dry load testing device 1 according to the present embodiment includes a first load test section 1a and a second load test section 1b (see FIG. 1).

Figure 2:
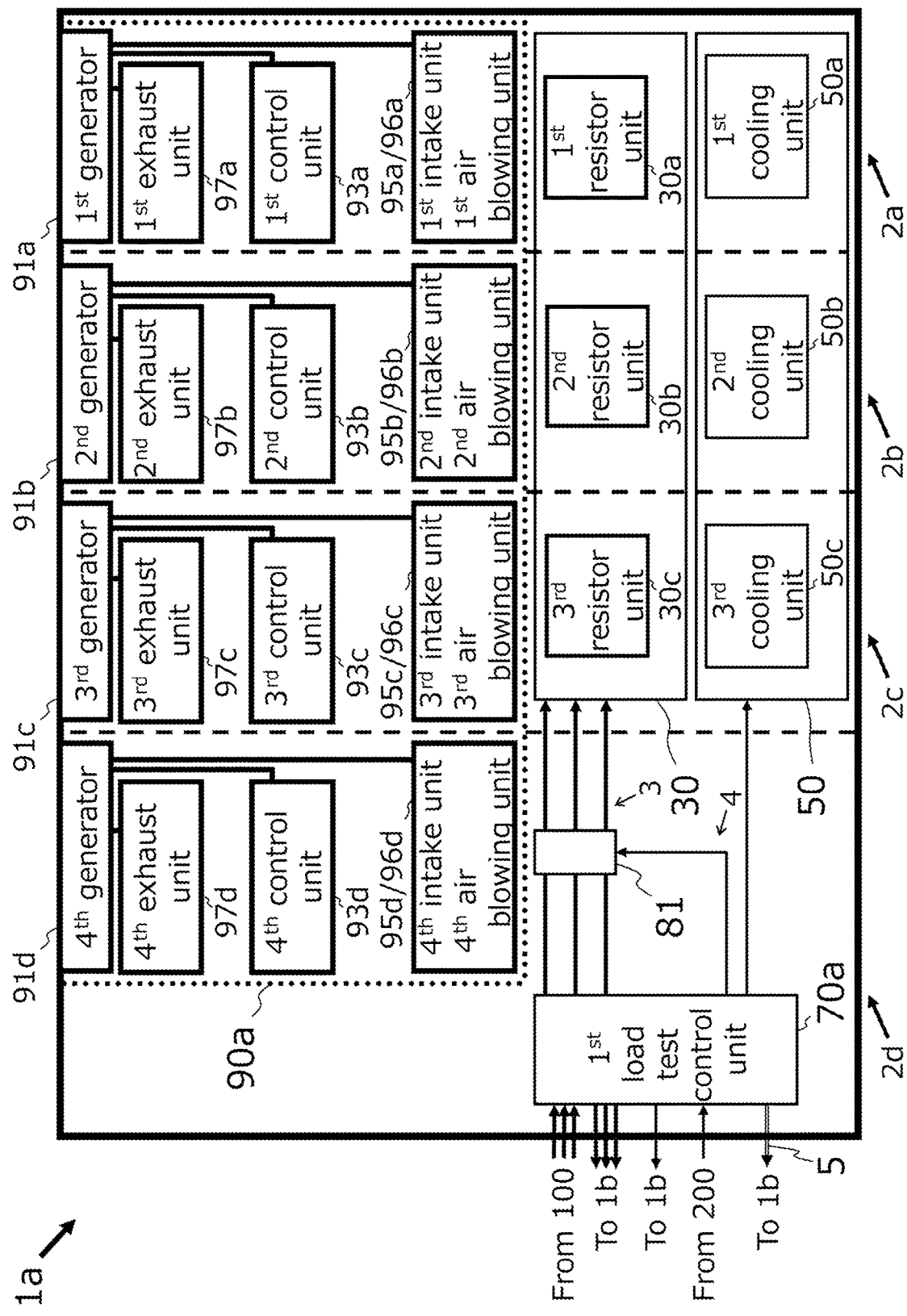
FIG. 2 is a schematic diagram illustrating a simple configuration of a first load test section.
Figure 3:
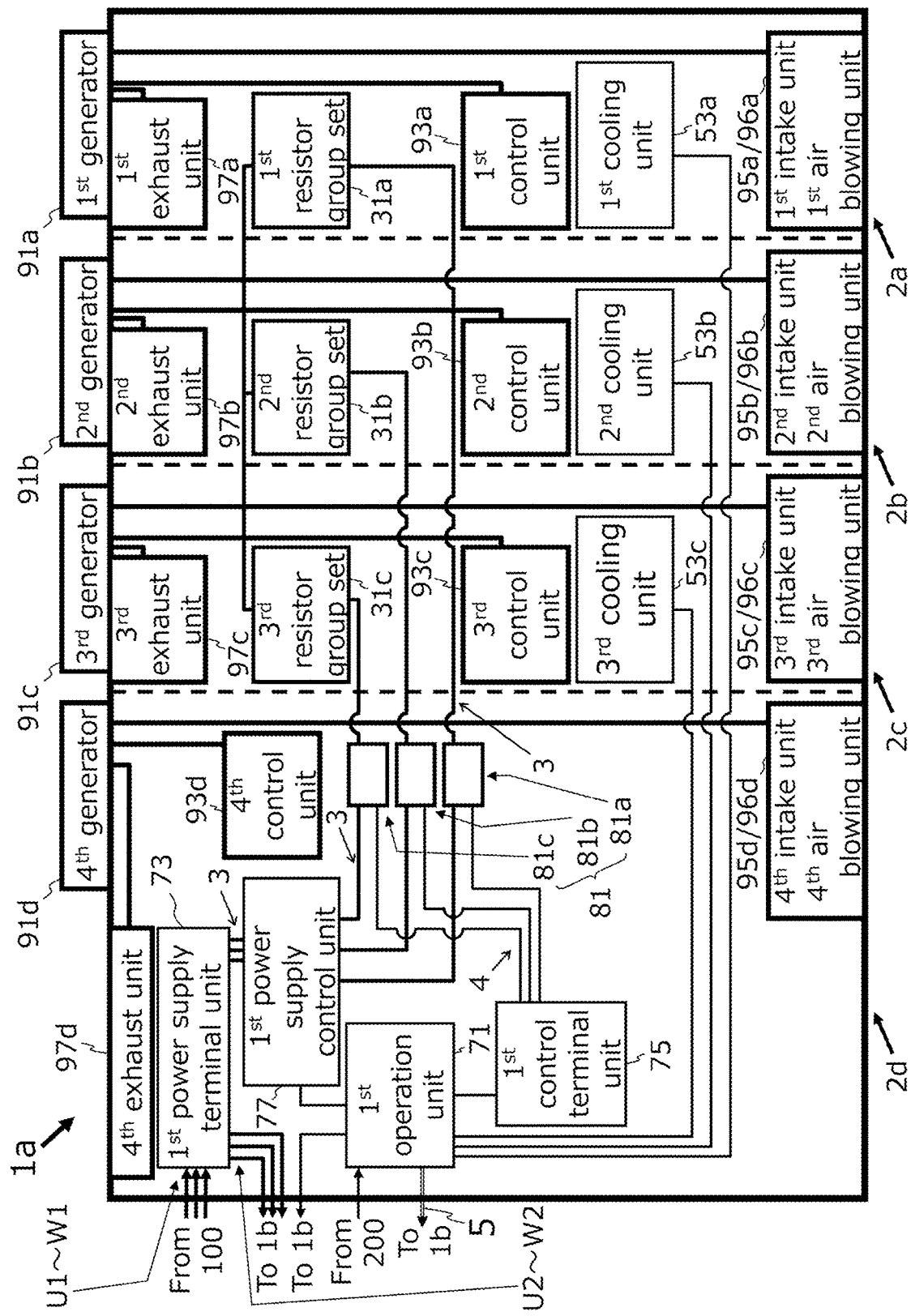
FIG. 3 is a schematic diagram illustrating a detailed configuration of the first load test section.

The first load test section 1a includes a resistor unit 30, a cooling unit 50, a first load test control unit 70a, a resistor-side relay unit 81, and a first air circulation unit 90a (see FIGS. 2 and 3).

A housing of the first load test section 1a includes a first housing 2a, a second housing 2b, a third housing 2c, and a fourth housing 2d.

The first housing 2a, the second housing 2b, the third housing 2c, and the fourth housing 2d are arranged in the x direction.

Figure 4:
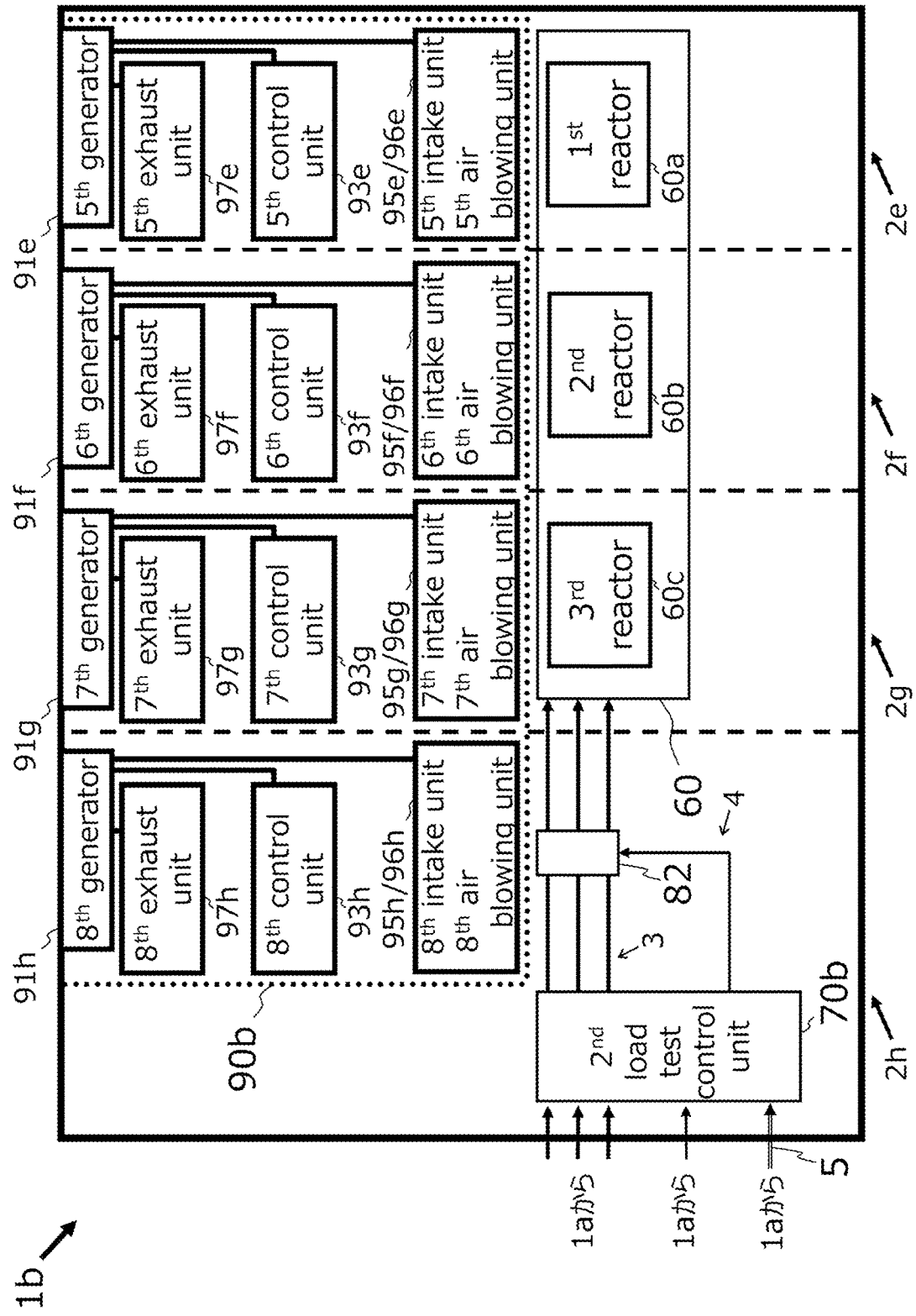
FIG. 4 is a schematic diagram illustrating a simple configuration of a second load test section.
Figure 5:
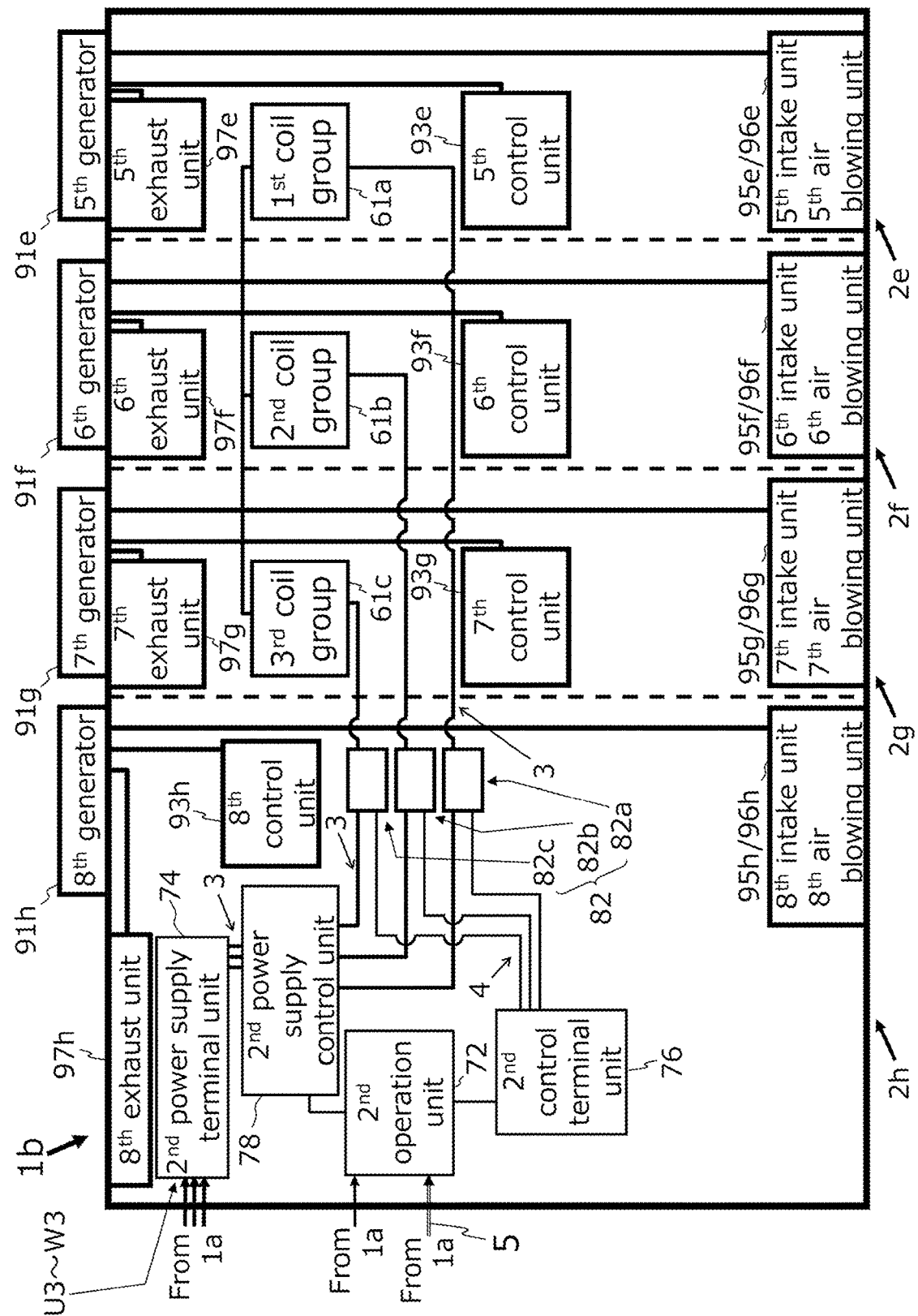
FIG. 5 is a schematic diagram illustrating a detailed configuration of the second load test section.

The second load test section 1b includes a reactor unit 60, a reactor-side relay unit 82, and a second air circulation unit 90b (see FIGS. 4 and 5).

A housing of the second load test section 1b includes a fifth housing 2e, a sixth housing 2f, a seventh housing 2g, and an eighth housing 2h.

The fifth housing 2e, the sixth housing 2f, the seventh housing 2g, and the eighth housing 2h are arranged in the x direction.

The resistor unit 30 includes a first resistor unit 30a, a second resistor unit 30b, and a third resistor unit 30c.

The cooling unit 50 includes a first cooling unit 50a, a second cooling unit 50b, and a third cooling unit 50c. The reactor unit 60 includes a first reactor 60a, a second reactor 60b, and a third reactor 60c.

The first load test control unit 70a includes a first operation unit 71, a first power supply terminal unit 73, a first control terminal unit 75, and a first power supply control unit 77.

A second load test control unit 70b includes a second operation unit 72, a second power supply terminal unit 74, a second control terminal unit 76, and a second power supply control unit 78.

The resistor-side relay unit 81 includes a first resistor-side relay unit 81a, a second resistor-side relay unit 81b, and a third resistor-side relay unit 81c.

The reactor-side relay unit 82 includes a first reactor-side relay unit 82a, a second reactor-side relay unit 82b, and a third reactor-side relay unit 82c.

The first air circulation unit 90a includes first to fourth power generation units 91a to 91d, first to fourth control units 93a to 93d, first to fourth intake units 95a to 95d, first to fourth air blowing units 96a to 96d, and first to fourth exhaust units 97a to 97d.

The second air circulation unit 90b includes fifth to eighth power generation units 91e to 91h, fifth to eighth control units 93e to 93h, fifth to eighth intake units 95e to 95h, fifth to eighth air blowing units 96e to 96h, and fifth to eighth exhaust units 97e to 97h.

The first resistor unit 30a, the first cooling unit 50a, and the first reactor 60a will be described as a first load test unit, the second resistor unit 30b, the second cooling unit 50b, and the second reactor 60b will be described as a second load test unit, and the third resistor unit 30c, the third cooling unit 50c, and the third reactor 60c will be described as a third load test unit.

(First Housing 2a)

Figure 6:
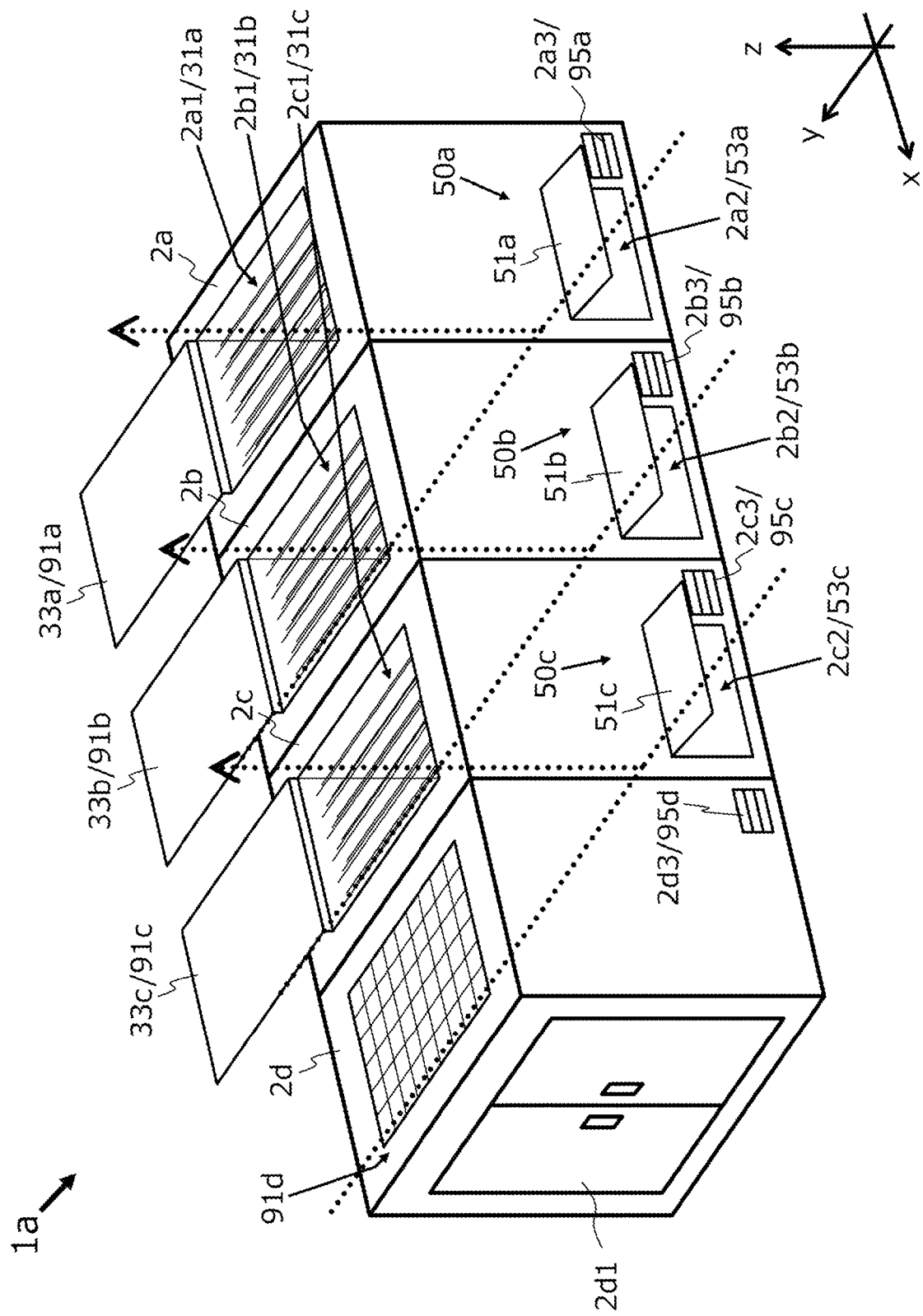
FIG. 6 is a rear perspective view of the first load test section in an active period.
Figure 7:
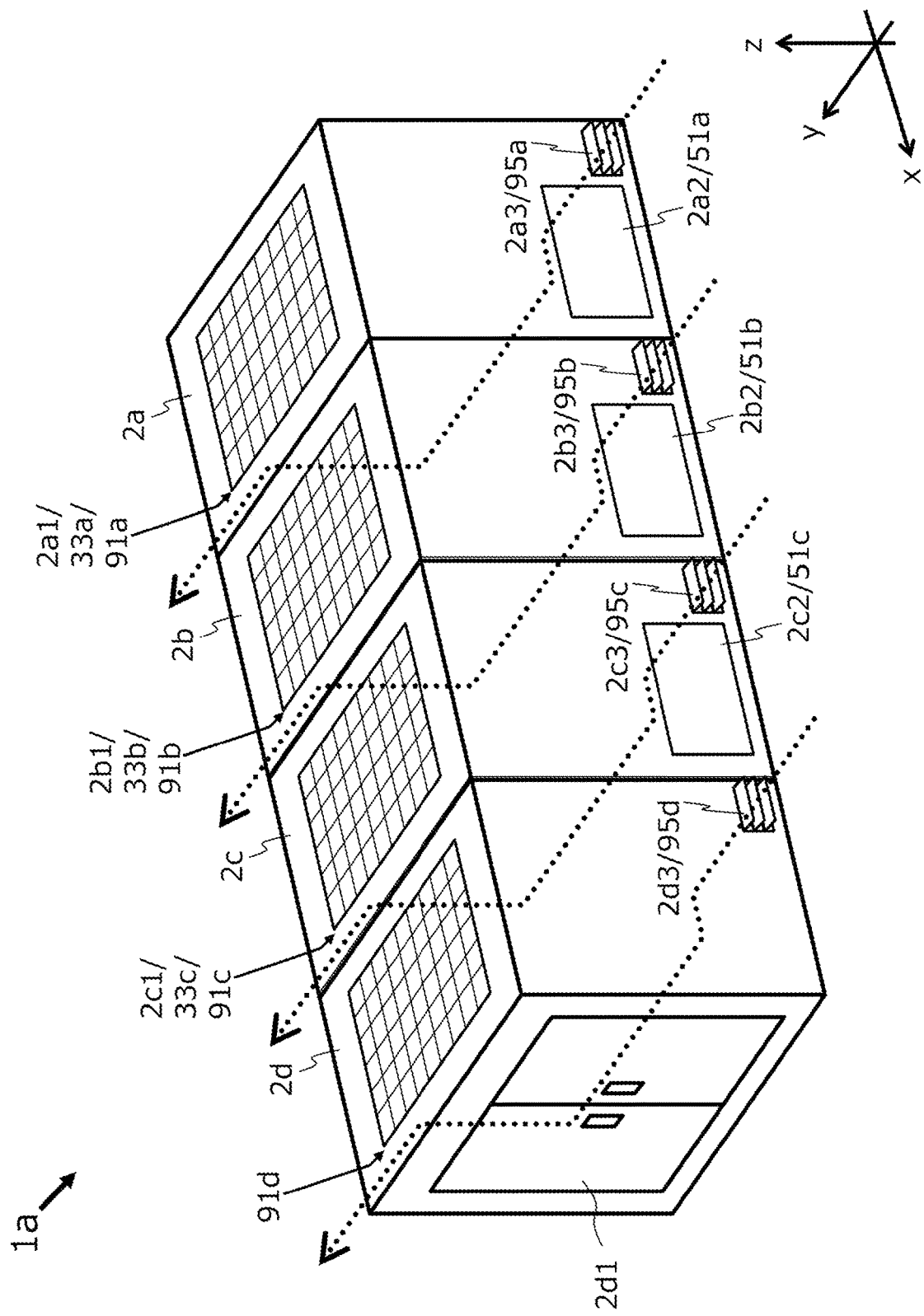
FIG. 7 is a rear perspective view of the first load test section in an inactive period.
Figure 8:
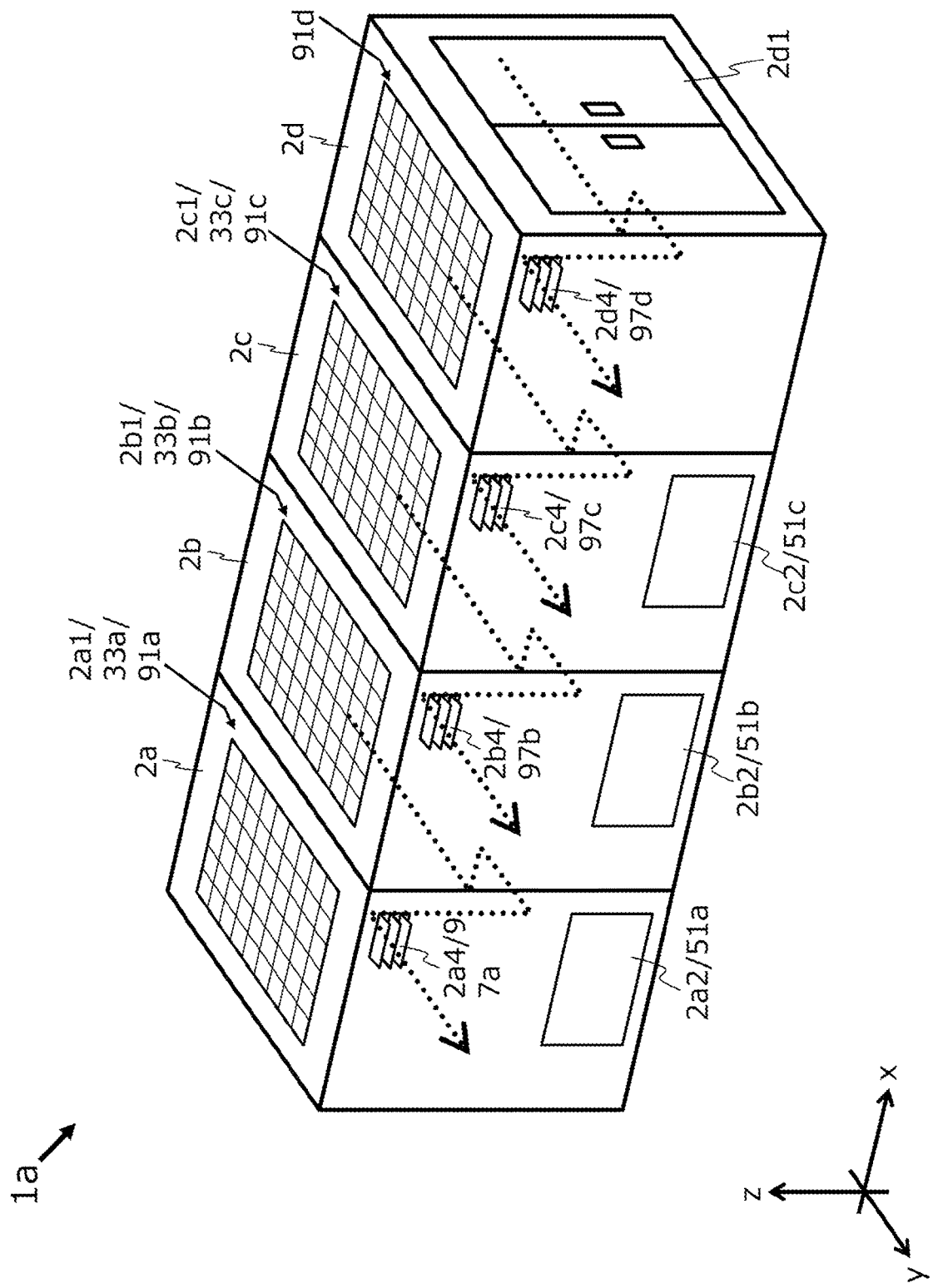
FIG. 8 is a front perspective view of the first load test section in an inactive period.

The first housing 2a includes those in the first load test section 1a of the first load test unit (the first resistor unit 30a, the first cooling unit 50a), the first power generation unit 91a, the first control unit 93a, the first intake unit 95a, the first air blowing unit 96a, and the first exhaust unit 97a (see FIGS. 6 to 8).

An area on an upper surface of the first housing 2a facing the first resistor unit 30a in the z direction is opened for discharging the cooling air during the load test (a first upper-surface opening 2a1).

Areas on the front surface and the back surface of the first housing 2a facing the first cooling unit 50a in the y direction are opened for intake of cooling air during a load test (first side-surface openings 2a2).

At the lower side in the z direction on the back surface of the first housing 2a, that is, in the vicinity of the first side-surface opening 2a2, there is an opening for intake of air when those in the first load test section 1a of the first load test unit are not used (a first inactive-period intake opening 2a3).

The first inactive-period intake opening 2a3 is smaller than the first side-surface openings 2a2.

On the upper side in the z direction on the front surface of the first housing 2a, there is an opening for discharging air when those in the first load test section 1a of the first load test unit are not used (a first inactive-period exhaust opening 2a4).

The first inactive-period exhaust opening 2a4 is provided on a side surface of the first housing 2a on a side opposite to a side where the first inactive-period intake opening 2a3 is located in the y direction.

The first inactive-period exhaust opening 2a4 is provided at a position higher than the first inactive-period intake opening 2a3.

The first inactive-period exhaust opening 2a4 is smaller than the first upper-surface opening 2a1.

(Second Housing 2b)

The second housing 2b includes those in the first load test section 1a of the second load test unit (the second resistor unit 30b, the second cooling unit 50b), the second power generation unit 91b, the second control unit 93b, the second intake unit 95b, the second air blowing unit 96b, and the second exhaust unit 97b.

An area on the upper surface of the second housing 2b facing the second resistor unit 30b in the z direction is opened for discharging the cooling air during the load test (a second upper-surface opening 2b1).

Areas on the front surface and the back surface of the second housing 2b facing the second cooling unit 50b in the y direction are opened for intake of cooling air during the load test (second side-surface openings 2b2).

At the lower side in the z direction on the back surface of the second housing 2b, that is, in the vicinity of the second side-surface opening 2b2, there is an opening for intake of air when those in the first load test section 1a of the second load test unit are not used (a second inactive-period intake opening 2b3).

The second inactive-period intake opening 2b3 is smaller than the second side-surface openings 2b2.

On the upper side in the z direction on the front surface of the second housing 2b, there is an opening for discharging air when those in the first load test section 1a of the second load test unit are not used (a second inactive-period exhaust opening 2b4).

The second inactive-period exhaust opening 2b4 is provided on a side surface of the second housing 2b on a side opposite to a side where the second inactive-period intake opening 2b3 is located in the y direction.

The second inactive-period exhaust opening 2b4 is provided at a position higher than the second inactive-period intake opening 2b3.

The second inactive-period exhaust opening 2b4 is smaller than the second upper-surface opening 2b1.

(Third Housing 2c)

The third housing 2c includes those in the first load test section 1a of the third load test unit (the third resistor unit 30c, the third cooling unit 50c), the third power generation unit 91c, the third control unit 93c, the third intake unit 95c, the third air blowing unit 96c, and the third exhaust unit 97c.

An area on the upper surface of the third housing 2c facing the third resistor unit 30c in the z direction is opened for discharging the cooling air during the load test (a third upper-surface opening 2c1).

Areas on the front surface and the back surface of the third housing 2c facing the third cooling unit 50c in the y direction are opened for intake of cooling air during a load test (third side-surface openings 2c2).

At the lower side in the z direction on the back surface of the third housing 2c, that is, in the vicinity of the third side-surface opening 2c2, there is an opening for intake of air when those in the first load test section 1a of the third load test unit are not used (a third inactive-period intake opening 2c3).

The third inactive-period intake opening 2c3 is smaller than the third side-surface openings 2c2.

On the upper side in the z direction on the front surface of the third housing 2c, there is an opening for discharging air when those in the first load test section 1a of the third load test unit are not used (a third inactive-period exhaust opening 2c4).

The third inactive-period exhaust opening 2c4 is provided on a side surface of the third housing 2c on a side opposite to a side where the third inactive-period intake opening 2c3 is located in the y direction.

The third inactive-period exhaust opening 2c4 is provided at a position higher than the third inactive-period intake opening 2c3.

The third inactive-period exhaust opening 2c4 is smaller than the third upper-surface opening 2c1.

(Fourth Housing 2d)

The fourth housing 2d includes the first load test control unit 70a, the resistor-side relay unit 81, the fourth power generation unit 91d, the fourth control unit 93d, the fourth intake unit 95d, the fourth air blowing unit 96d, and the fourth exhaust unit 97d.

However, a part or all of the first load test control unit 70a or a part or all of the resistor-side relay unit 81 may be included in the first housing 2a or the like.

For example, it is conceivable that the first housing 2a includes the first resistor-side relay unit 81a, the second housing 2b includes the second resistor-side relay unit 81b, and the third housing 2c includes the third resistor-side relay unit 81c.

At the lower side in the z direction on the back surface of the fourth housing 2d, there is an opening for intake of air when those in the first load test section 1a of the first load test unit to the third load test unit are not used (a fourth inactive-period intake opening 2d3).

On the upper side in the z direction on the front surface of the fourth housing 2d, there is an opening for discharging air when those in the first load test section 1a of the first load test unit to the third load test unit are not used (a fourth inactive-period exhaust opening 2d4).

The fourth inactive-period exhaust opening 2d4 is provided on a side surface of the fourth housing 2d on a side opposite to a side where the fourth inactive-period intake opening 2d3 is located in the y direction.

The fourth inactive-period exhaust opening 2d4 is provided at a position higher than the fourth inactive-period intake opening 2d3.

The first housing 2a to the fourth housing 2d may be configured integrally or separately. In a case where the first housing 2a to the fourth housing 2d are integrally formed, partition walls may be provided between adjacent housings, or any partition walls may not be provided.

Said partition walls are provided with opening areas, and the electric members included in the resistor unit 30, the cooling unit 50, the first load test control unit 70a, the resistor-side relay unit 81, and the first air circulation unit 90a are cable-connected through said opening areas.

(Fifth Housing 2e)

Figure 9:
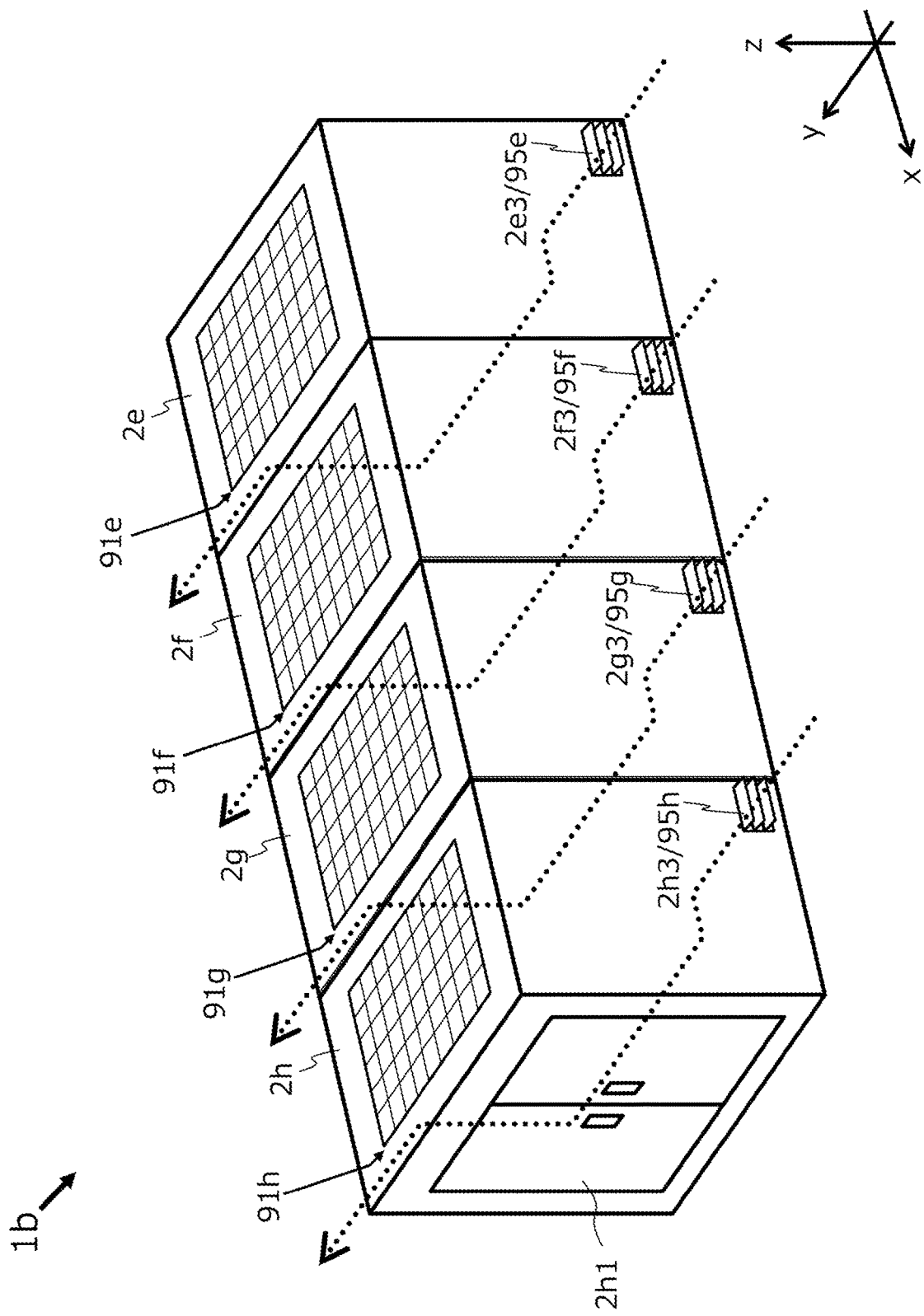
FIG. 9 is a rear perspective view of the second load test section in an inactive period.
Figure 10:
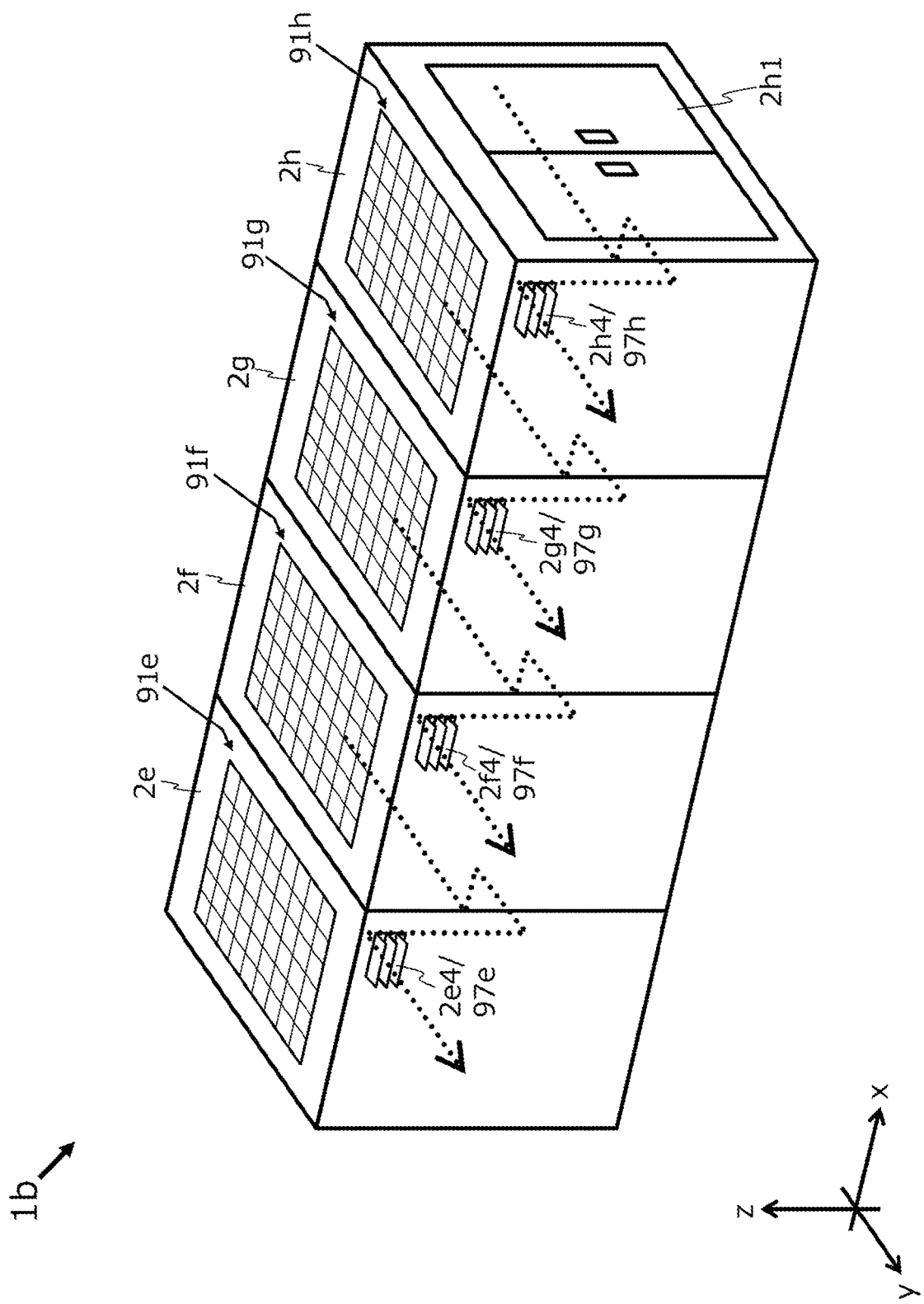
FIG. 10 is a front perspective view of the second load test section in an inactive period.

The fifth housing 2e includes those in the second load test section 1b of the first load testing unit (the first reactor 60a), the fifth power generation unit 91e, the fifth control unit 93e, the fifth intake unit 95e, the fifth air blowing unit 96e, and the fifth exhaust unit 97e (see FIGS. 9 and 10).

At the lower side in the z direction on the back surface of the fifth housing 2e, there is an opening for intake of air when those in the second load test section 1b of the first load test unit are not used (a fifth inactive-period intake opening 2e3).

The fifth inactive-period intake opening 2e3 is smaller than the first side-surface opening 2a2 of the first housing 2a.

On the upper side in the z direction on the front surface of the fifth housing 2e, there is an opening for discharging air when those in the second load test section 1b of the first load test unit are not used (a fifth inactive-period exhaust opening 2e4).

The fifth inactive-period exhaust opening 2e4 is provided on a side surface of the fifth housing 2e on a side opposite to a side where the fifth inactive-period intake opening 2e3 is located in the y direction.

The fifth inactive-period exhaust opening 2e4 is provided at a position higher than the fifth inactive-period intake opening 2e3.

The fifth inactive-period exhaust opening 2e4 is smaller than the first upper-surface opening 2a1 of the first housing 2a.

(Sixth Housing 2f)

The sixth housing 2f includes those in the second load test section 1b of the second load testing unit (the second reactor 60b), the sixth power generation unit 91f, the sixth control unit 93f, the sixth intake unit 95f, the sixth air blowing unit 96f, and the sixth exhaust unit 97f.

At the lower side in the z direction on the back surface of the sixth housing 2f, there is an opening for intake of air when those in the second load test section 1b of the second load test unit are not used (a sixth inactive-period intake opening 2f3).

The sixth inactive-period intake opening 2f3 is smaller than the second side-surface opening 2b2 of the second housing 2b.

On the upper side in the z direction on the front surface of the sixth housing 2f, there is an opening for discharging air when those in the second load test section 1b of the second load test unit are not used (a sixth inactive-period exhaust opening 2f4).

The sixth inactive-period exhaust opening 2f4 is provided on a side surface of the sixth housing 2f on a side opposite to a side where the sixth inactive-period intake opening 2f3 is located in the y direction.

The sixth inactive-period exhaust opening 2f4 is provided at a position higher than the sixth inactive-period intake opening 2f3.

The sixth inactive-period exhaust opening 2f4 is smaller than the second upper-surface opening 2b1 of the second housing 2b.

(Seventh Housing 2g)

The seventh housing 2g includes those in the second load test section 1b of the third load testing unit (the third reactor 60c), the seventh power generation unit 91g, the seventh control unit 93g, the seventh intake unit 95g, the seventh air blowing unit 96g, and the seventh exhaust unit 97g.

At the lower side in the z direction on the back surface of the seventh housing 2g, there is an opening for intake of air when those in the second load test section 1b of the third load test unit are not used (a seventh inactive-period intake opening 2g3).

The seventh inactive-period intake opening 2g3 is smaller than the third side-surface opening 2c2 of the third housing 2c.

On the upper side in the z direction on the front surface of the seventh housing 2g, there is an opening for discharging air when those in the second load test section 1b of the third load test unit are not used (a seventh inactive-period exhaust opening 2g4).

The seventh inactive-period exhaust opening 2g4 is provided on a side surface of the seventh housing 2g on a side opposite to a side where the seventh inactive-period intake opening 2g3 is located in the y direction.

The seventh inactive-period exhaust opening 2g4 is provided at a position higher than the seventh inactive-period intake opening 2g3.

The seventh inactive-period exhaust opening 2g4 is smaller than the third upper-surface opening 2c1 of the third housing 2c.

(Eighth Housing 2h)

The eighth housing 2h includes the second load test control unit 70b, the reactor-side relay unit 82, the eighth power generation unit 91h, the eighth control unit 93h, the eighth intake unit 95h, the eighth air blowing unit 96h, and the eighth exhaust unit 97h.

However, a part or all of the second load test control unit 70b or a part or all of the reactor-side relay unit 82 may be included in the fifth housing 2e or the like.

For example, it is conceivable that the fifth housing 2e includes the first reactor-side relay unit 82a, the sixth housing 2f includes the second reactor-side relay unit 82b, and the seventh housing 2g includes the third reactor-side relay unit 82c.

At the lower side in the z direction on the back surface of the eighth housing 2h, there is an opening for intake air when the first load test unit to the third load test unit in the second load test section 1b of the load testing device 1 are not used (an eighth inactive-period intake opening 2h3).

On the upper side in the z direction on the front surface of the eighth housing 2h, there is an opening for discharging air when the first load test unit to the third load test unit in the second load test section 1b of the load testing device 1 are not used (an eighth inactive-period exhaust opening 2h4).

The eighth inactive-period exhaust opening 2h4 is provided on a side surface of the eighth housing 2h on a side opposite to a side where the eighth inactive-period intake opening 2h3 is located in the y direction.

The eighth inactive-period exhaust opening 2h4 is provided at a position higher than the eighth inactive-period intake opening 2h3.

The fifth housing 2e to the eighth housing 2h may be configured integrally or separately. In a case where the fifth housing 2e to the eighth housing 2h are integrally formed, partition walls may be provided between adjacent housings, or any partition walls may not be provided.

Said partition walls are provided with opening areas, and the electric members included in the reactor unit 60, the second load test control unit 70b, the reactor-side relay unit 82, and the second air circulation unit 90b are cable-connected through said opening areas.

In addition, a first iron core 61a4 to a third iron core 61c4 of the reactor unit 60 are connected via said opening areas using a connecting rod 62.

(Configuration of Housings)

According to the present embodiment, the housings (the first housing 2a to the fourth housing 2d) of the first load test section 1a and the housings (the fifth housing 2e to the eighth housing 2h) of the second load test section 1b are configured separately. However, one housing (the first housing 2a to the eighth housing 2h) may be used as the housings of the first load test section 1a and the second load test section 1b.

(First Load Test Unit)

A configuration of the first load test unit will be described.

The first load test unit is used to perform a load test of one (the R-phase, according to the present embodiment) of the three phases of the test target power source (three-phase AC generator), and includes the first resistor unit 30a (a first resistor group set 31a, a first exhaust lid 33a), the first cooling unit 50a (first intake lids 51a, a first cooling device 53a), and the first reactor 60a (a first coil group 61a).

The first resistor unit 30a and the first cooling unit 50a are arranged in the z direction such that an intake port of the first resistor group set 31a and an exhaust port of the first cooling device 53a face each other.

(Second Load Test Unit)

A configuration of the second load test unit will be described.

The second load test unit is used to perform a load test of one (the S-phase, according to the present embodiment) of the three phases of the test target power source (three-phase AC generator), and includes the second resistor unit 30b (a second resistor group set 31b, a second exhaust lid 33b), the second cooling unit 50b (second intake lids 51b, a second cooling device 53b), and the second reactor 60b (a second coil group 61b).

The second resistor unit 30b and the second cooling unit 50b are arranged in the z direction such that an intake port of the second resistor group set 31b and an exhaust port of the second cooling device 53b face each other.

(Third Load Test Unit)

A configuration of the third load test unit will be described.

The third load test unit is used to perform a load test of one (the T-phase, according to the present embodiment) of the three phases of the test target power source (three-phase AC generator), and includes the third resistor unit 30c (a third resistor group set 31c, a third exhaust lid 33c), the third cooling unit 50c (third intake lids 51c, a third cooling device 53c), and the third reactor 60c (a third coil group 61c).

The third resistor unit 30c and the third cooling unit 50c are arranged in the z direction such that an intake port of the third resistor group set 31c and an exhaust port of the third cooling device 53c face each other.

(Connection Member 3)

The first resistor group set 31a, the second resistor group set 31b, and the third resistor group set 31c are electrically connected by using a connection member 3 such as a cable and a connection bar from the first power supply terminal unit 73 of the first load test control unit 70a (see FIGS. 2 and 3).

The first coil group 61a, the second coil group 61b, and the third coil group 61c are electrically connected by using a connection member 3 such as a cable and a connection bar from the second power supply terminal unit 74 of the second load test control unit 70b (see FIGS. 4 and 5).

(Control Lines 4)

A switching device (the first resistor-side relay unit 81a) of the first resistor group set 31a, a switching device (the second resistor-side relay unit 81b) of the second resistor group set 31b, and a switching device (the third resistor-side relay unit 81c) of the third resistor group set 31c are controlled using cables (control lines 4) from the first control terminal unit 75 of the first load test control unit 70a.

A switching device (the first reactor-side relay unit 82a) of the first coil group 61a, a switching device (the second reactor-side relay unit 82b) of the second coil group 61b, and a switching device (the third reactor-side relay unit 82c) of the third coil group 61c are controlled using cables (the control lines 4) from the second control terminal unit 76 of the second load test control unit 70b.

The control lines 4 are cables used to perform on/off control of the switching devices (the relays of the first resistor-side relay unit 81a to the third resistor-side relay unit 81c) provided in the resistor-side relay unit 81 from the first load test control unit 70a, and to perform on/off control of the switching devices (the relays of the first reactor-side relay unit 82*a* to the third reactor-side relay unit 82*c*) provided in the reactor-side relay unit 82 from the second load test control unit 70*b*.

(Control Signal Line 5)

Information on the operation state of each switch of the first operation unit 71 is transmitted to the second operation unit 72 via a control signal line 5.

The control signal line 5 may include a cable capable of transmitting a plurality of signals in a superimposed manner, such as an optical fiber cable, or may include a plurality of electric signal cables.

(First Resistor Unit 30*a*)

A configuration of the first resistor unit 30*a* will be described.

The first resistor unit 30*a* includes the first resistor group set 31*a* including a plurality of resistors and the first exhaust lid 33*a*.

The plurality of resistors included in the first resistor group set 31*a* are configured by rod-shaped resistors parallel to the y direction. Said plurality of the resistors are arranged at predetermined intervals in the x direction to form resistor rows. Said resistor rows are arranged in one or more stages in the z direction. The first resistor group set 31*a* is used to perform an R-phase load test of a test target power source such as a three-phase AC generator connected via the first power supply terminal unit 73 of the first load test control unit 70*a*.

Among the plurality of resistors included in the first resistor group set 31*a*, one or more resistors connected in series or in parallel form a resistor group. Said resistor group and the other resistor group included in the first resistor group set 31*a* are connected in a state switchable between series connection and parallel connection. The switching device (the first resistor-side relay unit 81*a*) is provided for switching a connection method for a resistor group and other resistor groups between series connection and parallel connection, and for performing on/off control of power supply for each resistor group.

The load test is performed while changing the number of resistor groups to which the voltage is applied from the R phase of the test target power source and/or the connection method of the resistor groups included in the first resistor group set 31*a*.

According to the present embodiment, an example in which three resistor groups (an 11th resistor group 31*a*1, a 12th resistor group 31*a*2, a 13th resistor group 31*a*3) are provided in the first resistor group set 31*a* will be described. However, the number of resistor groups provided in the first resistor group set 31*a* is not limited to three.

(First Resistor Group Set 31*a*)

The first resistor group set 31*a* includes the 11th resistor group 31*a*1, the 12th resistor group 31*a*2, and the 13th resistor group 31*a*3 (see FIGS. 11 and 14 to 16).

The 11th resistor group 31*a*1, the 12th resistor group 31*a*2, and the 13th resistor group 31*a*3 are connected via the first resistor-side relay unit 81*a* in a state where connection in series and connection in parallel can be switched.

(First Resistor-Side Relay Unit 81*a*)

The first resistor-side relay unit 81*a* includes an 11th relay $R_{11}$, a 12th relay $R_{12}$, a 13th relay $R_{13}$, a 14th relay $R_{14}$, a 15th relay $R_{15}$, a 16th relay $R_{16}$, and a 17th relay $R_{17}$.

One contact (for example, a movable contact) of the 11th relay $R_{11}$ is connected to one end of the 11th resistor group 31*a*1.

The other contact (for example, a fixed contact) of the 11th relay $R_{11}$ is connected to one end of the 12th resistor group 31*a*2.

One contact (for example, a movable contact) of the 12th relay $R_{12}$ is connected to the other end of the 11th resistor group 31*a*1.

The other contact (for example, a fixed contact) of the 12th relay $R_{12}$ is connected to said one end of the 12th resistor group 31*a*2.

One contact (for example, a movable contact) of the 13th relay $R_{13}$ is connected to said the other end of the 11th resistor group 31*a*1.

The other contact (for example, a fixed contact) of the 13th relay $R_{13}$ is connected to a first neutral point c1.

One contact (for example, a movable contact) of the 14th relay $R_{14}$ is connected to the other end of the 12th resistor group 31*a*2.

The other contact (for example, a fixed contact) of the 14th relay $R_{14}$ is connected to one end of the 13th resistor group 31*a*3.

One contact (for example, a movable contact) of the 15th relay $R_{15}$ is connected to said one end of the 12th resistor group 31*a*2.

The other contact (for example, a fixed contact) of the 15th relay $R_{15}$ is connected to said one end of the 13th resistor group 31*a*3.

One contact (for example, a movable contact) of the 16th relay $R_{16}$ is connected to said the other end of the 12th resistor group 31*a*2.

The other contact (for example, a fixed contact) of the 16th relay $R_{16}$ is connected to the first neutral point c1.

One contact (for example, a movable contact) of the 17th relay $R_{17}$ is connected to the other end of the 13th resistor group 31*a*3.

The other contact (for example, a fixed contact) of the 17th relay $R_{17}$ is connected to the first neutral point c1.

The first exhaust lid 33*a* is provided in an exhaust opening (the first upper-surface opening 2*a*1) on the upper surface of the first housing 2*a*.

When the load test is performed, that is, when the first load test unit is used, the first exhaust lid 33*a* is opened so that air can be discharged from the first upper-surface opening 2*a*1 of the first housing 2*a*.

When the load test is not performed, that is, when the first load test unit is not used, the first exhaust lid 33*a* is closed so that air cannot flow in from the first upper-surface opening 2*a*1 of the first housing 2*a* (not to let foreign matter enter from the outside through the first upper-surface opening 2*a*1).

The opening and closing of the first exhaust lid 33*a* may be performed electrically, or may be performed manually by a user or the like.

(Second Resistor Unit 30*b*)

A configuration of the second resistor unit 30*b* will be described.

The second resistor unit 30*b* includes the second resistor group set 31*b* including a plurality of resistors and the second exhaust lid 33*b*.

The plurality of resistors included in the second resistor group set 31*b* are configured by rod-shaped resistors parallel to the y direction. Said plurality of the resistors are arranged at predetermined intervals in the x direction to form resistor rows. Said resistor rows are arranged in one or more stages in the z direction. The second resistor group set 31*b* is used to perform an S-phase load test of the test target power source such as the three-phase AC generator connected via the first power supply terminal unit 73 of the first load test control unit 70*a*.

Among the plurality of resistors included in the second resistor group set 31*b*, one or more resistors connected in series or in parallel form a resistor group. Said resistor group and the other resistor group included in the second resistor group set 31*b* are connected in a state switchable between series connection and parallel connection. The switching device (the second resistor-side relay unit 81*b*) is provided for switching a connection method for a resistor group and other resistor groups between series connection and parallel connection, and for performing on/off control of power supply for each resistor group.

The load test is performed while changing the number of resistor groups to which the voltage is applied from the S phase of the test target power source and/or the connection method of the resistor groups included in the second resistor group set 31*b*.

According to the present embodiment, an example in which three resistor groups (a 21st resistor group 31*b*1, a 22nd resistor group 31*b*2, a 23rd resistor group 31*b*3) are provided in the second resistor group set 31*b* will be described. However, the number of resistor groups provided in the second resistor group set 31*b* is not limited to three.

(Second Resistor Group Set 31*b*)

The second resistor group set 31*b* includes the 21st resistor group 31*b*1, the 22nd resistor group 31*b*2, and the 23rd resistor group 31*b*3.

The 21st resistor group 31*b*1, the 22nd resistor group 31*b*2, and the 23rd resistor group 31*b*3 are connected via the second resistor-side relay unit 81*b* in a state where connection in series and connection in parallel can be switched.

(Second Resistor-Side Relay Unit 81*b*)

The second resistor-side relay unit 81*b* includes a 21st relay $R_{21}$, a 22nd relay $R_{22}$, a 23rd relay $R_{23}$, a 24th relay $R_{24}$, a 25th relay $R_{25}$, a 26th relay $R_{26}$, and a 27th relay $R_{27}$.

One contact (for example, a movable contact) of the 21st relay $R_{21}$ is connected to one end of the 21st resistor group 31*b*1.

The other contact (for example, a fixed contact) of the 21st relay $R_{21}$ is connected to one end of the 22nd resistor group 31*b*2.

One contact (for example, a movable contact) of the 22nd relay $R_{22}$ is connected to the other end of the 21st resistor group 31*b*1.

The other contact (for example, a fixed contact) of the 22nd relay $R_{22}$ is connected to said one end of the 22nd resistor group 31*b*2.

One contact (for example, a movable contact) of the 23rd relay $R_{23}$ is connected to said the other end of the 21st resistor group 31*b*1.

The other contact (for example, a fixed contact) of the 23rd relay $R_{23}$ is connected to the first neutral point c1.

One contact (for example, a movable contact) of the 24th relay $R_{24}$ is connected to the other end of the 22nd resistor group 31*b*2.

The other contact (for example, a fixed contact) of the 24th relay $R_{24}$ is connected to one end of the 23rd resistor group 31*b*3.

One contact (for example, a movable contact) of the 25th relay $R_{25}$ is connected to said one end of the 22nd resistor group 31*b*2.

The other contact (for example, a fixed contact) of the 25th relay $R_{25}$ is connected to said one end of the 23rd resistor group 31*b*3.

One contact (for example, a movable contact) of the 26th relay $R_{26}$ is connected to said the other end of the 22nd resistor group 31*b*2.

The other contact (for example, a fixed contact) of the 26th relay $R_{26}$ is connected to the first neutral point c1.

One contact (for example, a movable contact) of the 27th relay $R_{27}$ is connected to the other end of the 23rd resistor group 31*b*3.

The other contact (for example, a fixed contact) of the 27th relay $R_{27}$ is connected to the first neutral point c1.

The second exhaust lid 33*b* is provided in an exhaust opening (the second upper-surface opening 2*b*1) on the upper surface of the second housing 2*b*.

When the load test is performed, that is, when the second load test unit is used, the second exhaust lid 33*b* is opened so that air can be discharged from the second upper-surface opening 2*b*1 of the second housing 2*b*.

When the load test is not performed, that is, when the second load test unit is not used, the second exhaust lid 33*b* is closed so that air cannot flow in from the second upper-surface opening 2*b*1 of the second housing 2*b* (not to let foreign matter enter from the outside through the second upper-surface opening 2*b*1).

The opening and closing of the second exhaust lid 33*b* may be performed electrically, or may be performed manually by a user or the like.

(Third Resistor Unit 30*c*)

A configuration of the third resistor unit 30*c* will be described.

The third resistor unit 30*c* includes the third resistor group set 31*c* including a plurality of resistors and the third exhaust lid 33*c*.

The plurality of resistors included in the third resistor group set 31*c* are configured by rod-shaped resistors parallel to the y direction. Said plurality of the resistors are arranged at predetermined intervals in the x direction to form resistor rows. Said resistor rows are arranged in one or more stages in the z direction. The third resistor group set 31*c* is used to perform a T-phase load test of the test target power source such as the three-phase AC generator connected via the first power supply terminal unit 73 of the first load test control unit 70*a*.

Among the plurality of resistors included in the third resistor group set 31*c*, one or more resistors connected in series or in parallel form a resistor group. Said resistor group and the other resistor group included in the third resistor group set 31*c* are connected in a state switchable between series connection and parallel connection. The switching device (the third resistor-side relay unit 81*c*) is provided for switching a connection method for a resistor group and other resistor groups between series connection and parallel connection, and for performing on/off control of power supply for each resistor group.

The load test is performed while changing the number of resistor groups to which the voltage is applied from the T phase of the test target power source and/or the connection method of the resistor groups included in the third resistor group set 31*c*.

According to the present embodiment, an example in which three resistor groups (a 31st resistor group 31*c*1, a 32nd resistor group 31*c*2, and a 33rd resistor group 31*c*3) are provided in the third resistor group set 31*c* will be described. However, the number of resistor groups provided in the third resistor group set 31*c* is not limited to three.

(Third Resistor Group Set 31c)

The third resistor group set 31c includes the 31st resistor group 31c1, the 32nd resistor group 31c2, and the 33rd resistor group 31c3.

The 31st resistor group 31c1, the 32nd resistor group 31c2, and the 33rd resistor group 31c3 are connected via the third resistor-side relay unit 81c in a state where connection in series and connection in parallel can be switched.

(Third Resistor-Side Relay Unit 81c)

The third resistor-side relay unit 81c includes a 31st relay $R_{31}$, a 32nd relay $R_{32}$, a 33rd relay $R_{33}$, a 34th relay $R_{34}$, a 35th relay $R_{35}$, a 36th relay $R_{36}$, and a 37th relay $R_{37}$.

One contact (for example, a movable contact) of the 31st relay $R_{31}$ is connected to one end of the 31st resistor group 31c1.

The other contact (for example, a fixed contact) of the 31st relay $R_{31}$ is connected to one end of the 32nd resistor group 31c2.

One contact (for example, a movable contact) of the 32nd relay $R_{32}$ is connected to the other end of the 31st resistor group 31c1.

The other contact (for example, a fixed contact) of the 32nd relay $R_{32}$ is connected to said one end of the 32nd resistor group 31c2.

One contact (for example, a movable contact) of the 33rd relay $R_{33}$ is connected to said the other end of the 31st resistor group 31c1.

The other contact (for example, a fixed contact) of the 33rd relay $R_{33}$ is connected to the first neutral point c1.

One contact (for example, a movable contact) of the 34th relay $R_{34}$ is connected to the other end of the 32nd resistor group 31c2.

The other contact (for example, a fixed contact) of the 34th relay $R_{34}$ is connected to one end of the 33rd resistor group 31c3.

One contact (for example, a movable contact) of the 35th relay $R_{35}$ is connected to said one end of the 32nd resistor group 31c2.

The other contact (for example, a fixed contact) of the 35th relay $R_{35}$ is connected to said one end of the 33rd resistor group 31c3.

One contact (for example, a movable contact) of the 36th relay $R_{36}$ is connected to said the other end of the 32nd resistor group 31c2.

The other contact (for example, a fixed contact) of the 36th relay $R_{36}$ is connected to the first neutral point c1.

One contact (for example, a movable contact) of the 37th relay $R_{37}$ is connected to the other end of the 33rd resistor group 31c3.

The other contact (for example, a fixed contact) of the 37th relay $R_{37}$ is connected to the first neutral point c1.

The third exhaust lid 33c is provided in an exhaust opening (the third upper-surface opening 2c1) on the upper surface of the third housing 2c.

When the load test is performed, that is, when the third load test unit is used, the third exhaust lid 33c is opened so that air can be discharged from the third upper-surface opening 2c1 of the third housing 2c.

When the load test is not performed, that is, when the third load test unit is not used, the third exhaust lid 33c is closed so that air cannot flow in from the third upper-surface opening 2c1 of the third housing 2c (not to let foreign matter enter from the outside through the third upper-surface opening 2c1).

The opening and closing of the third exhaust lid 33c may be performed electrically, or may be performed manually by a user or the like.

(Neutral Point Connection)

For the neutral point connection, the resistor group of the first resistor group set 31a, the resistor group of the second resistor group set 31b, and the resistor group of the third resistor group set 31c are short-circuited. A neutral point where the first resistor group set 31a, the second resistor group set 31b, and the third resistor group set 31c are short-circuited is defined as the first neutral point c1.

(Arrangement Direction of Resistors)

According to the present embodiment, a mode has been described in which a plurality of rod-shaped resistors parallel to the y direction are arranged at predetermined intervals in the x direction in the resistor rows in the first resistor group set 31a to the third resistor group set 31c. However, a plurality of rod-shaped resistors parallel to the x direction may be arranged at predetermined intervals in the y direction.

(First Cooling Unit 50a)

A configuration of the first cooling unit 50a will be described.

The first cooling unit 50a includes the first intake lids 51a and the first cooling device 53a.

The first intake lids 51a are provided in intake openings (the first side-surface openings 2a2) on the front surface and the back surface of the first housing 2a.

When the load test is performed, that is, when the first load test unit of the load testing device 1 is used, the first intake lids 51a are opened so that air can flow in from the first side-surface openings 2a2 of the first housing 2a.

When the load test is not performed, that is, when the first load test unit of the load testing device 1 is not used, the first intake lids 51a are closed so that air cannot flow in from the first side-surface openings 2a2 of the first housing 2a.

The opening and closing of the first intake lids 51a may be performed electrically, or may be performed manually by a user or the like.

The first cooling device 53a is a blower such as a cooling fan that discharges air in an upward direction (z direction), and sends air introduced from an intake port to the first resistor unit 30a.

The air sent by the first cooling device 53a passes through the inside of the first resistor unit 30a and is discharged from the first upper-surface opening 2a1 (see the thick arrow line in FIG. 6).

(Second Cooling Unit 50b)

A configuration of the second cooling unit 50b will be described.

The second cooling unit 50b includes the second intake lids 51b and the second cooling device 53b.

The second intake lids 51b are provided in intake openings (the second side-surface openings 2b2) on the front surface and the back surface of the second housing 2b.

When the load test is performed, that is, when the second load test unit of the load testing device 1 is used, the second intake lids 51b are opened so that air can flow in from the second side-surface openings 2b2 of the second housing 2b.

When the load test is not performed, that is, when the second load test unit of the load testing device 1 is not used, the second intake lid 51b is closed so that air cannot flow in from the second side-surface opening 2b2 of the second housing 2b.

The opening and closing of the second intake lids 51b may be performed electrically, or may be performed manually by a user or the like.

The second cooling device 53b is a blower such as a cooling fan that discharges air in an upward direction (the z direction), and sends air introduced from an intake port to the second resistor unit 30b.

The air sent by the second cooling device 53b passes through the inside of the second resistor unit 30b and is discharged from the second upper-surface opening 2b1.

(Third Cooling Unit 50c)

A configuration of the third cooling unit 50c will be described.

The third cooling unit 50c includes the third intake lids 51c and the third cooling device 53c.

The third intake lids 51c are provided in intake openings (the third side-surface openings 2c2) on the front surface and the back surface of the third housing 2c.

When the load test is performed, that is, when the third load test unit of the load testing device 1 is used, the third intake lids 51c are opened so that air can flow in from the third side-surface openings 2c2 of the third housing 2c.

When the load test is not performed, that is, when the third load test unit of the load testing device 1 is not used, the third intake lids 51c are closed so that air cannot flow in from the third side-surface openings 2c2 of the third housing 2c.

The opening and closing of the third intake lids 51c may be performed electrically, or may be performed manually by a user or the like.

The third cooling device 53c is a blower such as a cooling fan that discharges air in an upward direction (the z direction), and sends air introduced from an intake port to the third resistor unit 30c.

The air sent by the third cooling device 53c passes through the inside of the third resistor unit 30c and is discharged from the third upper-surface opening 2c1.

(Installation of Resistor Group Set and Cooling Device)

The first resistor group set 31a of the first resistor unit 30a and the first cooling device 53a of the first cooling unit 50a may be directly attached to the first housing 2a or may be attached via a frame (not illustrated).

The second resistor group set 31b of the second resistor unit 30b and the second cooling device 53b of the second cooling unit 50b may be directly attached to the second housing 2b or may be attached via a frame (not illustrated).

The third resistor group set 31c of the third resistor unit 30c and the third cooling device 53c of the third cooling unit 50c may be directly attached to the third housing 2c or may be attached via a frame (not illustrated).

(First Reactor 60a)

A configuration of the first reactor 60a will be described.

The first reactor 60a has the first coil group 61a including a plurality of coils.

The plurality of coils included in the first coil group 61a are arranged in one or more stages in the z direction. The first coil group 61a is used to adjust the power factor in the R-phase load test of the test target power source such as the three-phase AC generator connected via the second power supply terminal unit 74 of the second load test control unit 70b.

The plurality of coils included in the first coil group 61a are connected in a state switchable between series connection and parallel connection. The switching device (the first reactor-side relay unit 82a) is provided for switching a connection method between a coil and other coils between series connection and parallel connection, and for performing on/off control of power supply for each coil.

In order to adjust the inductance, the load test is performed while changing the number of coils for applying the voltage from the R phase of the test target power source and/or the connection method of the coils included in the first coil group 61a.

According to the present embodiment, an example in which three coils (the 11th coil 61a1, the 12th coil 61a2, the 13th coil 61a3) are provided in the first coil group 61a will be described. However, the number of coils provided in the first coil group 61a is not limited to three.

(First Coil Group 61a)

The first coil group 61a includes the 11th coil 61a1, the 12th coil 61a2, the 13th coil 61a3, and the first iron core 61a4 (see FIGS. 11 to 16).

The 11th coil 61a1, the 12th coil 61a2, and the 13th coil 61a3 are connected via the first reactor-side relay unit 82a in a state switchable between series connection and parallel connection.

The first iron core 61a4 is provided in the 11th coil 61a1, the 12th coil 61a2, and the 13th coil 61a3.

The 11th coil 61a1, the 12th coil 61a2, and the 13th coil 61a3 may be formed by winding the conductive wire around the first iron core 61a4, or the 11th coil 61a1, the 12th coil 61a2, and the 13th coil 61a3 may be formed in a spiral shape and inserted into the first iron core 61a4.

Figure 13:
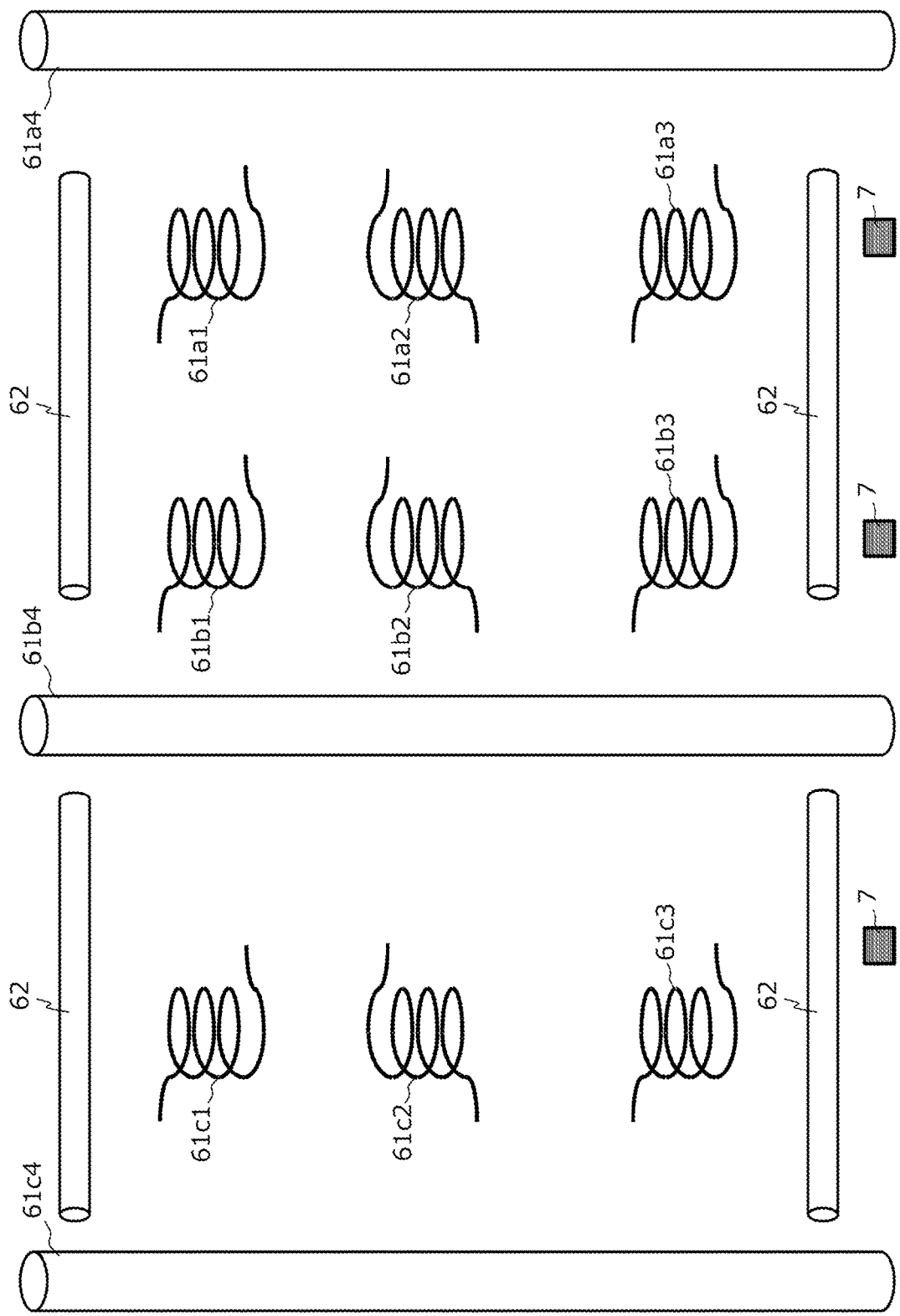
FIG. 13 is an exploded view of a coil, an iron core, and a connecting rod.

The 11th coil 61a1 is configured to be a positional relationship that one end and the other end sandwich the central axis of the 11th coil 61a1 (the region through which the first iron core 61a4 passes) when viewed from above (z direction) (see FIG. 13).

The 12th coil 61a2 is configured to be a positional relationship that one end and the other end sandwich the central axis of the 12th coil 61a2 (the region through which the first iron core 61a4 passes) when viewed from above (z direction).

The 11th coil 61a1 and the 12th coil 61a2 are configured such that said the other end of the 11th coil 61a1 and said one end of the 12th coil 61a2 are facing each other in the z direction.

The 13th coil 61a3 is configured to be a positional relationship that one end and the other end sandwich the central axis of the 13th coil 61a3 (the region through which the first iron core 61a4 passes) when viewed from above (z direction).

The 12th coil 61a2 and the 13th coil 61a3 are configured such that said the other end of the 12th coil 61a2 and said one end of the 13th coil 61a3 are facing each other in the z direction.

As a result, it is possible to efficiently arrange the switching devices in the space around the 11th coil 61a1, the 12th coil 61a2, and the 13th coil 61a3.

(First Reactor-Side Relay Unit 82a)

The first reactor-side relay unit 82a includes the 41st relay $R_{41}$, the 42nd relay $R_{42}$, the 43rd relay $R_{43}$, the 44th relay $R_{44}$, the 45th relay $R_{45}$, the 46th relay $R_{46}$, and the 47th relay $R_{47}$.

One contact (for example, a movable contact) of the 41st relay $R_{41}$ is connected to one end of the 11th coil 61a1.

The other contact (for example, a fixed contact) of the 41st relay $R_{41}$ is connected to one end of the 12th coil 61a2.

One contact (for example, a movable contact) of the 42nd relay $R_{42}$ is connected to the other end of the 11th coil 61a1.

The other contact (for example, a fixed contact) of the 42nd relay $R_{42}$ is connected to said one end of the 12th coil 61a2.

One contact (for example, a movable contact) of the 43rd relay $R_{43}$ is connected to said the other end of the 11th coil 61a1.

The other contact (for example, a fixed contact) of the 43rd relay $R_{43}$ is connected to a second neutral point c2.

One contact (for example, a movable contact) of the 44th relay $R_{44}$ is connected to the other end of the 12th coil 61a2.

The other contact (for example, a fixed contact) of the 44th relay $R_{44}$ is connected to one end of the 13th coil 61a3.

One contact (for example, a movable contact) of the 45th relay $R_{45}$ is connected to said one end of the 12th coil 61a2.

The other contact (for example, a fixed contact) of the 45th relay $R_{45}$ is connected to said one end of the 13th coil 61a3.

One contact (for example, a movable contact) of the 46th relay $R_{46}$ is connected to said the other end of the 12th coil 61a2.

The other contact (for example, a fixed contact) of the 46th relay $R_{46}$ is connected to the second neutral point c2.

One contact (for example, a movable contact) of the 47th relay $R_{47}$ is connected to the other end of the 13th coil 61a3.

The other contact (for example, a fixed contact) of the 47th relay $R_{47}$ is connected to the second neutral point c2.

(Second Reactor 60b)

A configuration of the second reactor 60b will be described.

The second reactor 60b has the second coil group 61b including a plurality of coils.

The plurality of coils included in the second coil group 61b are arranged in one or more stages in the z direction. The second coil group 61b is used to adjust the power factor in the S-phase load test of the test target power source such as the three-phase AC generator connected via the second power supply terminal unit 74 of the second load test control unit 70b.

The plurality of coils included in the second coil group 61b are connected in a state switchable between series connection and parallel connection. The switching device (the second reactor-side relay unit 82b) is provided for switching a connection method for a coil and other coils between series connection and parallel connection, and for performing on/off control of power supply for each coil.

In order to adjust the inductance, the load test is performed while changing the number of coils for applying the voltage from the S phase of the test target power source and/or the connection method of the coils included in the second coil group 61b.

According to the present embodiment, an example in which three coils (the 21st coil 61b1, the 22nd coil 61b2, the 23rd coil 61b3) are provided in the second coil group 61b will be described. However, the number of coils provided in the second coil group 61b is not limited to three.

(Second Coil Group 61b)

The second coil group 61b includes the 21st coil 61b1, the 22nd coil 61b2, the 23rd coil 61b3, and the second iron core 61b4.

The 21st coil 61b1, the 22nd coil 61b2, and the 23rd coil 61b3 are connected via the second reactor-side relay unit 82b in a state switchable between series connection and parallel connection.

The second iron core 61b4 is provided in the 21st coil 61b1, the 22nd coil 61b2, and the 23rd coil 61b3.

The 21st coil 61b1, the 22nd coil 61b2, and the 23rd coil 61b3 may be formed by winding the conductive wire around the second iron core 61b4, or the 21st coil 61b1, the 22nd coil 61b2, and the 23rd coil 61b3 may be formed in a spiral shape and inserted into the second iron core 61b4.

The 21st coil 61b1 is configured to be a positional relationship that one end and the other end sandwich the central axis of the 21st coil 61b1 (the region through which the second iron core 61b4 passes) when viewed from above (z direction).

The 22nd coil 61b2 is configured to be a positional relationship that one end and the other sandwich the central axis of the 22nd coil 61b2 (the region through which the second iron core 61b4 passes) when viewed from above (z direction).

The 21st coil 61b1 and the 22nd coil 61b2 are configured such that said the other end of the 21st coil 61b1 and said one end of the 22nd coil 61b2 are facing each other in the z direction.

The 23rd coil 61b3 is configured to be a positional relationship that one end and the other end sandwich the central axis of the 23rd coil 61b3 (the region through which the second iron core 61b4 passes) when viewed from above (z direction).

The 22nd coil 61b2 and the 23rd coil 61b3 are configured such that said the other end of the 22nd coil 61b2 and said one end of the 23rd coil 61b3 are facing each other in the z direction.

As a result, it is possible to efficiently arrange the switching devices in the space around the 21st coil 61b1, the 22nd coil 61b2, and the 23rd coil 61b3.

(Second Reactor-Side Relay Unit 82b)

The second reactor-side relay unit 82b includes the 51st relay $R_{51}$, the 52nd relay $R_{52}$, the 53rd relay $R_{53}$, the 54th relay $R_{54}$, the 55th relay $R_{55}$, the 56th relay $R_{56}$, and the 57th relay $R_{57}$.

One contact (for example, a movable contact) of the 51st relay $R_{51}$ is connected to one end of the 21st coil 61b1.

The other contact (for example, a fixed contact) of the 51st relay $R_{51}$ is connected to one end of the 22nd coil 61b2.

One contact (for example, a movable contact) of the 52nd relay $R_{52}$ is connected to the other end of the 21st coil 61b1.

The other contact (for example, a fixed contact) of the 52nd relay $R_{52}$ is connected to said one end of the 22nd coil 61b2.

One contact (for example, a movable contact) of the 53rd relay $R_{53}$ is connected to said the other end of the 21st coil 61b1.

The other contact (for example, a fixed contact) of the 53rd relay $R_{53}$ is connected to the second neutral point c2.

One contact (for example, a movable contact) of the 54th relay $R_{54}$ is connected to the other end of the 22nd coil 61b2.

The other contact (for example, a fixed contact) of the 54th relay $R_{54}$ is connected to one end of the 23rd coil 61b3.

One contact (for example, a movable contact) of the 55th relay $R_{55}$ is connected to said one end of the 22nd coil 61b2.

The other contact (for example, a fixed contact) of the 55th relay $R_{55}$ is connected to said one end of the 23rd coil 61b3.

One contact (for example, a movable contact) of the 56th relay $R_{56}$ is connected to said the other end of the 22nd coil 61b2.

The other contact (for example, a fixed contact) of the 56th relay $R_{56}$ is connected to the second neutral point c2.

One contact (for example, a movable contact) of the 57th relay $R_{57}$ is connected to the other end of the 23rd coil 61b3.

The other contact (for example, a fixed contact) of the 57th relay $R_{57}$ is connected to the second neutral point c2.

(Third Reactor 60c)

A configuration of the third reactor 60c will be described.

The third reactor 60c has the third coil group 61c including a plurality of coils.

The plurality of coils included in the third coil group 61c are arranged in one or more stages in the z direction. The third coil group 61*c* is used to adjust the power factor in the T-phase load test of the test target power source such as the three-phase AC generator connected via the second power supply terminal unit 74 of the second load test control unit 70*b*.

The plurality of coils included in the third coil group 61*c* are connected in a state switchable between series connection and parallel connection. The switching device (the third reactor-side relay unit 82*c*) is provided for switching a connection method for a coil and other coils between series connection and parallel connection, and for performing on/off control of power supply for each coil.

In order to adjust the inductance, the load test is performed while changing the number of coils for applying the voltage from the T phase of the test target power source and/or the connection method of the coils included in the third coil group 61*c*.

According to the present embodiment, an example in which three coils (the 31st coil 61*c*1, the 32nd coil 61*c*2, the 33rd coil 61*c*3) are provided in the third coil group 61*c* will be described. However, the number of coils provided in the third coil group 61*c* is not limited to three.

(Third Coil Group 61*c*)

The third coil group 61*c* includes the 31st coil 61*c*1, the 32nd coil 61*c*2, the 33rd coil 61*c*3, and the third iron core 61*c*4.

The 31st coil 61*c*1, the 32nd coil 61*c*2, and the 33rd coil 61*c*3 are connected via the third reactor-side relay unit 82*c* in a state switchable between series connection and parallel connection.

The third iron core 61*c*4 is provided in the 31st coil 61*c*1, the 32nd coil 61*c*2, and the 33rd coil 61*c*3. The 31st coil 61*c*1, the 32nd coil 61*c*2, and the 33rd coil 61*c*3 may be formed by winding the conductive wire around the third iron core 61*c*4, or the 31st coil 61*c*1, the 32nd coil 61*c*2, and the 33rd coil 61*c*3 may be formed in a spiral shape and inserted into the third iron core 61*c*4.

The 31st coil 61*c*1 is configured to be a positional relationship that one end and the other end sandwich the central axis of the 31st coil 61*c*1 (the region through which the third iron core 61*c*4 passes) when viewed from above (z direction).

The 32nd coil 61*c*2 is configured to be a positional relationship that one end and the other end sandwich the central axis of the 32nd coil 61*c*2 (the region through which the third iron core 61*c*4 passes) when viewed from above (z direction).

The 31st coil 61*c*1 and the 32nd coil 61*c*2 are configured such that said the other end of the 31st coil 61*c*1 and said one end of the 32nd coil 61*c*2 are facing each other in the z direction.

The 33rd coil 61*c*3 is configured to be a positional relationship that one end and the other end sandwich the central axis of the 33rd coil 61*c*3 (the region through which the third iron core 61*c*4 passes) when viewed from above (z direction).

The 32nd coil 61*c*2 and the 33rd coil 61*c*3 are configured such that said the other end of the 32nd coil 61*c*2 and said one end of the 33rd coil 61*c*3 are facing each other in the z direction.

As a result, it is possible to efficiently arrange the switching devices in the space around the 31st coil 61*c*1, the 32nd coil 61*c*2, and the 33rd coil 61*c*3.

(Third Reactor-Side Relay Unit 82*c*)

The third reactor-side relay unit 82*c* includes the 61st relay $R_{61}$, the 62nd relay $R_{62}$, the 63rd relay $R_{63}$, the 64th relay $R_{64}$, the 65th relay $R_{65}$, the 66th relay $R_{66}$, and the 67th relay $R_{67}$.

One contact (for example, a movable contact) of the 61st relay $R_{61}$ is connected to one end of the 31st coil 61*c*1.

The other contact (for example, a fixed contact) of the 61st relay $R_{61}$ is connected to one end of the 32nd coil 61*c*2.

One contact (for example, a movable contact) of the 62nd relay $R_{62}$ is connected to the other end of the 31st coil 61*c*1.

The other contact (for example, a fixed contact) of the 62nd relay $R_{62}$ is connected to said one end of the 32nd coil 61*c*2.

One contact (for example, a movable contact) of the 63rd relay $R_{63}$ is connected to said the other end of the 31st coil 61*c*1.

The other contact (for example, a fixed contact) of the 63rd relay $R_{63}$ is connected to the second neutral point c2.

One contact (for example, a movable contact) of the 64th relay $R_{64}$ is connected to the other end of the 32nd coil 61*c*2.

The other contact (for example, a fixed contact) of the 64th relay $R_{64}$ is connected to the one end of the 33rd coil 61*c*3.

One contact (for example, a movable contact) of the 65th relay $R_{65}$ is connected to said one end of the 32nd coil 61*c*2.

The other contact (for example, a fixed contact) of the 65th relay $R_{65}$ is connected to said one end of the 33rd coil 61*c*3.

One contact (for example, a movable contact) of the 66th relay $R_{66}$ is connected to said the other end of the 32nd coil 61*c*2.

The other contact (for example, a fixed contact) of the 66th relay $R_{66}$ is connected to the second neutral point c2.

One contact (for example, a movable contact) of the 67th relay $R_{67}$ is connected to the other end of the 33rd coil 61*c*3.

The other contact (for example, a fixed contact) of the 67th relay $R_{67}$ is connected to the second neutral point c2.

(Connection of First Iron Core 61*a*4, Second Iron Core 61*b*4, and Third Iron Core 61*c*4)

The first iron core 61*a*4 and the second iron core 61*b*4 are connected via the connecting rod 62.

The second iron core 61*b*4 and the third iron core 61*c*4 are connected via the connecting rod 62.

The first iron core 61*a*4 to the third iron core 61*c*4 and the connecting rod 62 may be configured integrally or may be configured separately and connected after attachment of the 11th coil 61*a*1 or the like.

At least one of the first iron core 61*a*4, the second iron core 61*b*4, the third iron core 61*c*4, and the connecting rod 62 is held by the housing (the fifth housing 2*e* to the eighth housing 2*h*) of the second load test section 1*b* via an insulator 7.

Figure 12:
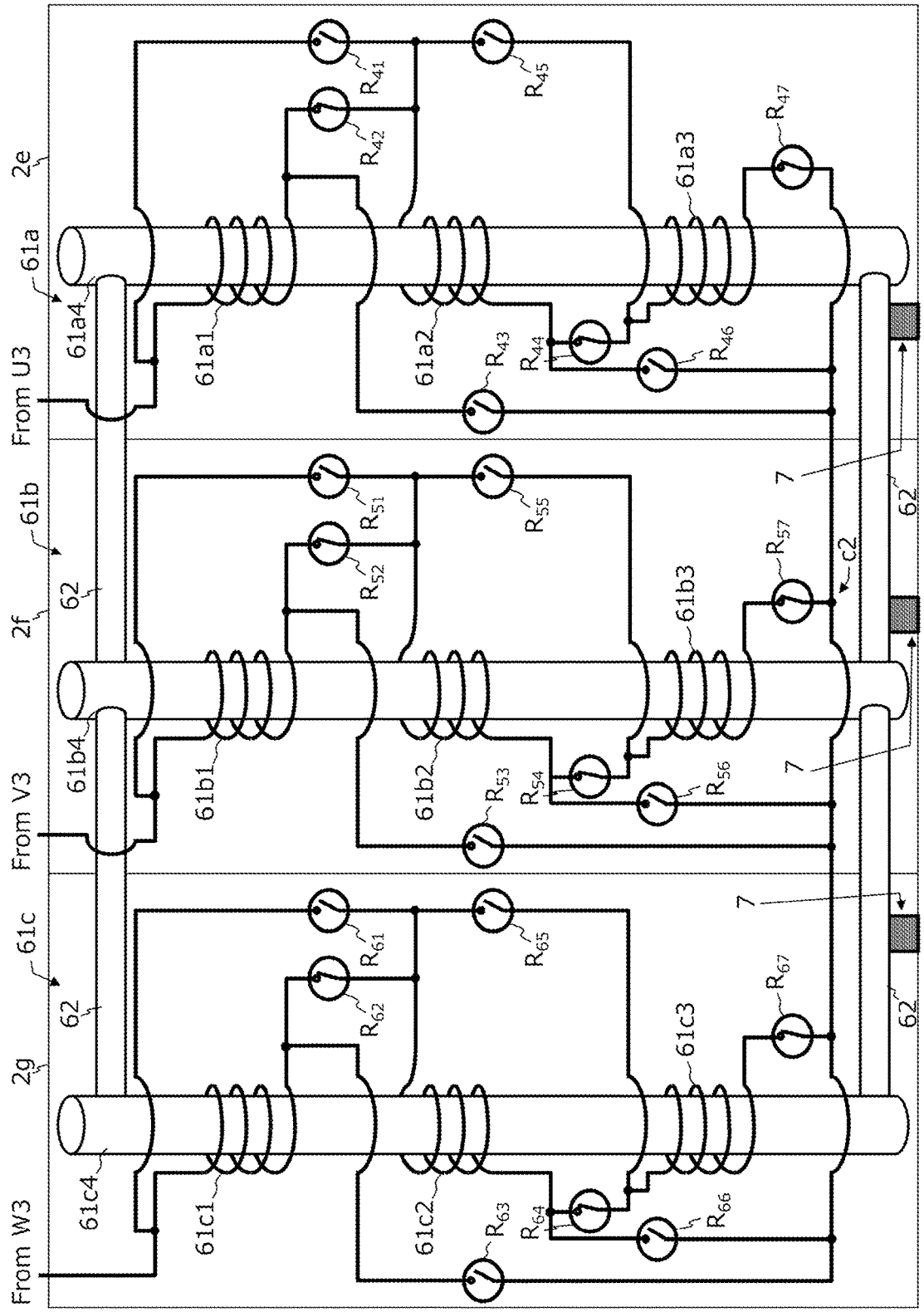
FIG. 12 is a schematic diagram illustrating on/off states of relays of the first coil group to the third coil group when a load test of the high-voltage test target power source is performed.

According to the present embodiment, an example is illustrated in which the connecting rod 62 is held in the fifth housing 2*e*, the sixth housing 2*f*, and the seventh housing 2*g* via the insulator 7 (see FIG. 12).

(First Load Test Control Unit 70*a*, Second Load Test Control Unit 70*b*)

Configurations of the first load test control unit 70*a* and the second load test control unit 70*b* will be described.

The first load test control unit 70*a* includes the first operation unit 71, the first power supply terminal unit 73, the first control terminal unit 75, and the first power supply control unit 77.

The first operation unit 71, the first power supply terminal unit 73, the first control terminal unit 75, and the first power supply control unit 77 are housed in the fourth housing 2*d*.

The second load test control unit 70b includes the second operation unit 72, the second power supply terminal unit 74, the second control terminal unit 76, and the second power supply control unit 78.

The second operation unit 72, the second power supply terminal unit 74, the second control terminal unit 76, and the second power supply control unit 78 are housed in the eighth housing 2h.

The switching devices of the first resistor unit 30a to the third resistor unit 30c (the first resistor-side relay unit 81a to the third resistor-side relay unit 81c), the first cooling device 53a to the third cooling device 53c, and the first power supply control unit 77 are driven by a power source (power source for driving load testing device) different from the test target power source (see FIGS. 2 and 3).

However, the switching devices of the first resistor unit 30a to the third resistor unit 30c (the first resistor-side relay unit 81a to the third resistor-side relay unit 81c), the first cooling device 53a to the third cooling device 53c, and the first power supply control unit 77 may be driven by the test target power source.

The switching devices of the first reactor 60a to the third reactor 60c (the first reactor-side relay unit 82a to the third reactor-side relay unit 82c) and the second power supply control unit 78 are driven by a power source (power source for driving load testing device) different from the test target power source (see FIGS. 4 and 5).

However, the switching devices of the first reactor 60a to the third reactor 60c (the first reactor-side relay unit 82a to the third reactor-side relay unit 82c) and the second power supply control unit 78 may be driven by the test target power source.

The operation of the first operation unit 71, the operation of the second operation unit 72, the cable connection between the first operation unit 71 and the power source for driving load testing device, the cable connection between the first power supply terminal unit 73 and the test target power source, the cable connection between the first power supply terminal unit 73 and the second power supply terminal unit 74, and the cable connection between the first operation unit 71 and the second operation unit 72 are performed in a state where a first door 2d1 provided in the fourth housing 2d and a second door 2h1 provided in the eighth housing 2h are opened (see FIG. 1).

(First Operation Unit 71)

The first operation unit 71 includes a mode switch, a fan switch, and an operation switch (not illustrated).

The mode switch is a rotary type or a slide type (or a toggle type or a push button type) operation switch, and is used to select on/off of the load testing device 1.

However, the mode switch may also be used to select (mode switching) the type (high voltage or low voltage) of the test target power source, the connection form (series or parallel) of the resistor group, and the like.

The mode switch may not be provided for selecting the connection form of the resistor group, and the connection form of the resistor group may be automatically determined by selecting the type of the test target power source.

When the load test is performed, the mode switch is adjusted to the ON operation position. When the load testing device 1 is turned off, the mode switch is adjusted to the OFF operation position.

The fan switch is a slide type (or toggle type or push button type) operation switch, and is a switch for performing on/off control of the first cooling device 53a to the third cooling device 53c while the mode switch is in an on state. The first cooling device 53a to the third cooling device 53c may operate when the fan switch is omitted and the mode switch is switched to the ON operation position.

The operation switch is a slide type (or toggle type or push button type) operation switch for adjusting the load amount, that is, for performing on/off control of the switching device of the resistor group of the first resistor group set 31a of the first resistor unit 30a (the first resistor-side relay unit 81a), the switching device of the resistor group of the second resistor group set 31b of the second resistor unit 30b (the second resistor-side relay unit 81b), and the switching device of the resistor group of the third resistor group set 31c of the third resistor unit 30c (the third resistor-side relay unit 81c).

The first operation unit 71 is provided with a terminal for connection with the control signal line 5.

Information on the on/off state of the mode switch and the operation switch of the first operation unit 71 is transmitted to the second operation unit 72 via the control signal line 5.

(Second Operation Unit 72)

The second operation unit 72 has an on/off switch of the second load test section 1b (not illustrated).

The on/off switch of the second load test section 1b is a slide type (or toggle type or push button type) operation switch for performing on/off control of power supply sent from the test target power source via the first load test section 1a to the reactor unit 60 of the second load test section 1b.

When the on/off switch of the second load test section 1b is turned on, power supply to the reactor unit 60 is enabled, and on/off control of the relay of the reactor-side relay unit 82 is performed based on the information regarding the operation state transmitted to the second operation unit 72 via the control signal line 5.

When the mode switch is adjusted to the ON operation position and the fan switch is adjusted to the ON operation position, the first cooling device 53a to the third cooling device 53c are driven.

The on/off control of the switching device (the first resistor-side relay unit 81a) corresponding to the resistor groups of the first resistor group set 31a, the switching device (the second resistor-side relay unit 81b) corresponding to the resistor groups of the second resistor group set 31b, and the switching device (the third resistor-side relay unit 81c) corresponding to the resistor groups of the third resistor group set 31c is performed based on the operation state of at least one of the mode switch and the operation switch.

In addition, the on/off control of the switching device (the first reactor-side relay unit 82a) corresponding to the coils of the first coil group 61a, the switching device (the second reactor-side relay unit 82b) corresponding to the coils of the second coil group 61b, and the switching device (the third reactor-side relay unit 82c) corresponding to the coils of the third coil group 61c is performed based on the operation state of at least one of the mode switch and the operation switch.

Figure 11:
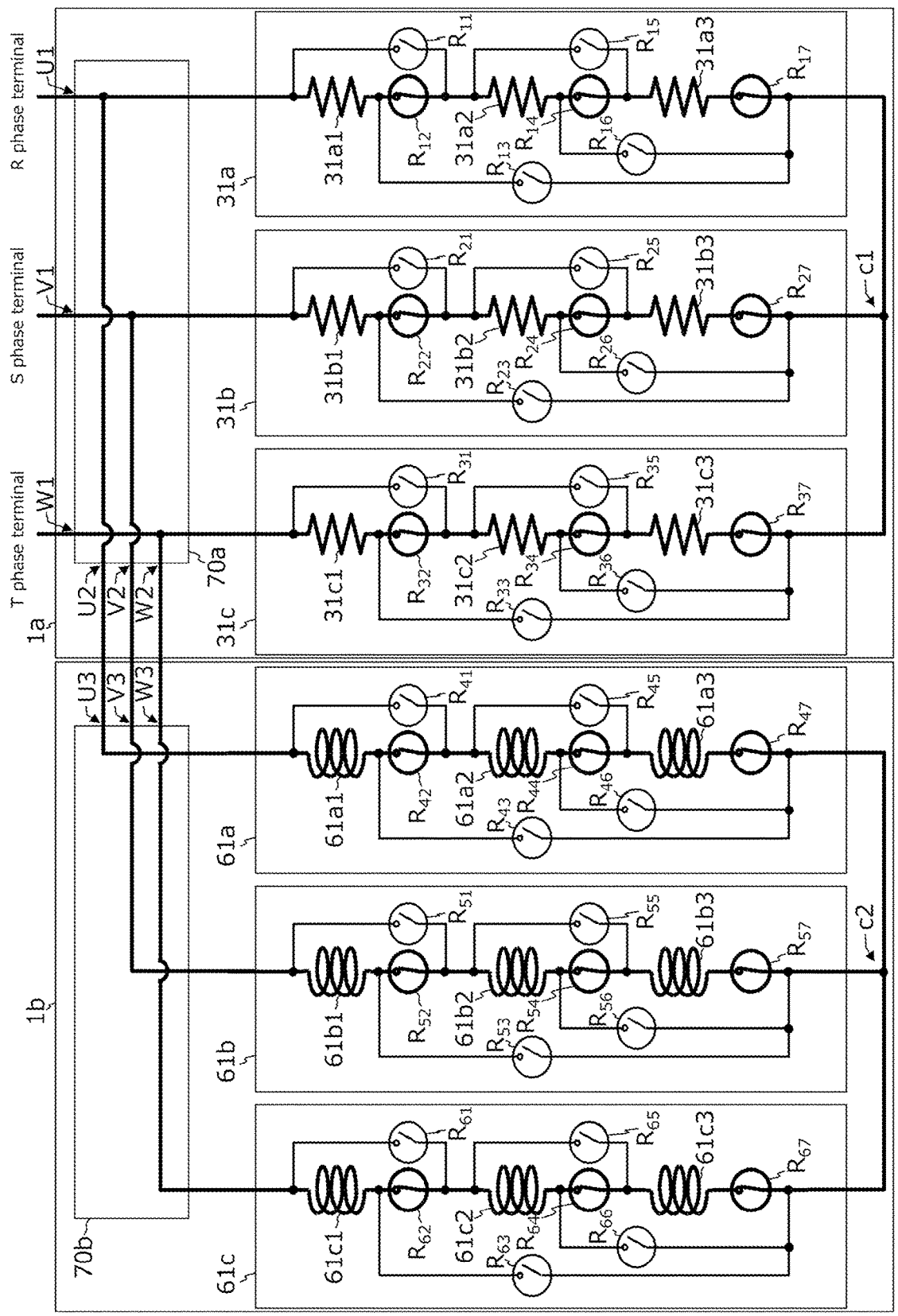
FIG. 11 is a schematic diagram illustrating on/off states of relays of a first resistor group set to a third resistor group set and a first coil group to a third coil group when a load test of a high-voltage test target power source is performed.

For example, when the test target power source is a high-voltage three-phase AC generator, on/off control of the switching device is performed such that the 11th resistor group 31a1, the 12th resistor group 31a2, and the 13th resistor group 31a3 in the first resistor group set 31a are connected in series, the 21st resistor group 31b1, the 22nd resistor group 31b2, and the 23rd resistor group 31b3 in the second resistor group set 31b are connected in series, and the 31st resistor group 31c1, the 32nd resistor group 31c2, and the 33rd resistor group 31c3 in the third resistor group set 31c are connected in series (see FIG. 11).

In addition, the on/off control of the switching device is performed such that the 11th coil 61a1, the 12th coil 61a2, and the 13th coil 61a3 of the first coil group 61a are connected in series, the 21st coil 61b1, the 22nd coil 61b2, and the 23rd coil 61b3 of the second coil group 61b are connected in series, and the 31st coil 61c1, the 32nd coil 61c2, and the 33rd coil 61c3 of the third coil group 61c are connected in series.

In this case, the 12th relay $R_{12}$, the 14th relay $R_{14}$, the 17th relay $R_{17}$, the 22nd relay $R_{22}$, the 24th relay $R_{24}$, the 27th relay $R_{27}$, the 32nd relay $R_{32}$, the 34th relay $R_{34}$, and the 37th relay $R_{37}$ are turned on, and the 11th relay $R_{11}$, the 13th relay $R_{13}$, the 15th relay $R_{15}$, the 16th relay $R_{16}$, the 21st relay $R_{21}$, the 23rd relay $R_{23}$, the 25th relay $R_{25}$, the 26th relay $R_{26}$, the 31st relay $R_{31}$, the 33rd relay $R_{33}$, the 35th relay $R_{35}$, and the 36th relay $R_{36}$ are turned off.

In addition, the 42nd relay $R_{42}$, the 44th relay $R_{44}$, the 47th relay $R_{47}$, the 52nd relay $R_{52}$, the 54th relay $R_{54}$, the 57th relay $R_{57}$, the 62nd relay $R_{62}$, the 64th relay $R_{64}$, and the 67th relay $R_{67}$ are turned on, and the 41st relay $R_{41}$, the 43rd relay $R_{43}$, the 45th relay $R_{45}$, the 46th relay $R_{46}$, the 51st relay $R_{51}$, the 53rd relay $R_{53}$, the 55th relay $R_{55}$, the 56th relay $R_{56}$, the 61st relay $R_{61}$, the 63rd relay $R_{63}$, the 65th relay $R_{65}$, and the 66th relay $R_{66}$ are turned off.

Figure 14:
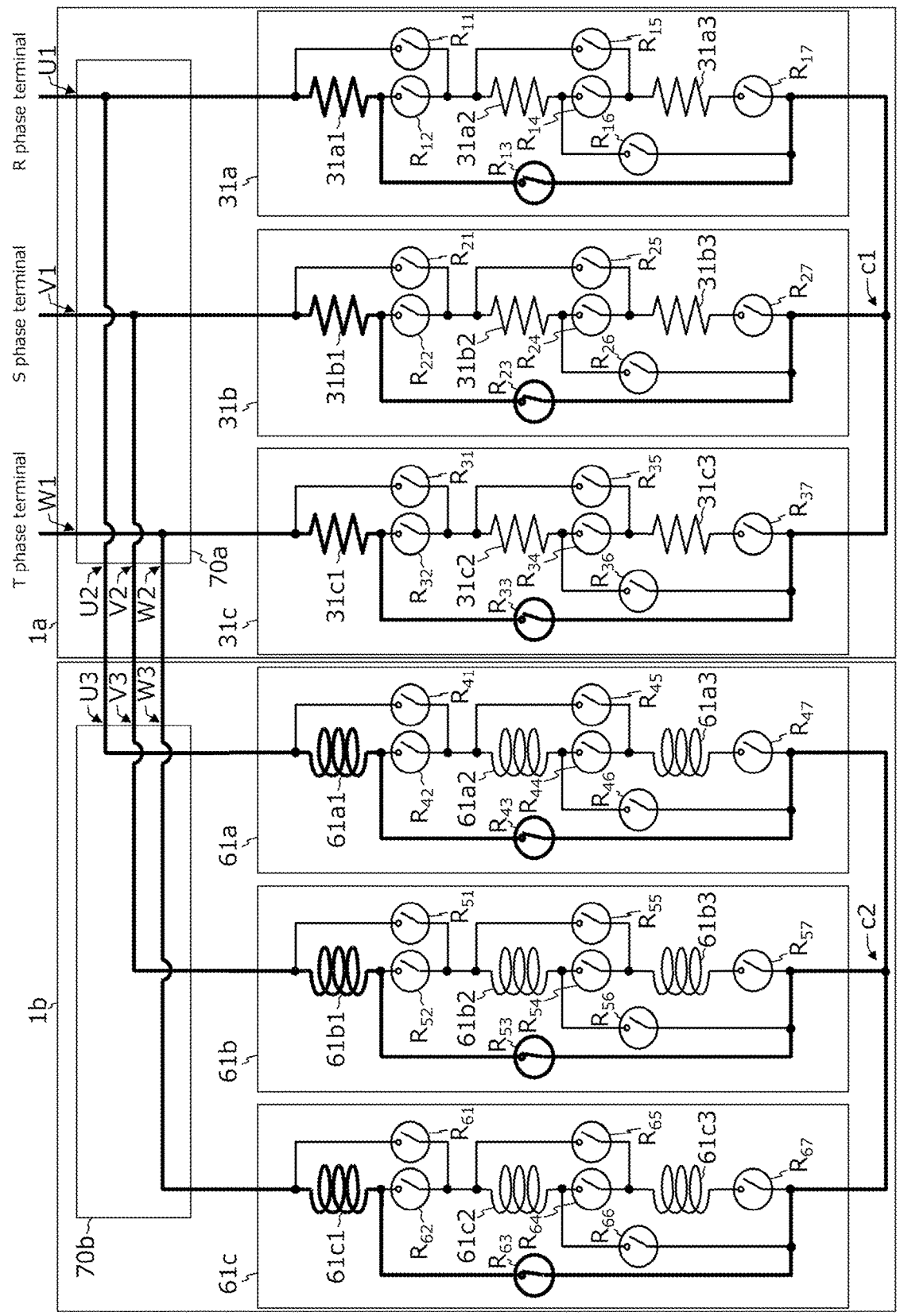
FIG. 14 is a schematic diagram illustrating on/off states of relays of a first resistor group set to a third resistor group set and a first coil group to a third coil group when a load test of a low-voltage test target power source is performed with a low load.
Figure 15:
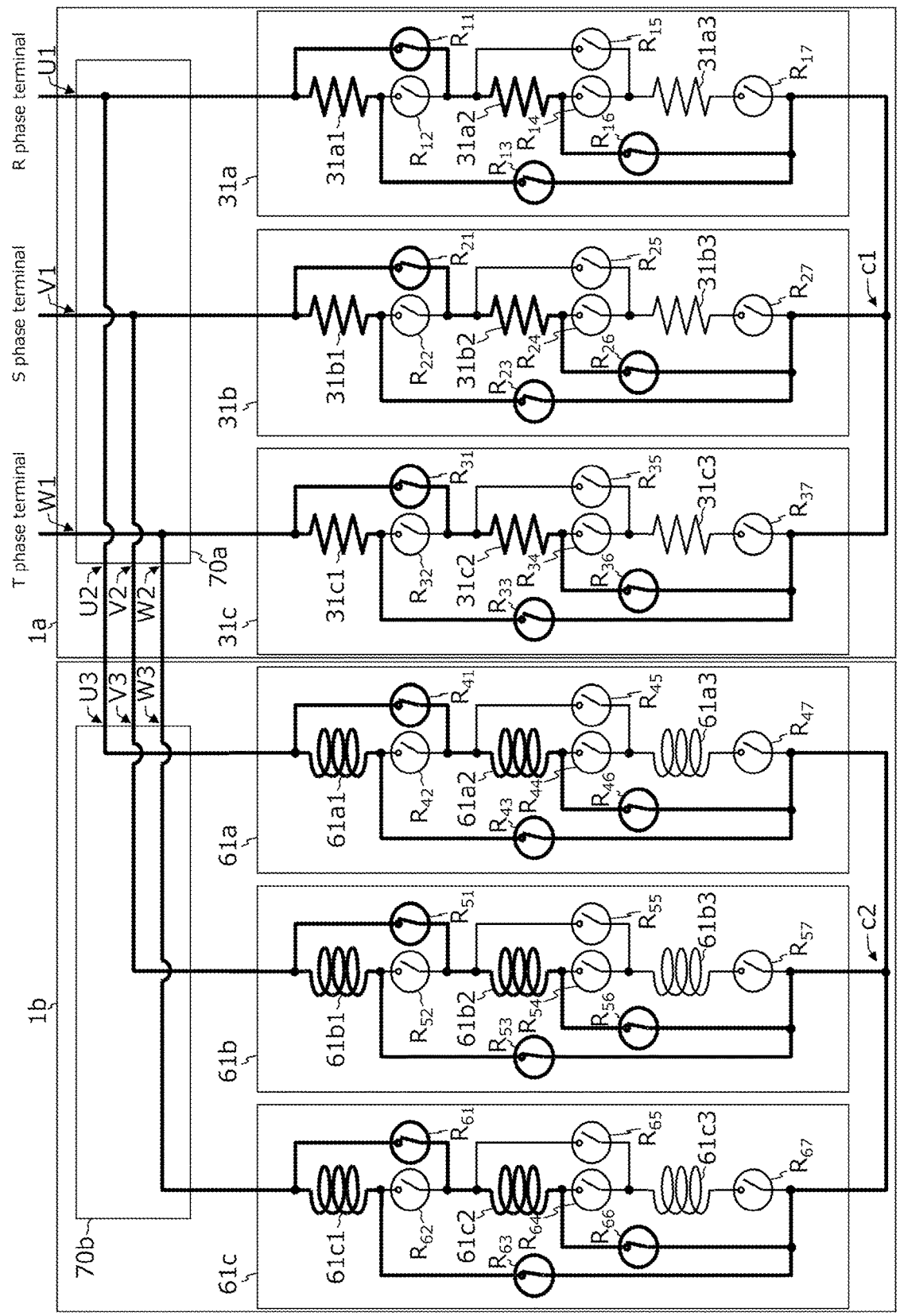
FIG. 15 is a schematic diagram illustrating on/off states of relays of a first resistor group set to a third resistor group set and a first coil group to a third coil group when a load test of the low-voltage test target power source is performed with a medium load.
Figure 16:
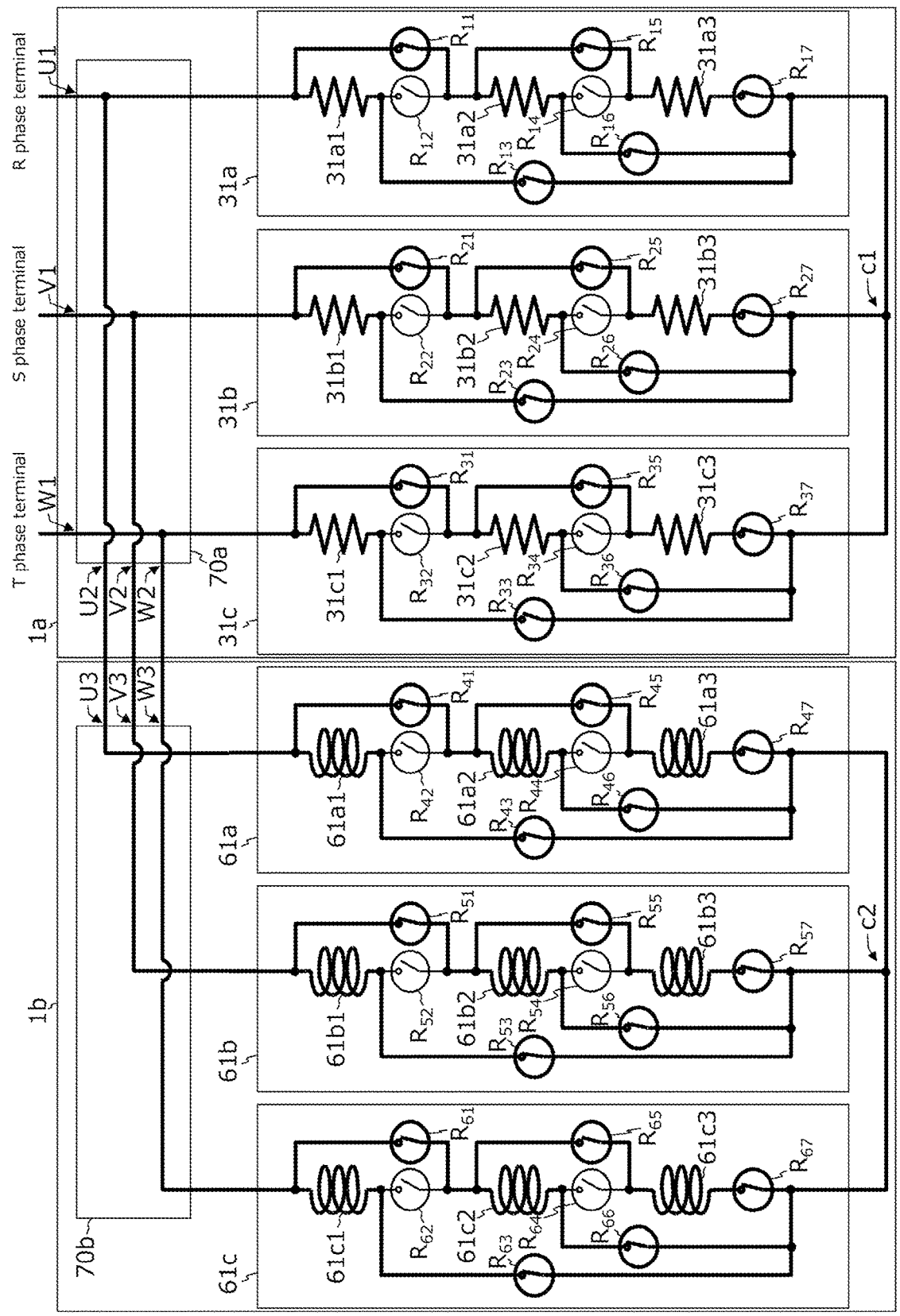
FIG. 16 is a schematic diagram illustrating on/off states of relays of a first resistor group set to a third resistor group set and a first coil group to a third coil group when a load test of the low-voltage test target power source is performed with a high load.

When the test target power source is a low-voltage three-phase AC generator, the on/off control of the switching device is performed such that the 11th resistor group 31a1, the 12th resistor group 31a2, and the 13th resistor group 31a3 in the first resistor group set 31a are connected in parallel, the 21st resistor group 31b1, the 22nd resistor group 31b2, and the 23rd resistor group 31b3 in the second resistor group set 31b are connected in parallel, and the 31st resistor group 31c1, the 32nd resistor group 31c2, and the 33rd resistor group 31c3 in the third resistor group set 31c are connected in parallel (see FIGS. 14 to 16).

In addition, the on/off control of the switching device is performed such that the 11th coil 61a1, the 12th coil 61a2, and the 13th coil 61a3 of the first coil group 61a are connected in parallel, the 21st coil 61b1, the 22nd coil 61b2, and the 23rd coil 61b3 of the second coil group 61b are connected in parallel, and the 31st coil 61c1, the 32nd coil 61c2, and the 33rd coil 61c3 of the third coil group 61c are connected in parallel.

In this case, the 12th relay $R_{12}$, the 14th relay $R_{14}$, the 22nd relay $R_{22}$, the 24th relay $R_{24}$, the 32nd relay $R_{32}$, and the 34th relay $R_{34}$ are turned off, and the 11th relay $R_{11}$, the 13th relay $R_{13}$, the 15th relay $R_{15}$, the 16th relay $R_{16}$, the 17th relay $R_{17}$, the 21st relay $R_{21}$, the 23rd relay $R_{23}$, the 25th relay $R_{25}$, the 26th relay $R_{26}$, the 27th relay $R_{27}$, the 31st relay $R_{31}$, the 33rd relay $R_{33}$, the 35th relay $R_{35}$, the 36th relay $R_{36}$, and the 37th relay $R_{37}$ are switched on and off according to the load set by the operation switch.

In this case, the 42nd relay $R_{42}$, the 44th relay $R_{44}$, the 52nd relay $R_{52}$, the 54th relay $R_{54}$, the 62nd relay $R_{62}$, and the 64th relay $R_{64}$ are turned off, and the 41st relay $R_{41}$, the 43rd relay $R_{43}$, the 45th relay $R_{45}$, the 46th relay $R_{46}$, the 47th relay $R_{47}$, the 51st relay $R_{51}$, the 53rd relay $R_{53}$, the 55th relay $R_{55}$, the 56th relay $R_{56}$, the 57th relay $R_{57}$, the 61st relay $R_{61}$, the 63rd relay $R_{63}$, the 65th relay $R_{65}$, the 66th relay $R_{66}$, and the 67th relay $R_{67}$ are switched on and off according to the load set by the operation switch.

Specifically, in the case of a low load, the 13th relay $R_{13}$, the 23rd relay $R_{23}$, and the 33rd relay $R_{33}$ are turned on, and the 11th relay $R_{11}$, the 15th relay $R_{13}$, the 16th relay $R_{16}$, the 17th relay $R_{17}$, the 21st relay $R_{21}$, the 25th relay $R_{25}$, the 26th relay $R_{26}$, the 27th relay $R_{27}$, the 31st relay $R_{31}$, the 35th relay $R_{35}$, the 36th relay $R_{36}$, and the 37th relay $R_{37}$ are turned off (see FIG. 14).

The 43rd relay $R_{43}$, the 53rd relay $R_{53}$, and the 63rd relay $R_{63}$ are turned on, and the 41st relay $R_{41}$, the 45th relay $R_{45}$, the 46th relay $R_{46}$, the 47th relay $R_{47}$, the 51st relay $R_{51}$, the 55th relay $R_{55}$, the 56th relay $R_{56}$, the 57th relay $R_{57}$, the 61st relay $R_{61}$, the 65th relay $R_{65}$, the 66th relay $R_{66}$, and the 67th relay $R_{67}$ are turned off.

In the case of a medium load having a load larger than the low load and smaller than a high load, the 11th relay $R_{11}$, the 13th relay $R_{13}$, the 16th relay $R_{16}$, the 21st relay $R_{21}$, the 23rd relay $R_{23}$, the 26th relay $R_{26}$, the 31st relay $R_{31}$, the 33rd relay $R_{33}$, and the 36th relay $R_{36}$ are turned on, and the 15th relay $R_{13}$, the 17th relay $R_{17}$, the 25th relay $R_{25}$, the 27th relay $R_{27}$, the 35th relay $R_{35}$, and the 37th relay $R_{37}$ are turned off (see FIG. 15).

In addition, the 41st relay $R_{41}$, the 43rd relay $R_{43}$, the 46th relay $R_{46}$, the 51st relay $R_{51}$, the 53rd relay $R_{53}$, the 56th relay $R_{56}$, the 61st relay $R_{61}$, the 63rd relay $R_{63}$, and the 66th relay $R_{66}$ are turned on, and the 45th relay $R_{43}$, the 47th relay $R_{47}$, the 55th relay $R_{55}$, the 57th relay $R_{57}$, the 65th relay $R_{65}$, and the 67th relay $R_{67}$ are turned off.

In the case of the high load, the 11th relay $R_{11}$, the 13th relay $R_{13}$, the 15th relay $R_{13}$, the 16th relay $R_{16}$, the 17th relay $R_{17}$, the 21st relay $R_{21}$, the 23rd relay $R_{23}$, the 25th relay $R_{25}$, the 26th relay $R_{26}$, the 27th relay $R_{27}$, the 31st relay $R_{31}$, the 33rd relay $R_{33}$, the 35th relay $R_{35}$, the 36th relay $R_{36}$, and the 37th relay $R_{37}$ are turned on (see FIG. 16).

In addition, the 41st relay $R_{41}$, the 43rd relay $R_{43}$, the 45th relay $R_{45}$, the 46th relay $R_{46}$, the 47th relay $R_{47}$, the 51st relay $R_{51}$, the 53rd relay $R_{53}$, the 55th relay $R_{55}$, the 56th relay $R_{56}$, the 57th relay $R_{57}$, the 61st relay $R_{61}$, the 63rd relay $R_{63}$, the 65th relay $R_{65}$, the 66th relay $R_{66}$, and the 67th relay $R_{67}$ are turned on.

(First Power Supply Terminal Unit 73)

The first power supply terminal unit 73 is a terminal for connecting a power source to be tested, and includes the first U-phase terminal U1, the first V-phase terminal V1, and the first W-phase terminal W1 used for connecting to the three-phase AC generator (see FIG. 3).

In the case of the load test of the three-phase AC generator, the cables from the R phase, the S phase, and the T phase of the three-phase AC generator are connected to the first U-phase terminal U1, the first V-phase terminal V1, and the first W-phase terminal W1, respectively.

The first power supply terminal unit 73 has the second U-phase terminal U2, the second V-phase terminal V2, and the second W-phase terminal W2 which are used to connect to the second power supply terminal unit 74 of the second load test section 1b.

(Second Power Supply Terminal Unit 74)

The second power supply terminal unit 74 has the third U-phase terminal U3, the third V-phase terminal V3, and the third W-phase terminal W3 which are used to connect to the first power supply terminal unit 73 of the first load test section 1a (see FIG. 5).

Power from the R-phase of the three-phase AC generator is supplied to the third reactor 60c in the second load test section 1b via the first U-phase terminal U1, the second U-phase terminal U2, and the third U-phase terminal U3.

Power from the S-phase of the three-phase AC generator is supplied to the second reactor 60b in the second load test section 1b via the first V-phase terminal V1, the second V-phase terminal V2, and the third V-phase terminal V3.

Power from the T-phase of the three-phase AC generator is supplied to the first reactor 60a in the second load test section 1b via the first W-phase terminal W1, the second W-phase terminal W2, and the third W-phase terminal W3.

(First Control Terminal Unit 75)

The first control terminal unit 75 has a terminal for connecting the control line 4 to the switching device (the first resistor-side relay unit 81a, second resistor-side relay unit 81b, and the third resistor-side relay unit 81c) of the resistor-side relay unit 81 (see FIG. 3).

When the first control terminal unit 75 is connected to the switching device (the first resistor-side relay unit 81a, the second resistor-side relay unit 81b, and the third resistor-side relay unit 81c) of the resistor-side relay unit 81 via the control line 4, on/off control of the first resistor-side relay unit 81a, the second resistor-side relay unit 81b, and the third resistor-side relay unit 81c is performed according to the on/off state of the operation switch.

When the mode switch is in the on state, some of the operation switches are turned on, and the other operation switches are turned off, among the switching devices of the first resistor-side relay unit 81a, the second resistor-side relay unit 81b, and the third resistor-side relay unit 81c, the switching devices corresponding to the turn-on operation is turned on, and the other switching devices are turned off.

At this time, when the cables from the R phase, the S phase, and the T phase of the three-phase AC generator are connected to the first U-phase terminal U1, the first V-phase terminal V1, and the first W-phase terminal W1, respectively, the current from the R phase of the three-phase AC generator is made to flow to the resistor group(s) corresponding to the mode switch and/or the turned-on operation switch in the resistor groups of the first resistor group set 31a, the current from the S phase of the three-phase AC generator is made to flow to the resistor group(s) corresponding to the mode switch and/or the turned-on operation switch in the resistor groups of the second resistor group set 31b, and the current from the T phase of the three-phase AC generator is made to flow to the resistor group(s) corresponding to the mode switch and/or the turned-on operation switch in the resistor groups of the third resistor group set 31c.

(Second Control Terminal Unit 76)

The second control terminal unit 76 has a terminal for connecting the control line 4 to the switching device (the first reactor-side relay unit 82a, the second reactor-side relay unit 82b, and the third reactor-side relay unit 82c) of the reactor-side relay unit 82 (see FIG. 5).

When the second control terminal unit 76 is connected to the switching device (the first reactor-side relay unit 82a, the second reactor-side relay unit 82b, and the third reactor-side relay unit 82c) of the reactor-side relay unit 82 via the control line 4, on/off control of the first reactor-side relay unit 82a, the second reactor-side relay unit 82b, and the third reactor-side relay unit 82c is performed according to the on/off state of the operation switch of the first operation unit 71.

When the mode switch is in the on state, some of the operation switches of the first operation unit 71 are turned on, and the other operation switches are turned off, the switching devices corresponding to the turned on operation switches among the switching devices of the first reactor-side relay unit 82a, the second reactor-side relay unit 82b, and the third reactor-side relay unit 82c are turned on, and the other switching devices are turned off.

At this time, when the cables from the R phase, the S phase, and the T phase of the three-phase AC generator are connected to the first U-phase terminal U1, the first V-phase terminal V1, and the first W-phase terminal W1, respectively, the cable from the second U-phase terminal U2 is connected to the third U-phase terminal U3, the cable from the second V-phase terminal V2 is connected to the third V-phase terminal V3, and the cable from the second W-phase terminal W2 is connected to the third W-phase terminal W3, the current from the S phase of the three-phase AC generator is made to flow to the coil(s) corresponding to the mode switch and/or the turned-on operation switch in the coils of the first coil group 61a, the current from the R phase of the three-phase AC generator is made to flow to the coil(s) corresponding to the mode switch and/or the turned-on operation switch in the coils of the second coil group 61b, and the current from the T phase of the three-phase AC generator is made to flow to the coil(s) corresponding to the mode switch and/or the turned-on operation switch in the coils of the third coil group 61c.

(First Power Supply Control Unit 77)

The first power supply control unit 77 is a device that controls power supply from the test target power source to the first resistor unit 30a to the third resistor unit 30c according to the on/off states of the mode switch and the fan switch, such as a vacuum circuit breaker. The first power supply control unit 77 cuts off power supply when at least one of the mode switch and the fan switch is in an off state.

Specifically, the first power supply control unit 77 is disposed on a line extending from the first U-phase terminal U1 to the resistor of the first resistor group set 31a, a line extending from the first V-phase terminal V1 to the resistor of the second resistor group set 31b, and a line extending from the first W-phase terminal W1 to the resistor of the third resistor group set 31c, and cuts off these three lines via a relay (not illustrated) when at least one of the mode switch and the fan switch is turned off.

(Second Power Supply Control Unit 78)

The second power supply control unit 78 is a device that controls power supply from the test target power source to the first reactor 60a to the third reactor 60c according to the on/off state of the mode switch and the fan switch of the first operation unit 71 and the on/off state of the on/off switch of the second operation unit 72, such as a vacuum circuit breaker. The second power supply control unit 78 cuts off power supply when at least one of the mode switch and the fan switch of the first operation unit 71 and the on/off switch of the second operation unit 72 is in an off state.

Specifically, the second power supply control unit 78 is arranged on a line extending from the third U-phase terminal U3 to the coil of the first coil group 61a, a line extending from the third V-phase terminal V3 to the coil of the second coil group 61b, and a line extending from the third W-phase terminal W3 to the coil of the third coil group 61c, and cuts off these three lines when at least one of the mode switch and the fan switch of the first operation unit 71 and the on/off switch of the second operation unit 72 is turned off via a relay (not illustrated).

(Connection Between Resistor-Side Relay Unit 81 and First Load Test Control Unit 70a)

The first resistor-side relay unit 81a (the 11th relay $R_{11}$, the 12th relay $R_{12}$, the 13th relay $R_{13}$, the 14th relay $R_{14}$, the 15th relay $R_{15}$, the 16th relay $R_{16}$, and the 17th relay $R_{17}$) is connected to the first control terminal unit 75 of the first load test control unit 70a via the control line 4. The on/off control of the first resistor-side relay unit 81a is performed in response to the operation of the mode switch and the operation switch of the first operation unit 71 of the first load test control unit 70a.

The second resistor-side relay unit 81b (the 21st relay $R_{21}$, the 22nd relay $R_{22}$, the 23rd relay $R_{23}$, the 24th relay $R_{24}$, the 25th relay $R_{25}$, the 26th relay $R_{26}$, and the 27th relay $R_{27}$) is connected to the first control terminal unit 75 of the first load test control unit 70a via the control line 4. The on/off control of the second resistor-side relay unit 81b is performed in response to the operation of the mode switch and the operation switch of the first operation unit 71 of the first load test control unit 70a.

The third resistor-side relay unit 81c (the 31st relay $R_{31}$, the 32nd relay $R_{32}$, the 33rd relay $R_{33}$, the 34th relay $R_{34}$, the 35th relay $R_{35}$, the 36th relay $R_{36}$, and the 37th relay $R_{37}$) is connected to the first control terminal unit 75 of the first load test control unit 70a via the control line 4. The on/off control of the third resistor-side relay unit 81c is performed in response to the operation of the mode switch and the operation switch of the first operation unit 71 of the first load test control unit 70a.

(Connection Between Reactor-Side Relay Unit 82 and Second Load Test Control Unit 70b)

The first reactor-side relay unit 82a (the 41st relay $R_{41}$, the 42nd relay $R_{42}$, the 43rd relay $R_{43}$, the 44th relay $R_{44}$, the 45th relay $R_{45}$, the 46th relay $R_{46}$, and the 47th relay $R_{47}$) is connected to the second control terminal unit 76 of the second load test control unit 70b via the control line 4. The on/off control of the first reactor-side relay unit 82a is performed in response to the operation of the mode switch and the operation switch of the first operation unit 71 of the first load test control unit 70a.

The second reactor-side relay unit 82b (the 51st relay $R_{51}$, the 52nd relay $R_{52}$, the 53rd relay $R_{53}$, the 54th relay $R_{54}$, the 55th relay $R_{55}$, the 56th relay $R_{56}$, and the 57th relay $R_{37}$) is connected to the second control terminal unit 76 of the second load test control unit 70b via the control line 4. The on/off control of the second reactor-side relay unit 82b is performed in response to the operation of the mode switch and the operation switch of the first operation unit 71 of the first load test control unit 70a.

The third reactor-side relay unit 82c (the 61st relay $R_{61}$, the 62nd relay $R_{62}$, the 63rd relay $R_{63}$, the 64th relay $R_{64}$, the 65th relay $R_{65}$, the 66th relay $R_{66}$, and the 67th relay $R_{67}$) is connected to the second control terminal unit 76 of the second load test control unit 70b via the control line 4. The on/off control of the third reactor-side relay unit 82c is performed in response to the operation of the mode switch and the operation switch of the first operation unit 71 of the first load test control unit 70a.

(First Air Circulation Unit 90a)

A configuration of the first air circulation unit 90a will be described.

Among the first air circulation unit 90a, the first power generation unit 91a, the first control unit 93a, the first intake unit 95a, the first air blowing unit 96a, and the first exhaust unit 97a are provided in the first housing 2a.

Among the first air circulation unit 90a, the second power generation unit 91b, the second control unit 93b, the second intake unit 95b, the second air blowing unit 96b, and the second exhaust unit 97b are provided in the second housing 2b.

Among the first air circulation unit 90a, the third power generation unit 91c, the third control unit 93c, the third intake unit 95c, the third air blowing unit 96c, and the third exhaust unit 97c are provided in the third housing 2c.

Among the first air circulation unit 90a, the fourth power generation unit 91d, the fourth control unit 93d, the fourth intake unit 95d, the fourth air blowing unit 96d, and the fourth exhaust unit 97d are provided in the fourth housing 2d.

As described later, the electric devices of the first air circulation unit 90a such as the first power generation unit 91a are different systems from the first load test unit to the third load test unit, and are not electrically connected.

However, the on/off state of the first air blowing unit 96a and the like may be linked with the on/off state of the mode switch of the first operation unit 71 so that the first air blowing unit 96a and the like of the first air circulation unit 90a do not operate when the first load test unit to the third load test unit of the load testing device 1 are used.

Specifically, when the mode switch of the first operation unit 71 is in an off state, the first control unit 93a to the fourth control unit 93d, the first intake unit 95a to the fourth intake unit 95d, the first air blowing unit 96a to the fourth air blowing unit 96d, and the first exhaust unit 97a to the fourth exhaust unit 97d are brought into an operable state.

Further, when the mode switch of the first operation unit 71 is in an on state, the first control unit 93a to the fourth control unit 93d, the first intake unit 95a to the fourth intake unit 95d, the first air blowing unit 96a to the fourth air blowing unit 96d, and the first exhaust unit 97a to the fourth exhaust unit 97d are brought into an off state.

Detection of the on/off state of the mode switch of the first operation unit 71 is performed by vibration detection by sensors included in the first control unit 93a to the fourth control unit 93d. For example, when the first control unit 93a detects that the first load test unit is in the off state, the first air blowing unit 96a operates based on information on the inside the first housing 2a or the like.

The on/off state of the mode switch of the first operation unit 71 may be detected by electrical connection between the first operation unit 71 and the first control unit 93a or the like.

(First Power Generation Unit 91a)

The first power generation unit 91a is a power generator that converts light such as sunlight into electricity.

The first power generation unit 91a is provided on the upper surface of the first exhaust lid 33a of the first housing 2a.

However, the first exhaust lid 33a may be omitted, and the first power generation unit 91a may be used as the lid of the first upper-surface opening 2a1 of the first housing 2a.

The first power generation unit 91a supplies power obtained by power generation to the first control unit 93a, the first intake unit 95a, the first air blowing unit 96a, and the first exhaust unit 97a.

The first control unit 93a or the like may have a power storage device such as a battery that stores electric power obtained by power generation.

(First Control Unit 93a)

The first control unit 93a includes a sensor that detects information (temperature, humidity, amount of dust particles, concentration of specific gas, vibration, etc.) inside the first housing 2a.

According to the present embodiment, the first intake unit 95a, the first air blowing unit 96a, and the first exhaust unit 97a operate based on the information obtained by the first control unit 93a. Specifically, when the temperature inside the first housing 2a obtained by the first control unit 93a is higher than or equal to a temperature threshold, when the humidity inside the first housing 2a is higher than or equal to a humidity threshold, when the amount of particles of dust inside the first housing 2a is larger than or equal to a particle amount threshold, or when the concentration of a specific gas inside the first housing 2a is higher than or equal to a gas concentration threshold, the first intake unit 95a, the first air blowing unit 96a, and the first exhaust unit 97a operate.

(Operation Based on Other Information)

The first intake unit 95a, the first air blowing unit 96a, and the first exhaust unit 97a may operate based on other information in addition to the information obtained by the sensor of the first control unit 93a or instead of the information obtained by the sensor of the first control unit 93a.

For example, the first intake unit 95a, the first air blowing unit 96a, and the first exhaust unit 97a may operate based on time information. In this case, the first control unit 93a is provided with a battery and a timer for measuring time information. At predetermined time and date or at predetermined time intervals, the first control unit 93a operates the first intake unit 95a, the first air blowing unit 96a, and the first exhaust unit 97a.

The first intake unit 95a, the first air blowing unit 96a, and the first exhaust unit 97a may operate based on information on the surroundings of the first housing 2a (temperature, humidity, amount of dust particles, concentration of specific gas, and the like outside first load test section 1a).

(Information Transmission by Communication Unit)

In addition, the first control unit 93a may include a communication unit that transmits information to an external device, and said communication unit may transmit warning information to the external device when the temperature information continues to be higher than or equal to the temperature threshold or the humidity information continues to be higher than or equal to the humidity threshold even after a predetermined time has elapsed since the first intake unit 95a, the first air blowing unit 96a, and the first exhaust unit 97a operate.

(First Intake Unit 95a)

The first intake unit 95a is provided in an intake opening for the inactive period (the first inactive-period intake opening 2a3) in the back surface of the first housing 2a.

The first intake unit 95a includes an opening and closing door such as a louver, and opens and closes the first inactive-period intake opening 2a3.

When the load test is performed, that is, when those in the first load test section 1a of the first load test unit are used, the first intake unit 95a is closed so that air cannot flow in from the first inactive-period intake opening 2a3 of the first housing 2a (see FIG. 6).

When the load test is not performed, that is, when those in the first load test section 1a of the first load test unit are not used, the first intake unit 95a is opened so that air can flow in from the first inactive-period intake opening 2a3 of the first housing 2a (see FIG. 7).

The first intake unit 95a is electrically opened and closed. However, the opening and closing door of the first intake unit 95a may be biased to be in the closed state by the bias, and may be in the open state by the wind of the first air blowing unit 96a.

(First Air Blowing Unit 96a)

The first air blowing unit 96a includes a blower that discharges air, such as a fan, and sends the air taken in through the first inactive-period intake opening 2a3 into the first housing 2a.

The air sent by the first air blowing unit 96a passes through the inside of the first housing 2a and is discharged from the first inactive-period exhaust opening 2a4 (see thick arrow lines in FIGS. 7 and 8).

The first air blowing unit 96a is preferably provided in the vicinity of the first intake unit 95a, but may be provided in another place, for example, in the vicinity of the first exhaust unit 97a.

(First Exhaust Unit 97a)

The first exhaust unit 97a includes an opening and closing door such as a louver, and opens and closes the first inactive-period exhaust opening 2a4.

When the load test is performed, that is, when those in the first load test section 1a of the first load test unit are used, the first exhaust unit 97a is closed so that air cannot be discharged from the first inactive-period exhaust opening 2a4 of the first housing 2a.

When the load test is not performed, that is, when those in the first load test section 1a of the first load test unit are not used, the first exhaust unit 97a is opened so that air can be discharged from the first inactive-period exhaust opening 2a4 of the first housing 2a (see FIG. 8).

The first exhaust unit 97a is electrically opened and closed. However, the opening and closing door of the first exhaust unit 97a may be biased to be in the closed state by the bias, and may be in the open state by the wind of the first air blowing unit 96a.

(Second Power Generation Unit 91b)

The second power generation unit 91b is a power generator that converts light such as sunlight into electricity.

The second power generation unit 91b is provided on the upper surface of the second exhaust lid 33b of the second housing 2b.

However, the second exhaust lid 33b may be omitted, and the second power generation unit 91b may be used as the lid of the second upper-surface opening 2b1 of the second housing 2b.

The second power generation unit 91b supplies power obtained by power generation to the second control unit 93b, the second intake unit 95b, the second air blowing unit 96b, and the second exhaust unit 97b.

The second control unit 93b or the like may have a power storage device such as a battery that stores electric power obtained by power generation.

(Second Control Unit 93b)

The second control unit 93b includes a sensor that detects information (temperature, humidity, amount of dust particles, concentration of specific gas, vibration, etc.) on the inside the second housing 2b.

According to the present embodiment, the second intake unit 95b, the second air blowing unit 96b, and the second exhaust unit 97b operate based on the information obtained by the second control unit 93b. Specifically, when the temperature inside the second housing 2b obtained by the second control unit 93b is higher than or equal to the temperature threshold, when the humidity inside the second housing 2b is higher than or equal to the humidity threshold, when the amount of particles of dust inside the second housing 2b is larger than or equal to the particle amount threshold, or when the concentration of a specific gas inside the second housing 2b is higher than or equal to the gas concentration threshold, the second intake unit 95b, the second air blowing unit 96b, and the second exhaust unit 97b operate.

(Operation Based on Other Information)

The second intake unit 95b, the second air blowing unit 96b, and the second exhaust unit 97b may operate based on other information in addition to the information obtained by the sensor of the second control unit 93b or instead of the information obtained by the sensor of the second control unit 93b.

For example, the second intake unit 95b, the second air blowing unit 96b, and the second exhaust unit 97b may operate based on time information. In this case, the second control unit 93b is provided with a battery and a timer for measuring time information. At the predetermined time and date or at the predetermined time intervals, the second control unit 93b operates the second intake unit 95b, the second air blowing unit 96b, and the second exhaust unit 97b.

The second intake unit 95b, the second air blowing unit 96b, and the second exhaust unit 97b may operate based on information on the surroundings of the second housing 2b (temperature, humidity, amount of dust particles, concentration of specific gas, and the like outside first load test section 1a).

(Information Transmission by Communication Unit)

In addition, the second control unit 93b may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the second intake unit 95b, the second air blowing unit 96b, and the second exhaust unit 97b operate.

(Second Intake Unit 95b)

The second intake unit 95b is provided in an intake opening for the inactive period (the second inactive-period intake opening 2b3) in the back surface of the second housing 2b.

The second intake unit 95b includes an opening and closing door such as a louver, and opens and closes the second inactive-period intake opening 2b3.

When the load test is performed, that is, when those in the first load test section 1a of the second load test unit are used, the second intake unit 95b is closed so that air cannot flow in from the second inactive-period intake opening 2b3 of the second housing 2b (see FIG. 6).

When the load test is not performed, that is, when those in the first load test section 1a of the second load test unit are not used, the second intake unit 95b is opened so that air can flow in from the second inactive-period intake opening 2b3 of the second housing 2b (see FIG. 7).

The second intake unit 95b is electrically opened and closed. However, the opening and closing door of the second intake unit 95b may be biased to be in the closed state by the bias, and may be in the open state by the wind of the second air blowing unit 96b.

(Second Air Blowing Unit 96b)

The second air blowing unit 96b includes a blower that discharges air, such as a fan, and sends the air taken in through the second inactive-period intake opening 2b3 into the second housing 2b.

The air sent by the second air blowing unit 96b passes through the inside of the second housing 2b and is discharged from the second inactive-period exhaust opening 2b4 (see thick arrow lines in FIGS. 7 and 8).

The second air blowing unit 96b is preferably provided in the vicinity of the second intake unit 95b, but may be provided in another place, for example, in the vicinity of the second exhaust unit 97b.

(Second Exhaust Unit 97b)

The second exhaust unit 97b includes an opening and closing door such as a louver, and opens and closes the second inactive-period exhaust opening 2b4.

When the load test is performed, that is, when those in the first load test section 1a of the second load test unit are used, the second exhaust unit 97b is closed so that air cannot be discharged from the second inactive-period exhaust opening 2b4 of the second housing 2b.

When the load test is not performed, that is, when those in the first load test section 1a of the second load test unit are not used, the second exhaust unit 97b is opened so that air can be discharged from the second inactive-period exhaust opening 2b4 of the second housing 2b (see FIG. 8).

The second exhaust unit 97b is electrically opened and closed. However, the opening and closing door of the second exhaust unit 97b may be biased to be in the closed state by the bias, and may be in the open state by the wind of the second air blowing unit 96b.

(Third Power Generation Unit 91c)

The third power generation unit 91c is a power generator that converts light such as sunlight into electricity.

The third power generation unit 91c is provided on the upper surface of the third exhaust lid 33c of the third housing 2c.

However, the third exhaust lid 33c may be omitted, and the third power generation unit 91c may be used as the lid of the third upper-surface opening 2c1 of the third housing 2c.

The third power generation unit 91c supplies power obtained by power generation to the third control unit 93c, the third intake unit 95c, the third air blowing unit 96c, and the third exhaust unit 97c.

The third control unit 93c or the like may have a power storage device such as a battery that stores electric power obtained by power generation.

(Third Control Unit 93c)

The third control unit 93c includes a sensor that detects information (temperature, humidity, amount of dust particles, concentration of specific gas, vibration, etc.) on the inside the third housing 2c.

According to the present embodiment, the third intake unit 95c, the third air blowing unit 96c, and the third exhaust unit 97c operate based on the information obtained by the third control unit 93c. Specifically, when the temperature inside the third housing 2c obtained by the third control unit 93c is higher than or equal to the temperature threshold, when the humidity inside the third housing 2c is higher than or equal to the humidity threshold, when the amount of particles of dust inside the third housing 2c is larger than or equal to the particle amount threshold, or when the concentration of a specific gas inside the third housing 2c is higher than or equal to the gas concentration threshold, the third intake unit 95c, the third air blowing unit 96c, and the third exhaust unit 97c operate.

(Operation Based on Other Information)

The third intake unit 95c, the third air blowing unit 96c, and the third exhaust unit 97c may operate based on other information in addition to the information obtained by the sensor of the third control unit 93c or instead of the information obtained by the sensor of the third control unit 93c.

For example, the third intake unit 95c, the third air blowing unit 96c, and the third exhaust unit 97c may operate based on time information. In this case, the third control unit 93c is provided with a battery and a timer for measuring time information. At the predetermined time and date or at the predetermined time intervals, the third control unit 93c operates the third intake unit 95c, the third air blowing unit 96c, and the third exhaust unit 97c.

The third intake unit 95c, the third air blowing unit 96c, and the third exhaust unit 97c may operate based on information on the surroundings of the third housing 2c (temperature, humidity, amount of dust particles, concentration of specific gas, and the like outside first load test section 1a).

(Information Transmission by Communication Unit)

In addition, the third control unit 93c may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the third intake unit 95c, the third air blowing unit 96c, and the third exhaust unit 97c operate.

(Third Intake Unit 95c)

The third intake unit 95c is provided in an intake opening for the inactive period (the third inactive-period intake opening 2c3) in the back surface of the third housing 2c.

The third intake unit 95c includes an opening and closing door such as a louver, and opens and closes the third inactive-period intake opening 2c3.

When the load test is performed, that is, when those in the first load test section 1a of the third load test unit are used, the third intake unit 95c is closed so that air cannot flow in from the third inactive-period intake opening 2c3 of the third housing 2c (see FIG. 6).

When the load test is not performed, that is, when those in the first load test section 1a of the third load test unit are not used, the third intake unit 95c is opened so that air can flow in from the third inactive-period intake opening 2c3 of the third housing 2c (see FIG. 7).

The third intake unit 95c is electrically opened and closed. However, the opening and closing door of the third intake unit 95c may be biased to be in the closed state by the bias, and may be in the open state by the wind of the third air blowing unit 96c.

(Third Air Blowing Unit 96c)

The third air blowing unit 96c includes a blower that discharges air, such as a fan, and sends the air taken in through the third inactive-period intake opening 2c3 into the third housing 2c.

The air sent by the third air blowing unit 96c passes through the inside of the third housing 2c and is discharged from the third inactive-period exhaust opening 2c4 (see thick arrow lines in FIGS. 7 and 8).

The third air blowing unit 96c is preferably provided in the vicinity of the third intake unit 95c, but may be provided in another place, for example, in the vicinity of the third exhaust unit 97c.

(Third Exhaust Unit 97c)

The third exhaust unit 97c includes an opening and closing door such as a louver, and opens and closes the third inactive-period exhaust opening 2c4.

When the load test is performed, that is, when those in the first load test section 1a of the third load test unit are used, the third exhaust unit 97c is closed so that air cannot be discharged from the third inactive-period exhaust opening 2c4 of the third housing 2c.

When the load test is not performed, that is, when those in the first load test section 1a of the third load test unit are not used, the third exhaust unit 97c is opened so that air can be discharged from the third inactive-period exhaust opening 2c4 of the third housing 2c (see FIG. 8).

The third exhaust unit 97c is electrically opened and closed. However, the opening and closing door of the third exhaust unit 97c may be biased to be in the closed state by the bias, and may be in the open state by the wind of the third air blowing unit 96c.

(Fourth Power Generation Unit 91d)

The fourth power generation unit 91d is a power generator that converts light such as sunlight into electricity.

The fourth power generation unit 91d is provided on the upper surface of the fourth housing 2d.

The fourth power generation unit 91d supplies power obtained by power generation to the fourth control unit 93d, the fourth intake unit 95d, the fourth air blowing unit 96d, and the fourth exhaust unit 97d.

The fourth control unit 93d or the like may have a power storage device such as a battery that stores electric power obtained by power generation.

(Fourth Control Unit 93d)

The fourth control unit 93d includes a sensor that detects information (temperature, humidity, amount of dust particles, concentration of specific gas, vibration, etc.) on the inside the fourth housing 2d.

According to the present embodiment, the fourth intake unit 95d, the fourth air blowing unit 96d, and the fourth exhaust unit 97d operate based on the information obtained by the fourth control unit 93d. Specifically, when the temperature inside the fourth housing 2d obtained by the fourth control unit 93d is higher than or equal to the temperature threshold, when the humidity inside the fourth housing 2d is higher than or equal to the humidity threshold, when the amount of particles of dust inside the fourth housing 2d is larger than or equal to the particle amount threshold, or when the concentration of a specific gas inside the fourth housing 2d is higher than or equal to the gas concentration threshold, the fourth intake unit 95d, the fourth air blowing unit 96d, and the fourth exhaust unit 97d operate.

(Operation Based on Other Information)

The fourth intake unit 95d, the fourth air blowing unit 96d, and the fourth exhaust unit 97d may operate based on other information in addition to the information obtained by the sensor of the fourth control unit 93d or instead of the information obtained by the sensor of the fourth control unit 93d.

For example, the fourth intake unit 95d, the fourth air blowing unit 96d, and the fourth exhaust unit 97d may operate based on time information. In this case, the fourth control unit 93d is provided with a battery and a timer for measuring time information. At the predetermined time and date or at the predetermined time intervals, the fourth control unit 93d operates the fourth intake unit 95d, the fourth air blowing unit 96d, and the fourth exhaust unit 97d.

The fourth intake unit 95d, the fourth air blowing unit 96d, and the fourth exhaust unit 97d may operate based on information on the surroundings of the fourth housing 2d (temperature, humidity, amount of dust particles, concentration of specific gas, and the like outside first load test section 1a).

(Information Transmission by Communication Unit)

In addition, the fourth control unit 93d may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the fourth intake unit 95d, the fourth air blowing unit 96d, and the fourth exhaust unit 97d operate.

(Fourth Intake Unit 95d)

The fourth intake unit 95d is provided in an intake opening for the inactive period (the fourth inactive-period intake opening 2d3) in the back surface of the fourth housing 2d.

The fourth intake unit 95d includes an opening and closing door such as a louver, and opens and closes the fourth inactive-period intake opening 2d3.

When the load test is performed, that is, when at least one of those in the first load test section 1a of the first load test unit to the third load test unit is used, the fourth intake unit 95d is closed so that air cannot flow in from the fourth inactive-period intake opening 2d3 of the fourth housing 2d (see FIG. 6).

When the load test is not performed, that is, when those in the first load test section 1a of the first load test unit to the third load test unit are not used, the fourth intake unit 95d is opened so that air can flow in from the fourth inactive-period intake opening 2d3 of the fourth housing 2d (see FIG. 7).

The fourth intake unit 95d is electrically opened and closed. However, the opening and closing door of the fourth intake unit 95d may be biased to be in the closed state by the bias, and may be in the open state by the wind of the fourth air blowing unit 96d.

(Fourth Air Blowing Unit 96d)

The fourth air blowing unit 96d includes a blower that discharges air, such as a fan, and sends the air taken in through the fourth inactive-period intake opening 2d3 into the fourth housing 2d.

The air sent by the fourth air blowing unit 96d passes through the inside of the fourth housing 2d and is discharged from the fourth inactive-period exhaust opening 2d4 (see thick arrow lines in FIGS. 7 and 8).

The fourth air blowing unit 96d is preferably provided in the vicinity of the fourth intake unit 95d, but may be provided in another place, for example, in the vicinity of the fourth exhaust unit 97d.

(Fourth Exhaust Unit 97d)

The fourth exhaust unit 97d includes an opening and closing door such as a louver, and opens and closes the fourth inactive-period exhaust opening 2d4.

When the load test is performed, that is, when at least one of those in the first load test section 1a of the first load test unit to the third load test unit is used, the fourth exhaust unit 97d is closed so that air cannot be discharged from the fourth inactive-period exhaust opening 2d4 of the fourth housing 2d.

When the load test is not performed, that is, when those in the first load test section 1a of the first load test unit to the third load test unit are not used, the fourth exhaust unit 97d is opened so that air can be discharged from the fourth inactive-period exhaust opening 2d4 of the fourth housing 2d (see FIG. 8).

The fourth exhaust unit 97d is electrically opened and closed. However, the opening and closing door of the fourth exhaust unit 97d may be biased to be in the closed state by the bias, and may be in the open state by the wind of the fourth air blowing unit 96d.

(Second Air Circulation Unit 90b)

A configuration of the second air circulation unit 90b will be described.

Among the second air circulation unit 90b, the fifth power generation unit 91e, the fifth control unit 93e, the fifth intake unit 95e, the fifth air blowing unit 96e, and the fifth exhaust unit 97e are provided in the fifth housing 2e.

Among the second air circulation unit 90b, the sixth power generation unit 91f, the sixth control unit 93f, the sixth intake unit 95f, the sixth air blowing unit 96f, and the sixth exhaust unit 97f are provided in the sixth housing 2f.

Among the second air circulation unit 90b, the seventh power generation unit 91g, the seventh control unit 93g, the seventh intake unit 95g, the seventh air blowing unit 96g, and the seventh exhaust unit 97g are provided in the seventh housing 2g.

Among the second air circulation unit 90b, the eighth power generation unit 91h, the eighth control unit 93h, the eighth intake unit 95h, the eighth air blowing unit 96h, and the eighth exhaust unit 97h are provided in the eighth housing 2h.

As described later, the electric devices of the second air circulation unit 90b such as the fifth power generation unit 91e are different systems from the first load test unit to the third load test unit, and are not electrically connected.

However, the on/off state of the fifth air blowing unit 96e and the like may be linked with the on/off state of the on/off switch of the second operation unit 72 so that the fifth air blowing unit 96e and the like of the second air circulation unit 90b do not operate when the first load test unit to the third load test unit of the load testing device 1 are used.

Specifically, when the on/off switch of the second operation unit 72 is in an off state, the fifth control unit 93e to the eighth control unit 93h, the fifth intake unit 95e to the eighth intake unit 95h, the fifth air blowing unit 96e to the eighth air blowing unit 96h, and the fifth exhaust unit 97e to the eighth exhaust unit 97h are brought into an operable state.

Further, when the on/off switch of the second operation unit 72 is in an on state, the fifth control unit 93e to the eighth control unit 93h, the fifth intake unit 95e to the eighth intake unit 95h, the fifth air blowing unit 96e to the eighth air blowing unit 96h, and the fifth exhaust unit 97e to the eighth exhaust unit 97h are brought into an off state.

Detection of the on/off state of the on/off switch of the second operation unit 72 is performed by vibration detection by sensors included in the fifth control unit 93e to the eighth control unit 93h. For example, when the fifth control unit 93e detects that the first load test unit is in the off state, the fifth air blowing unit 96e operates based on information on the inside the fifth housing 2e or the like.

The on/off state of the on/off switch of the second operation unit 72 may be detected by electrical connection between the second operation unit 72 and the fifth control unit 93e or the like.

(Fifth Power Generation Unit 91e)

The fifth power generation unit 91e is a power generator that converts light such as sunlight into electricity.

The fifth power generation unit 91e is provided on the upper surface of the fifth housing 2e.

The fifth power generation unit 91e supplies power obtained by power generation to the fifth control unit 93e, the fifth intake unit 95e, the fifth air blowing unit 96e, and the fifth exhaust unit 97e.

The fifth control unit 93e or the like may have a power storage device such as a battery that stores electric power obtained by power generation.

(Fifth Control Unit 93e)

The fifth control unit 93e includes a sensor that detects information (temperature, humidity, amount of dust particles, concentration of specific gas, vibration, etc.) on the inside the fifth housing 2e.

According to the present embodiment, the fifth intake unit 95e, the fifth air blowing unit 96e, and the fifth exhaust unit 97e operate based on the information obtained by the fifth control unit 93e. Specifically, when the temperature inside the fifth housing 2e obtained by the fifth control unit 93e is higher than or equal to the temperature threshold, when the humidity inside the fifth housing 2e is higher than or equal to the humidity threshold, when the amount of particles of dust inside the fifth housing 2e is larger than or equal to the particle amount threshold, or when the concentration of a specific gas inside the fifth housing 2e is higher than or equal to the gas concentration threshold, the fifth intake unit 95e, the fifth air blowing unit 96e, and the fifth exhaust unit 97e operate.

(Operation Based on Other Information)

The fifth intake unit 95e, the fifth air blowing unit 96e, and the fifth exhaust unit 97e may operate based on other information in addition to the information obtained by the sensor of the fifth control unit 93e or instead of the information obtained by the sensor of the fifth control unit 93e.

For example, the fifth intake unit 95e, the fifth air blowing unit 96e, and the fifth exhaust unit 97e may operate based on time information. In this case, the fifth control unit 93e is provided with a battery and a timer for measuring time information. At the predetermined time and date or at the predetermined time intervals, the fifth control unit 93e operates the fifth intake unit 95e, the fifth air blowing unit 96e, and the fifth exhaust unit 97e. The fifth intake unit 95e, the fifth air blowing unit 96e, and the fifth exhaust unit 97e may operate based on information on the surroundings of the fifth housing 2e (temperature, humidity, amount of dust particles, concentration of specific gas, and the like outside second load test section 1b).

(Information Transmission by Communication Unit)

In addition, the fifth control unit 93e may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the fifth intake unit 95e, the fifth air blowing unit 96e, and the fifth exhaust unit 97e operate.

(Fifth Intake Unit 95e)

The fifth intake unit 95e is provided in an intake opening for the inactive period (the fifth inactive-period intake opening 2e3) in the back surface of the fifth housing 2e.

The fifth intake unit 95e includes an opening and closing door such as a louver, and opens and closes the fifth inactive-period intake opening 2e3.

When the load test is performed, that is, when those in the second load test section 1b of the first load test unit are used, the fifth intake unit 95e is closed so that air cannot flow in from the fifth inactive-period intake opening 2e3 of the fifth housing 2e.

When the load test is not performed, that is, when those in the second load test section 1b of the first load test unit are not used, the fifth intake unit 95e is opened so that air can flow in from the fifth inactive-period intake opening 2e3 of the fifth housing 2e (see FIG. 9).

The fifth intake unit 95e is electrically opened and closed. However, the opening and closing door of the fifth intake unit 95e may be biased to be in the closed state by the bias, and may be in the open state by the wind of the fifth air blowing unit 96e.

(Fifth Air Blowing Unit 96e)

The fifth air blowing unit 96e includes a blower that discharges air, such as a fan, and sends the air taken in through the fifth inactive-period intake opening 2e3 into the fifth housing 2e.

The air sent by the fifth air blowing unit 96e passes through the inside of the fifth housing 2e and is discharged from the fifth inactive-period exhaust opening 2e4 (see thick arrow lines in FIGS. 9 and 10).

The fifth air blowing unit 96e is preferably provided in the vicinity of the fifth intake unit 95e, but may be provided in another place, for example, in the vicinity of the fifth exhaust unit 97e.

(Fifth Exhaust Unit 97e)

The fifth exhaust unit 97e includes an opening and closing door such as a louver, and opens and closes the fifth inactive-period exhaust opening 2e4.

When the load test is performed, that is, when those in the second load test section 1b of the first load test unit are used, the fifth exhaust unit 97e is closed so that air cannot be discharged from the fifth inactive-period exhaust opening 2e4 of the fifth housing 2e.

When the load test is not performed, that is, when those in the second load test section 1b of the first load test unit are not used, the fifth exhaust unit 97e is opened so that air can be discharged from the fifth inactive-period exhaust opening 2e4 of the fifth housing 2e (see FIG. 10).

The fifth exhaust unit 97e is electrically opened and closed. However, the opening and closing door of the fifth exhaust unit 97e may be biased to be in the closed state by the bias, and may be in the open state by the wind of the fifth air blowing unit 96e.

(Sixth Power Generation Unit 91f)

The sixth power generation unit 91f is a power generator that converts light such as sunlight into electricity.

The sixth power generation unit 91f is provided on the upper surface of the sixth housing 2f.

The sixth power generation unit 91f supplies power obtained by power generation to the sixth control unit 93f, the sixth intake unit 95f, the sixth air blowing unit 96f, and the sixth exhaust unit 97f.

The sixth control unit 93f or the like may have a power storage device such as a battery that stores electric power obtained by power generation.

(Sixth Control Unit 93f)

The sixth control unit 93f includes a sensor that detects information (temperature, humidity, amount of dust particles, concentration of specific gas, vibration, etc.) on the inside the sixth housing 2f.

According to the present embodiment, the sixth intake unit 95f, the sixth air blowing unit 96f, and the sixth exhaust unit 97f operate based on the information obtained by the sixth control unit 93f. Specifically, when the temperature inside the sixth housing 2f obtained by the sixth control unit 93f is higher than or equal to the temperature threshold, when the humidity inside the sixth housing 2f is higher than or equal to the humidity threshold, when the amount of particles of dust inside the sixth housing 2f is larger than or equal to the particle amount threshold, or when the concentration of a specific gas inside the sixth housing 2f is higher than or equal to the gas concentration threshold, the sixth intake unit 95f, the sixth air blowing unit 96f, and the sixth exhaust unit 97f operate.

(Operation Based on Other Information)

The sixth intake unit 95f, the sixth air blowing unit 96f, and the sixth exhaust unit 97f may operate based on other information in addition to the information obtained by the sensor of the sixth control unit 93f or instead of the information obtained by the sensor of the sixth control unit 93f.

For example, the sixth intake unit 95f, the sixth air blowing unit 96f, and the sixth exhaust unit 97f may operate based on time information. In this case, the sixth control unit 93*f* is provided with a battery and a timer for measuring time information. At the predetermined time and date or at the predetermined time intervals, the sixth control unit 93*f* operates the sixth intake unit 95*f*, the sixth air blowing unit 96*f*, and the sixth exhaust unit 97*f*.

The sixth intake unit 95*f*, the sixth air blowing unit 96*f*, and the sixth exhaust unit 97*f* may operate based on information on the surroundings of the sixth housing 2*f* (temperature, humidity, amount of dust particles, concentration of specific gas, and the like outside second load test section 1*b*).

(Information Transmission by Communication Unit)

In addition, the sixth control unit 93*f* may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the sixth intake unit 95*f*, the sixth air blowing unit 96*f*, and the sixth exhaust unit 97*f* operate.

(Sixth Intake Unit 95*f*)

The sixth intake unit 95*f* is provided in an intake opening for the inactive period (the sixth inactive-period intake opening 2/3) in the back surface of the sixth housing 2*f*.

The sixth intake unit 95*f* includes an opening and closing door such as a louver, and opens and closes the sixth inactive-period intake opening 2/3.

When the load test is performed, that is, when those in the second load test section 1*b* of the second load test unit are used, the sixth intake unit 95*f* is closed so that air cannot flow in from the sixth inactive-period intake opening 2/3 of the sixth housing 2*f*.

When the load test is not performed, that is, when those in the second load test section 1*b* of the second load test unit are not used, the sixth intake unit 95*f* is opened so that air can flow in from the sixth inactive-period intake opening 2/3 of the sixth housing 2*f* (see FIG. 9).

The sixth intake unit 95*f* is electrically opened and closed. However, the opening and closing door of the sixth intake unit 95*f* may be biased to be in the closed state by the bias, and may be in the open state by the wind of the sixth air blowing unit 96*f*.

(Sixth Air Blowing Unit 96*f*)

The sixth air blowing unit 96*f* includes a blower that discharges air, such as a fan, and sends the air taken in through the sixth inactive-period intake opening 2/3 into the sixth housing 2*f*.

The air sent by the sixth air blowing unit 96*f* passes through the inside of the sixth housing 2*f* and is discharged from the sixth inactive-period exhaust opening 2/4 (see thick arrow lines in FIGS. 9 and 10).

The sixth air blowing unit 96*f* is preferably provided in the vicinity of the sixth intake unit 95*f*, but may be provided in another place, for example, in the vicinity of the sixth exhaust unit 97*f*.

(Sixth Exhaust Unit 97*f*)

The sixth exhaust unit 97*f* includes an opening and closing door such as a louver, and opens and closes the sixth inactive-period exhaust opening 2/4.

When the load test is performed, that is, when those in the second load test section 1*b* of the second load test unit are used, the sixth exhaust unit 97*f* is closed so that air cannot be discharged from the sixth inactive-period exhaust opening 2/4 of the sixth housing 2*f*.

When the load test is not performed, that is, when those in the second load test section 1*b* of the second load test unit are not used, the sixth exhaust unit 97*f* is opened so that air can be discharged from the sixth inactive-period exhaust opening 2/4 of the sixth housing 2*f* (see FIG. 10).

The sixth exhaust unit 97*f* is electrically opened and closed. However, the opening and closing door of the sixth exhaust unit 97*f* may be biased to be in the closed state by the bias, and may be in the open state by the wind of the sixth air blowing unit 96*f*.

(Seventh Power Generation Unit 91*g*)

The seventh power generation unit 91*g* is a power generator that converts light such as sunlight into electricity.

The seventh power generation unit 91*g* is provided on the upper surface of the seventh housing 2*g*.

The seventh power generation unit 91*g* supplies power obtained by power generation to the seventh control unit 93*g*, the seventh intake unit 95*g*, the seventh air blowing unit 96*g*, and the seventh exhaust unit 97*g*.

The seventh control unit 93*g* or the like may have a power storage device such as a battery that stores electric power obtained by power generation.

(Seventh Control Unit 93*g*)

The seventh control unit 93*g* includes a sensor that detects information (temperature, humidity, amount of dust particles, concentration of specific gas, vibration, etc.) on the inside the seventh housing 2*g*.

According to the present embodiment, the seventh intake unit 95*g*, the seventh air blowing unit 96*g*, and the seventh exhaust unit 97*g* operate based on the information obtained by the seventh control unit 93*g*. Specifically, when the temperature inside the seventh housing 2*g* obtained by the seventh control unit 93*g* is higher than or equal to the temperature threshold, when the humidity inside the seventh housing 2*g* is higher than or equal to the humidity threshold, when the amount of particles of dust inside the seventh housing 2*g* is larger than or equal to the particle amount threshold, or when the concentration of a specific gas inside the seventh housing 2*g* is higher than or equal to the gas concentration threshold, the seventh intake unit 95*g*, the seventh air blowing unit 96*g*, and the seventh exhaust unit 97*g* operate.

(Operation Based on Other Information)

The seventh intake unit 95*g*, the seventh air blowing unit 96*g*, and the seventh exhaust unit 97*g* may operate based on other information in addition to the information obtained by the sensor of the seventh control unit 93*g* or instead of the information obtained by the sensor of the seventh control unit 93*g*.

For example, the seventh intake unit 95*g*, the seventh air blowing unit 96*g*, and the seventh exhaust unit 97*g* may operate based on time information. In this case, the seventh control unit 93*g* is provided with a battery and a timer for measuring time information. At the predetermined time and date or at the predetermined time intervals, the seventh control unit 93*g* operates the seventh intake unit 95*g*, the seventh air blowing unit 96*g*, and the seventh exhaust unit 97*g*.

The seventh intake unit 95*g*, the seventh air blowing unit 96*g*, and the seventh exhaust unit 97*g* may operate based on information on the surroundings of the seventh housing 2*g* (temperature, humidity, amount of dust particles, concentration of specific gas, and the like outside second load test section 1*b*).

(Information Transmission by Communication Unit)

In addition, the seventh control unit 93*g* may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the seventh intake unit 95g, the seventh air blowing unit 96g, and the seventh exhaust unit 97g operate.

(Seventh Intake Unit 95g)

The seventh intake unit 95g is provided in an intake opening for the inactive period (the seventh inactive-period intake opening 2g3) in the back surface of the seventh housing 2g.

The seventh intake unit 95g includes an opening and closing door such as a louver, and opens and closes the seventh inactive-period intake opening 2g3.

When the load test is performed, that is, when those in the second load test section 1b of the third load test unit are used, the seventh intake unit 95g is closed so that air cannot flow in from the seventh inactive-period intake opening 2g3 of the seventh housing 2g.

When the load test is not performed, that is, when those in the second load test section 1b of the third load test unit are not used, the seventh intake unit 95g is opened so that air can flow in from the seventh inactive-period intake opening 2g3 of the seventh housing 2g (see FIG. 9).

The seventh intake unit 95g is electrically opened and closed. However, the opening and closing door of the seventh intake unit 95g may be biased to be in the closed state by the bias, and may be in the open state by the wind of the seventh air blowing unit 96g.

(Seventh Air Blowing Unit 96g)

The seventh air blowing unit 96g includes a blower that discharges air, such as a fan, and sends the air taken in through the seventh inactive-period intake opening 2g3 into the seventh housing 2g.

The air sent by the seventh air blowing unit 96g passes through the inside of the seventh housing 2g and is discharged from the seventh inactive-period exhaust opening 2g4 (see thick arrow lines in FIGS. 9 and 10).

The seventh air blowing unit 96g is preferably provided in the vicinity of the seventh intake unit 95g, but may be provided in another place, for example, in the vicinity of the seventh exhaust unit 97g.

(Seventh Exhaust Unit 97g)

The seventh exhaust unit 97g includes an opening and closing door such as a louver, and opens and closes the seventh inactive-period exhaust opening 2g4.

When the load test is performed, that is, when those in the second load test section 1b of the third load test unit are used, the seventh exhaust unit 97g is closed so that air cannot be discharged from the seventh inactive-period exhaust opening 2g4 of the seventh housing 2g.

When the load test is not performed, that is, when those in the second load test section 1b of the third load test unit are not used, the seventh exhaust unit 97g is opened so that air can be discharged from the seventh inactive-period exhaust opening 2g4 of the seventh housing 2g (see FIG. 10).

The seventh exhaust unit 97g is electrically opened and closed. However, the opening and closing door of the seventh exhaust unit 97g may be biased to be in the closed state by the bias, and may be in the open state by the wind of the seventh air blowing unit 96g.

(Eighth Power Generation Unit 91h)

The eighth power generation unit 91h is a power generator that converts light such as sunlight into electricity.

The eighth power generation unit 91h is provided on the upper surface of the eighth housing 2h.

The eighth power generation unit 91h supplies power obtained by power generation to the eighth control unit 93h, the eighth intake unit 95h, the eighth air blowing unit 96h, and the eighth exhaust unit 97h.

The eighth control unit 93h or the like may have a power storage device such as a battery that stores electric power obtained by power generation.

(Eighth Control Unit 93h)

The eighth control unit 93h includes a sensor that detects information (temperature, humidity, amount of dust particles, concentration of specific gas, vibration, etc.) on the inside the eighth housing 2h.

According to the present embodiment, the eighth intake unit 95h, the eighth air blowing unit 96h, and the eighth exhaust unit 97h operate based on the information obtained by the eighth control unit 93h. Specifically, when the temperature inside the eighth housing 2h obtained by the eighth control unit 93h is higher than or equal to the temperature threshold, when the humidity inside the eighth housing 2h is higher than or equal to the humidity threshold, when the amount of particles of dust inside the eighth housing 2h is larger than or equal to the particle amount threshold, or when the concentration of a specific gas inside the eighth housing 2h is higher than or equal to the gas concentration threshold, the eighth intake unit 95h, the eighth air blowing unit 96h, and the eighth exhaust unit 97h operate.

(Operation Based on Other Information)

The eighth intake unit 95h, the eighth air blowing unit 96h, and the eighth exhaust unit 97h may operate based on other information in addition to the information obtained by the sensor of the eighth control unit 93h or instead of the information obtained by the sensor of the eighth control unit 93h.

For example, the eighth intake unit 95h, the eighth air blowing unit 96h, and the eighth exhaust unit 97h may operate based on time information. In this case, the eighth control unit 93h is provided with a battery and a timer for measuring time information. At the predetermined time and date or at the predetermined time intervals, the eighth control unit 93h operates the eighth intake unit 95h, the eighth air blowing unit 96h, and the eighth exhaust unit 97h.

The eighth intake unit 95h, the eighth air blowing unit 96h, and the eighth exhaust 97h may operate based on information on the surroundings of the eighth housing 2h (temperature, humidity, amount of dust particles, concentration of specific gas, and the like outside second load test section 1b).

(Information Transmission by Communication Unit)

In addition, the eighth control unit 93h may include a communication unit that transmits information to an external device, and said communication unit may transmit warning information to the external device when the temperature information continues to be higher than or equal to the temperature threshold or the humidity information continues to be higher than or equal to the humidity threshold even after the predetermined time has elapsed since the eighth intake unit 95h, the eighth air blowing unit 96h, and the eighth exhaust unit 97h operate.

(Eighth Intake Unit 95h)

The eighth intake unit 95h is provided in an intake opening for the inactive period (the eighth inactive-period intake opening 2h3) in the back surface of the eighth housing 2h.

The eighth intake unit 95h includes an opening and closing door such as a louver, and opens and closes the eighth inactive-period intake opening 2h3.

When the load test is performed, that is, when at least one of those in the second load test section 1b of the first load test unit to the third load test unit is used, the eighth intake unit 95h is closed so that air cannot flow in from the eighth inactive-period intake opening 2h3 of the eighth housing 2h.

When the load test is not performed, that is, when those in the second load test section 1b of the first load test unit to the third load test unit are not used, the eighth intake unit 95h is opened so that air can flow in from the eighth inactive-period intake opening 2h3 of the eighth housing 2h (see FIG. 9).

The eighth intake unit 95h is electrically opened and closed. However, the opening and closing door of the eighth intake unit 95h may be biased to be in the closed state by the bias, and may be in the open state by the wind of the eighth air blowing unit 96h.

(Eighth Air Blowing Unit 96h)

The eighth air blowing unit 96h includes a blower that discharges air, such as a fan, and sends the air taken in through the eighth inactive-period intake opening 2h3 into the eighth housing 2h.

The air sent by the eighth air blowing unit 96h passes through the inside of the eighth housing 2h and is discharged from the eighth inactive-period exhaust opening 2h4 (see thick arrow lines in FIGS. 9 and 10).

The eighth air blowing unit 96h is preferably provided in the vicinity of the eighth intake unit 95h, but may be provided in another place, for example, in the vicinity of the eighth exhaust unit 97h.

(Eighth Exhaust Unit 97h)

The eighth exhaust unit 97h includes an opening and closing door such as a louver, and opens and closes the eighth inactive-period exhaust opening 2h4.

When the load test is performed, that is, when at least one of those in the second load test section 1b of the first load test unit to the third load test unit is used, the eighth exhaust unit 97h is closed so that air cannot be discharged from the eighth inactive-period exhaust opening 2h4 of the eighth housing 2h.

When the load test is not performed, that is, when those in the second load test section 1b of the first load test unit to the third load test unit are not used, the eighth exhaust unit 97h is opened so that air can be discharged from the eighth inactive-period exhaust opening 2h4 of the eighth housing 2h (see FIG. 10).

The eighth exhaust unit 97h is electrically opened and closed. However, the opening and closing door of the eighth exhaust unit 97h may be biased to be in the closed state by the bias, and may be in the open state by the wind of the eighth air blowing unit 96h.

(Effect of Connecting a Plurality of Coils (the 11th Coil 61a1, Etc.) in Switchable Connection Form)

By switching the connection form between series and parallel, the combined inductance of the plurality of coils (the 11th coil 61a1, etc.) can be changed, and it is possible to realize the load testing device 1 capable of easily adjusting the power factor corresponding to various test target power sources such as a high-voltage generator and a low-voltage generator.

(Effect of Holding Coils in Iron Core or the Like)

The iron core (such as the first iron core 61a4) holds the coil (such as the 11th coil 61a1), and the housing (such as the fifth housing 2e) of the second load test section 1b holds the iron core or the connecting rod 62 via the insulator 7. This makes it possible to stably hold the coil while maintaining electrical insulation.

(Effect of Facing Terminals of Adjacent Coils)

The switching device can be efficiently disposed in the space around the coil (such as the 11th coil 61a1).

(Effect of Configuring First Load Test Section 1a and Second Load Test Section 1b as Separate Bodies)

When the adjustment of the power factor is unnecessary, the load test can be performed using only the first load test section 1a without using the second load test section 1b. In addition, by adding the second load test section 1b to the existing load test device corresponding to the first load test section 1a, it is possible to realize the load testing device 1 that can easily adjust the power factor corresponding to various test target power sources.

(Effect of Providing Control Signal Line)

The connection form of the coil in the second load test section 1b and the like can be controlled based on the content (the type of the test target power source and the like) set by the operation unit (first operation unit 71) in the first load test section 1a.

(Effects of Providing First Air Circulation Unit 90a and Second Air Circulation Unit 90b)

When the load test units (the first load test unit to the third load test unit) and the like are not used, the housing (the first housing 2a and the like) of the first load test section 1a and the housing (the fifth housing 2e and the like) of the second load test section 1b are maintained in a substantially sealed state. For this reason, the internal temperature and humidity of the housing increase, and the internal equipment may be deteriorated. In addition, there is a risk that dust adheres to internal devices.

When the load test unit or the like is not in use, air is taken in from the outside of the housing and discharged via the air circulation unit (the first air circulation unit 90a, the second air circulation unit 90b). In other words, the inside of the housing can be ventilated. This makes it possible to keep the temperature and humidity inside the housing substantially constant. Then, it is possible to suppress deterioration of devices inside the housing and to suppress adhesion of dust.

The air blowing unit (the first air blowing unit 96a or the like) is driven by electric power obtained by the power generation unit (the first power generation unit 91a or the like) of the air circulation unit. Therefore, the air circulation unit can be operated even in a state where power is not supplied to the load test unit or the like during the inactive period of the load test unit or the like.

(Effects of Small Inactive-Period Intake Opening and Inactive-Period Exhaust Opening)

It is possible to realize the load testing device 1 capable of performing ventilation during the inactive period only by providing a small opening for intake and exhaust (such as the first inactive-period intake opening 2a3) in a housing of an existing load test unit and adding an air circulation unit (the first air circulation unit 90a, the second air circulation unit 90b).

(Effects of not Electrically Connecting First Air Circulation Unit 90a and Second Air Circulation Unit 90b to Load Test Unit or the Like)

The first air circulation unit 90a is not electrically connected to a load test unit or the like inside the housing (the first housing 2a or the like), and drives other equipment (the first control unit 93a or the like) of the first air circulation unit 90a with electric power obtained by a power generation unit (the first power generation unit 91a or the like) of the first air circulation unit 90a. Therefore, even if a failure occurs in the first air circulation unit 90a, it is difficult to adversely affect a load test or the like using the load test unit. In addition, the first air circulation unit 90a can be easily added to the existing load test unit.

The second air circulation unit 90b is not electrically connected to a load test unit or the like inside the housing (the fifth housing 2e or the like), and drives other equipment (the fifth control unit 93e or the like) of the second air circulation unit 90b with electric power obtained by a power generation unit (the fifth power generation unit 91e or the like) of the second air circulation unit 90b. Therefore, even if a failure occurs in the second air circulation unit 90b, it is difficult to adversely affect the load test or the like using the load test unit. In addition, the second air circulation unit 90b can be easily added to the existing load test unit.

(Effect of Providing Inactive-Period Exhaust Opening at Position Higher than Inactive-Period Intake Opening)

Since the air taken in from the outside of the housing (such as the first housing 2a) is sent to a high position, foreign matter such as dust does not remain at the bottom of the housing and is easily discharged to the outside of the housing.

(Effect of Sharing Lid and Power Generation Unit)

It is possible to effectively perform solar power generation using an area having a lid (such as the first exhaust lid 33a) that closes an exhaust opening of the load test unit.

(Common Use of Communication Unit)

Note that the communication unit is not limited to a form provided in each of the first control unit 93a to the eighth control unit 93h, and may be a form in which a communication unit provided in any of the first control unit 93a to the eighth control unit 93h is shared as a communication unit among the control units.

(Application Examples of on/Off Control of Reactor-Side Relay Unit 82)

According to the present embodiment, an example has been described in which on/off control of the relay of the reactor-side relay unit 82 is performed based on the operation state of the first operation unit 71.

Figure 17:
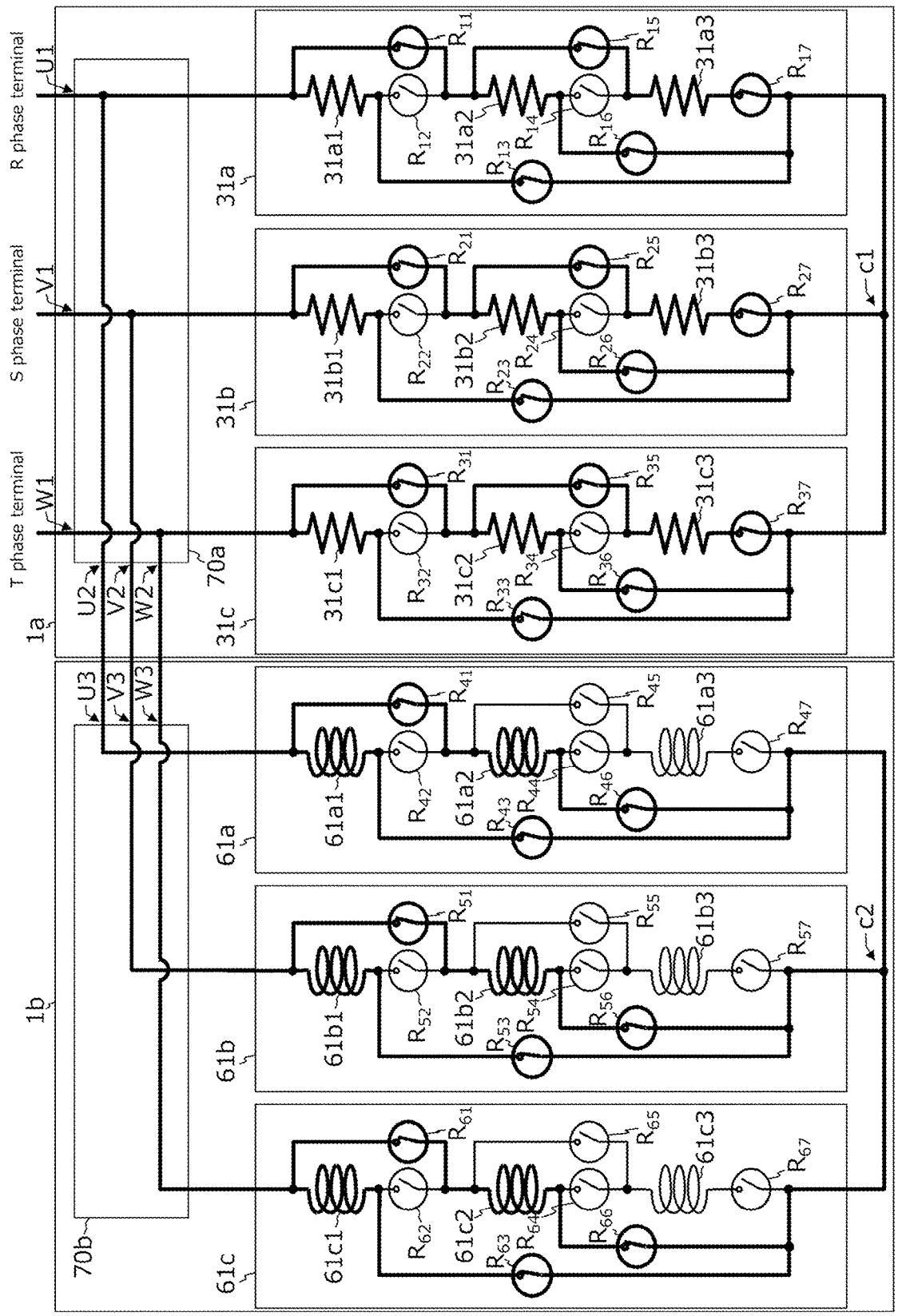
FIG. 17 is a schematic diagram illustrating on/off states of relays of the first resistor group set to the third resistor group set and the first coil group to the third coil group in a state where the number of coils to be used is reduced as compared with the case of FIG. 16 in a case where the load test of the low-voltage test target power source is performed at a high load.
Figure 18:
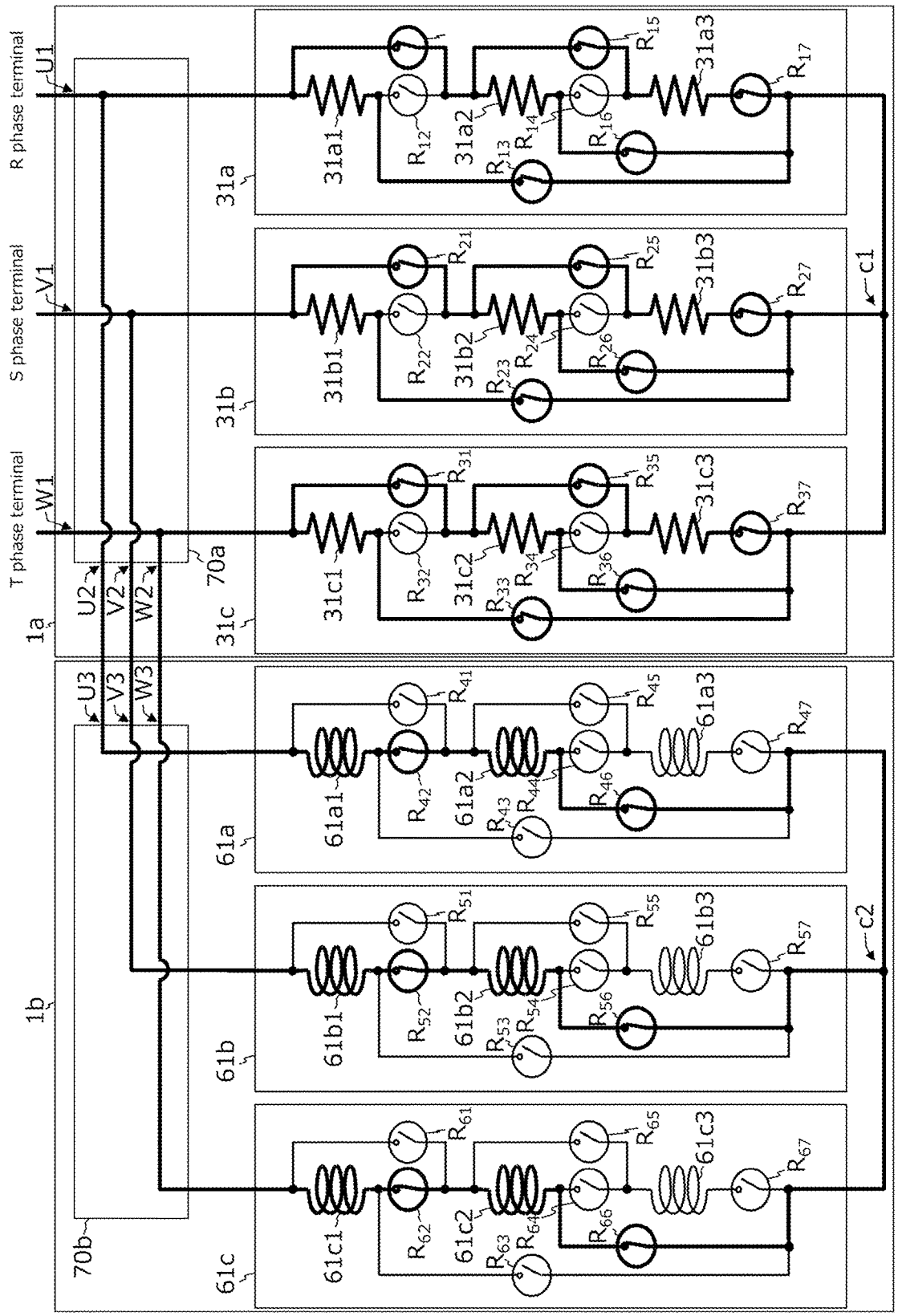
FIG. 18 is a schematic diagram illustrating on/off states of relays of the first resistor group set to the third resistor group set and the first coil group to the third coil group in a state where the number of coils to be used is reduced and the coils to be used are connected in series in a case where the load test of the low-voltage test target power source is performed at a high load as compared with the case of FIG. 16.

However, a switch for performing on/off control of the relay of the reactor-side relay unit 82 may be provided in the second operation unit 72, and on/off control of the relay of the reactor-side relay unit 82 may be performed independently of the operation state of the first operation unit 71 (see FIGS. 17 and 18).

FIG. 17 illustrates an example in which the resistor groups (the 11th resistor group 31a1, etc.) are connected in parallel, and power is supplied to all the resistor groups, and the coil groups (the 11th coil 61a1, etc.) are connected in parallel, and power is supplied to some coils.

FIG. 18 illustrates an example in which the resistor groups (the 11th resistor group 31a1, etc.) are connected in parallel, and power is supplied to all the resistor groups, and the coil groups (the 11th coil 61a1, etc.) are connected in series, and power is supplied to some coils.

Note that the switch for performing the on/off control of the relay of the reactor-side relay unit 82 may be provided in the second operation unit 72 or may be provided in the first operation unit 71.

(Application Examples of the Number of Resistor Groups and the Number of Coil Groups)

According to the present embodiment, an example in which three resistor groups are provided in one resistor group set and three coils are provided in one coil group has been described. However, the number of resistor groups included in one resistor group set is not limited to three, and the number of coils included in one coil group is not limited to three. In addition, the number of resistor groups included in one resistor group set may be different from the number of coils included in one coil group.

According to the present embodiment, an example has been described in which the connection form of the three resistor groups (or the three coils) and the power supply target are switched using the seven relays (for example, the 11th relay to the 17th relay $R_{11}$ to $R_{17}$). However, the number of relays and the connection method for switching the connection form and the like are not limited thereto.

(Mode without Partition Walls)

According to the present embodiment, a form has been described in which the control unit, the intake unit, the air blowing unit, and the exhaust unit are provided in each of the first housing 2a to the eighth housing 2h. However, when the partition walls are not provided in the boundary regions between the first housing 2a to the fourth housing 2d, only one control unit, one intake unit, one air blowing unit, and one exhaust unit may be provided.

Further, when the partition walls are not provided in the boundary regions between the fifth housing 2e to the eighth housing 2h, only one control unit, one intake unit, one air blowing unit, and one exhaust unit may be provided.

In this case, it is desirable that the exhaust unit and the intake unit be provided at positions away from each other in the housing such that air taken in through the intake unit passes through many regions in the housing.

Figure 19:
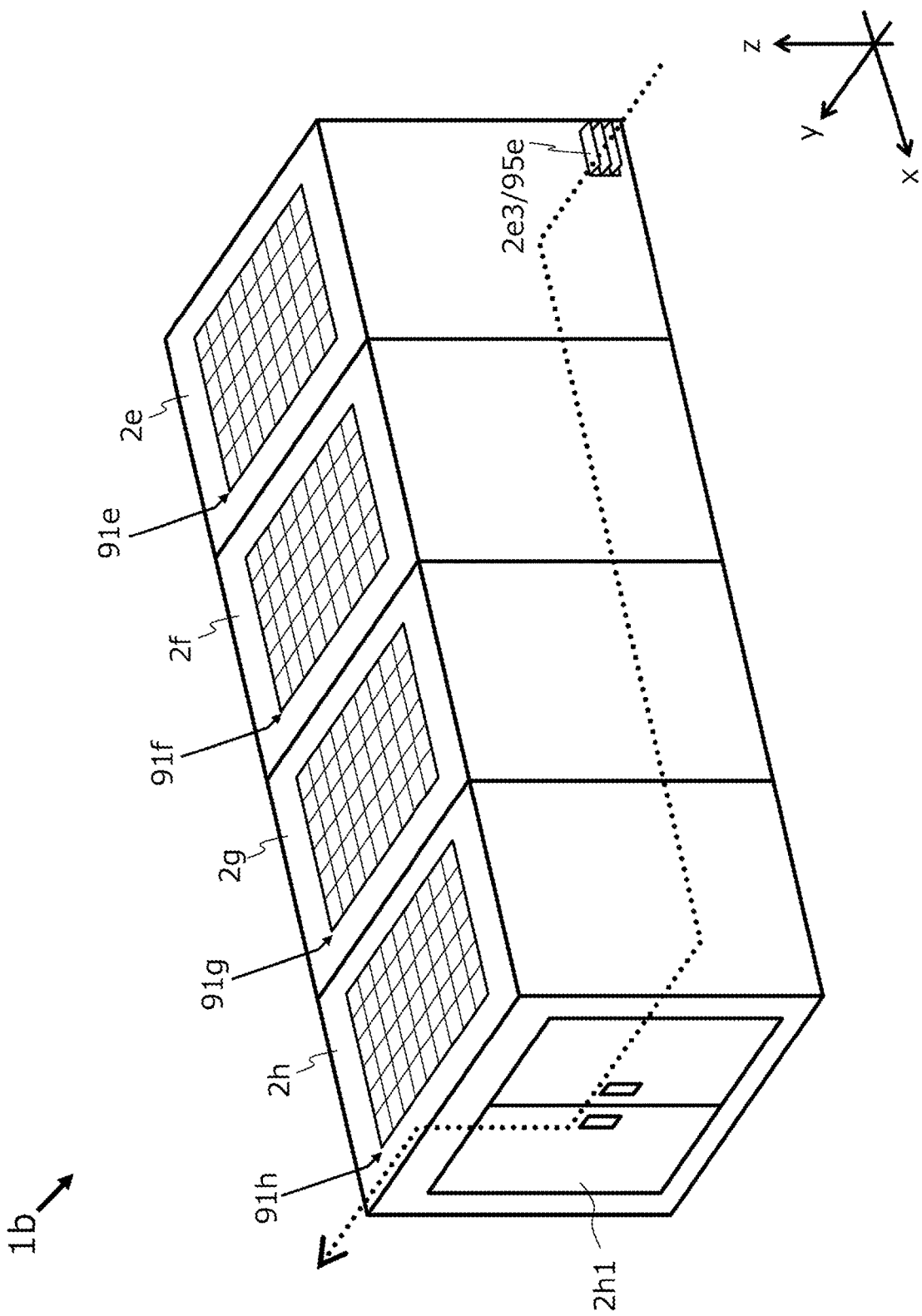
FIG. 19 is a rear perspective view of a device including a load test unit provided with only one intake unit and one exhaust unit.

For example, one of the exhaust unit and the intake unit is provided in the fifth housing 2e, and the other of the exhaust unit and the intake unit is provided in the eighth housing 2h (see FIG. 19).

Even in this case, not only one power generation unit but also two or more power generation units may be provided.

FIG. 19 illustrates an example in which one intake unit (the fifth intake unit 95e) is provided on the back surface of fifth housing 2e, one exhaust unit (the eighth exhaust unit 95h, not illustrated) is provided on the front surface of eighth housing 2h, and four power generation units (the fifth power generation unit 91e to the eighth power generation unit 91h) are provided on the upper surfaces of the fifth housing 2e to the eighth housing 2h.

(Application Example of Inactive-Period Intake Opening)

According to the present embodiment, a form in which the first inactive-period intake opening 2a3 is provided separately from the first side-surface opening 2a2 has been described. However, a part of the first side-surface opening 2a2 may function as the first inactive-period intake opening 2a3, or the entire first side-surface opening 2a2 may function as the first inactive-period intake opening 2a3.

In this case, a part or all of the first intake lids 51a functions as the first intake unit 95a.

Similarly, a part or all of the second side-surface opening 2b2 may function as the second inactive-period intake opening 2b3.

Further, a part or all of the third side-surface openings 2c2 may function as the third inactive-period intake opening 2c3.

(Application Example of Arrangement Direction of Cooling Unit 50 and Resistor Unit 30)

According to the present embodiment, a form in which the cooling unit 50 is arranged in the z direction of the resistor unit 30 has been described. However, the cooling unit 50 and the resistor unit 30 may be arranged in the horizontal direction.

(Application Example of Test Target Power Source)

According to the present embodiment, the example in which the test target power source is a three-phase AC generator has been described, but the test target power source may be a single-phase AC generator.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention and are included in the invention described in the claims and the equivalent scope thereof.

REFERENCE SIGNS LIST

1 Load testing device
1a First load test section
1b Second load test section
2a to 2h First housing to Eighth housing
2a1 First upper-surface opening
2a2 First side-surface opening
2a3 First inactive-period intake opening
2a4 First inactive-period exhaust opening
2b1 Second upper-surface opening
2b2 Second side-surface opening
2b3 Second inactive-period intake opening
2b4 Second inactive-period exhaust opening
2c1 Third upper-surface opening
2c2 Third side-surface opening
2c3 Third inactive-period intake opening
2c4 Third inactive-period exhaust opening
2d3 Fourth inactive-period intake opening
2d4 Fourth inactive-period exhaust opening
2d1 First door
2e3 Fifth inactive-period intake opening
2e4 Fifth inactive-period exhaust opening
2f3 Sixth inactive-period intake opening
2f4 Sixth inactive-period exhaust opening
2g3 Seventh inactive-period intake opening
2g4 Seventh inactive-period exhaust opening
2h3 Eighth inactive-period intake opening
2h4 Eighth inactive-period exhaust opening
2h1 Second door
3 Connection member
4 Control line
5 Control signal line
7 Insulator
30 Resistor
30a to 30c First resistor to Third resistor
31a to 31c First resistor group set to Third resistor group set
31a1 to 31a3 11th resistor group to 13th resistor group
31b1 to 31b3 21st resistor group to 23rd resistor group
31c1 to 31c3 31st resistor group to 33rd resistor group
33a to 33c First exhaust lid to Third exhaust lid
50 Cooling unit
50a to 50c First cooling unit to Third cooling unit
51a to 51c First intake lid to Third intake lid
53a to 53c First cooling device to Third cooling device
60 Reactor unit
60a to 60c First reactor unit to Third reactor unit
61a to 61c First coil group to Third coil group
61a1 to 61a3 11th coil to 13th coil
61a4 First iron core
61b1 to 61b3 21st coil to 23rd coil
61b4 Second iron core
61c1 to 61c3 31st coil to 33rd coil
61c4 Third iron core
62 Connecting rod
70a, 70b First load test control unit, Second load test control unit
71, 72 First operation unit, Second operation unit
73, 74 First power supply terminal unit and Second power supply terminal unit
75, 76 First control terminal and Second control terminal
77, 78 First power supply control unit, Second power supply control unit
81 Resistor-side relay unit
81a to 81c First resistor-side relay unit to Third resistor-side relay unit
82 Reactor-side relay unit
82a to 82c First reactor-side relay unit to Third reactor-side relay unit
90a, 90b First air circulation unit, Second air circulation unit
91a to 91h First power generation unit to Eighth power generation unit
93a to 93h First control unit to Eighth control unit
95a to 95h First intake unit to Eighth intake unit
96a to 96h First air blowing unit to Eighth air blowing unit
97a to 97h First exhaust unit to Eighth exhaust unit
100 Test target power source
200 Load-testing-device driving power source
c1 First neutral point
c2 Second neutral point
$R_{11}$ to $R_{17}$ 11th relay to 17th relay
$R_{21}$ to $R_{27}$ 21st relay to 27th relay
$R_{31}$ to $R_{37}$ 31st relay to 37th relay
$R_{41}$ to $R_{47}$ 41st relay to 47th relay
$R_{51}$ to $R_{57}$ 51st relay to 57th relay
$R_{61}$ to $R_{67}$ 61st relay to 67th relay
U1 to U3 First U-phase terminal to Third U-phase terminal
V1 to V3 First V-phase terminal to Third V-phase terminal
W1 to W3 First W-phase terminal to Third W-phase terminal

The invention claimed is:

1. A load testing device comprising:
a first load test section having one or more resistor group sets provided with a plurality of resistor groups each including one or more resistors, and receiving power supply from a test target power source; and
a second load test section having one or more coil groups each including a plurality of coils and receiving power supply from the test target power source,
wherein the plurality of coils are connected in a state switchable between series connection and parallel connection in order to change an inductance of the plurality of coils,
wherein the load testing device is configured to adjust a power factor corresponding to various test target power sources,
wherein the second load test section has an iron core passing through centers of the plurality of coils.

2. The load testing device according to claim 1, wherein the test target power source is a three-phase AC generator, the second load test section includes, as the one or more coil groups, a first coil group that receives power supply from an R-phase terminal of the test target power source, a second coil group that receives power supply from an S-phase terminal of the test target power source, and a third coil group that receives power supply from a T-phase terminal of the test target power source, the second load test section includes, as the iron core, a first iron core passing through centers of the plurality of coils of the first coil group, a second iron core passing through centers of the plurality of coils of the second coil group, and a third iron core passing through centers of the plurality of coils of the third coil group, the first iron core, the second iron core, and the third iron core are connected via a connecting rod, and at least one of the first iron core, the second iron core, the third iron core, and the connecting rod is held by a housing of the second load test section via an insulator.

3. The load testing device according to claim 1, wherein at least one of the one or more coil groups includes at least a first coil and a second coil as the plurality of coils, one end of the first coil and other end of the first coil are positioned to sandwich a central axis of the first coil when viewed from a direction in which the central axis of the first coil extends, one end of the second coil and other end of the second coil are positioned to sandwich a central axis of the second coil when viewed from a direction in which the central axis of the second coil extends, a side on which the other end of the first coil is located and a side on which the one end of the second coil is located face each other in a direction in which the central axis of the first coil extends, and the other end of the first coil and the one end of the second coil face each other in a direction in which the central axis of the first coil extends.

4. The load testing device according to claim 1, wherein at least one of the one or more coil groups includes at least a first coil, a second coil, and a third coil as the plurality of coils, the second load test section includes an iron core passing through centers of the first coil, the second coil, and the third coil, one end of the first coil and other end of the first coil are positioned to sandwich a region through which the iron core passes when viewed from a direction in which the iron core extends, one end of the second coil and other end of the second coil are positioned to sandwich the region through which the iron core passes when viewed from the direction in which the iron core extends, one end of the third coil and other end of the third coil are positioned to sandwich the region through which the iron core passes when viewed from the direction in which the iron core extends, a side where the other end of the first coil is located and a side where the one end of the second coil is located face each other in the direction in which the iron core extends, a side where the other end of the second coil is located and a side where the one end of the third coil is located face each other in the direction in which the iron core extends, the other end of the first coil and the one end of the second coil face each other in the direction in which the iron core extends, and the other end of the second coil and the one end of the third coil face each other in the direction in which the iron core extends.

5. The load testing device according to claim 1, wherein at least one of the one or more coil groups includes at least a first coil, a second coil, and a third coil as the plurality of coils, the second load test section includes a first relay, a second relay, a third relay, a fourth relay, a fifth relay, a sixth relay, and a seventh relay, one contact of the first relay is connected to one end of the first coil, other contact of the first relay is connected to one end of the second coil, one contact of the second relay is connected to other end of the first coil, other contact of the second relay is connected to the one end of the second coil, one contact of the third relay is connected to the other end of the first coil, one contact of the fourth relay is connected to other end of the second coil, other contact of the fourth relay is connected to one end of the third coil, one contact of the fifth relay is connected to the one end of the second coil, other contact of the fifth relay is connected to the one end of the third coil, one contact of the sixth relay is connected to the other end of the second coil, and one contact of the seventh relay is connected to other end of the third coil.

6. The load testing device according to claim 1, wherein the first load test section and the second load test section are configured as separate bodies, the one or more resistor group sets and the one or more coil groups are connected in parallel to the test target power source, the first load test section includes a first terminal that receives power supply from the test target power source and a second terminal that supplies power from the test target power source to the second load test section, and the second load test section includes a third terminal that receives power supply from the test target power source via the first terminal and the second terminal.

7. The load testing device according to claim 6, wherein between the first load test section and the second load test section, a control signal line is provided for controlling a connection form of the plurality of coils based on at least one of a type of the test target power source, a connection form of the plurality of resistor groups, and a load amount which are set via an operation unit provided in the first load test section.

8. The load testing device according to claim 6, wherein a housing of the second load test section is provided with an inactive-period intake opening and an inactive-period exhaust opening, the second load test section includes a power generation unit including a power generation device that converts light into electricity, an intake unit, an exhaust unit, and an air blowing unit, the intake unit opens and closes the inactive-period intake opening, the exhaust unit opens and closes the inactive-period exhaust opening, and the air blowing unit takes in air from outside of the housing through the intake unit and discharges the air taken in through the exhaust unit, based on at least one of information on inside the housing, information on surroundings of the housing, and time information when the one or more coil groups are not used, the air blowing unit is driven by electric power obtained by the power generation unit, the inactive-period intake opening is smaller than an opening for intake of air to a cooling unit that cools the one or more resistor groups in the first load test section, and the inactive-period exhaust opening is smaller than an opening for discharging air from the cooling unit in the first load test section.

* * * * *